US011991828B2

(12) United States Patent
Xiong et al.

(10) Patent No.: US 11,991,828 B2
(45) Date of Patent: May 21, 2024

(54) DISPLAY APPARATUS AND METHOD FOR MANUFACTURING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ren Xiong, Beijing (CN); Yuanzhang Zhu, Beijing (CN); Qiang Tang, Beijing (CN); Huiqiang Song, Beijing (CN); Yichen Jiang, Beijing (CN); Hang Min, Beijing (CN); Fei Shang, Beijing (CN); Haijun Qiu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 115 days.

(21) Appl. No.: 17/626,902

(22) PCT Filed: Feb. 20, 2021

(86) PCT No.: PCT/CN2021/077122
§ 371 (c)(1),
(2) Date: Jan. 13, 2022

(87) PCT Pub. No.: WO2021/169882
PCT Pub. Date: Sep. 2, 2021

(65) Prior Publication Data
US 2022/0256706 A1 Aug. 11, 2022

(30) Foreign Application Priority Data

Feb. 24, 2020 (CN) .......................... 202010113081.1
Jun. 5, 2020 (CN) .......................... 202010508043.6

(51) Int. Cl.
H05K 1/14 (2006.01)
G06F 3/041 (2006.01)
(Continued)

(52) U.S. Cl.
CPC ......... H05K 1/147 (2013.01); G06F 3/04164 (2019.05); H05K 1/118 (2013.01);
(Continued)

(58) Field of Classification Search
None
See application file for complete search history.

(56) References Cited

U.S. PATENT DOCUMENTS 6,972,966 B1    12/2005  Oishi et al.
10,606,387 B2 *  3/2020  Tang ..................... G06F 3/0412
(Continued)

FOREIGN PATENT DOCUMENTS

CN    104205249         12/2014
CN    110831328 A       2/2020
(Continued)

OTHER PUBLICATIONS

Indian Office Action (w/ English translation) for corresponding Indian Application No. 202147053787, dated Nov. 2, 2022, 8 pages.
(Continued)

Primary Examiner — Fred Tzeng
(74) Attorney, Agent, or Firm — Dority & Manning, PA

(57) ABSTRACT

A display apparatus includes a display panel, a touch layer, and a flexible printed circuit (FPC) including a main FPC and a bridge FPC. A third soldering region and a fourth soldering region of the bridge FPC are respectively soldered to a first soldering region and a second soldering region of the main FPC. Ends of each first touch connection line are electrically connected to a touch chip and a first touch lead. Ends of each second touch connection line are electrically
(Continued)

connected to a pad on the second soldering region and a second touch lead. Ends of each third touch connection line are electrically connected to a pad on the first soldering region and the touch chip. Ends of each touch transfer line are electrically connected to a pad on the third soldering region and a pad on the fourth soldering region.

20 Claims, 23 Drawing Sheets

(51) Int. Cl.
  *H05K 1/11* (2006.01)
  *H05K 1/18* (2006.01)
  *G02F 1/1345* (2006.01)
  *G02F 1/1368* (2006.01)
  *H01L 25/18* (2023.01)
  *H01R 12/61* (2011.01)
  *H10K 59/131* (2023.01)

(52) U.S. Cl.
  CPC ......... *H05K 1/189* (2013.01); *G02F 1/13452* (2013.01); *G02F 1/1368* (2013.01); *G06F 2203/04103* (2013.01); *G06F 2203/04107* (2013.01); *H01L 25/18* (2013.01); *H01R 12/61* (2013.01); *H05K 2201/09227* (2013.01); *H05K 2201/09409* (2013.01); *H05K 2201/10128* (2013.01); *H05K 2201/10136* (2013.01); *H10K 59/131* (2023.02)

(56) References Cited

U.S. PATENT DOCUMENTS

| | | | | |
|---|---|---|---|---|
| 2002/0117328 | A1* | 8/2002 | Oishi | G02F 1/13452 174/254 |
| 2003/0056978 | A1* | 3/2003 | Terunuma | H05K 3/4084 174/254 |
| 2011/0141042 | A1 | 6/2011 | Kim et al. | |
| 2013/0141912 | A1 | 6/2013 | Kim | |
| 2013/0229364 | A1* | 9/2013 | Yu | G06F 3/0446 345/173 |
| 2013/0241873 | A1 | 9/2013 | Kim et al. | |
| 2014/0043292 | A1 | 2/2014 | Hashimoto | |
| 2014/0160695 | A1* | 6/2014 | Jeong | H05K 3/305 438/26 |
| 2016/0128194 | A1 | 5/2016 | Hong et al. | |
| 2016/0286649 | A1 | 9/2016 | Choi | |
| 2017/0090650 | A1 | 3/2017 | Jin et al. | |
| 2017/0090661 | A1 | 3/2017 | Kim et al. | |
| 2017/0357122 | A1* | 12/2017 | Oh | G02F 1/1341 |
| 2018/0330653 | A1 | 11/2018 | Zhou | |
| 2019/0025967 | A1 | 1/2019 | Tang et al. | |
| 2019/0124769 | A1* | 4/2019 | Miyashita | H05K 3/0097 |
| 2019/0384433 | A1 | 12/2019 | Tang | |
| 2020/0012141 | A1* | 1/2020 | Kim | H05K 1/147 |

FOREIGN PATENT DOCUMENTS

| | | |
|---|---|---|
| CN | 211090137 | 7/2020 |
| EP | 3142103 | 3/2017 |
| EP | 4120053 A1 | 1/2023 |

OTHER PUBLICATIONS

Chinese First Office Action (w/ English translation) for corresponding Chinese Application No. 202010508043.6, dated Jan. 7, 2022, 11 pages.
PCT International Search Report (w/ English translation) for corresponding PCT Application No. PCT/CN2021/077122, dated May 11, 2021, 5 pages.
Extended European Search Report for corresponding EP Application No. 21760201.0, dated Feb. 19, 2024, 11 pages.

* cited by examiner

420A

420B

DISPLAY APPARATUS AND METHOD FOR MANUFACTURING THE SAME

CROSS-REFERENCE TO RELATED APPLICATIONS

This application is a national phase entry under 35 USC 371 of International Patent Application No. PCT/CN2021/077122, filed on Feb. 20, 2021, which claims priority to Chinese Patent Application No. 202010113081.1, filed on Feb. 24, 2020 and Chinese patent application No. 202010508043.6, filed on Jun. 5, 2020, which are incorporated herein by reference in their entirety.

TECHNICAL FIELD

The present disclosure relates to the field of display technologies, and in particular, to a display apparatus and a method for manufacturing the same.

BACKGROUND

With the development of display technologies, display apparatuses with a flexible multi-layer on cell (FMLOC) structure have gradually entered the market. A FMLOC display apparatus includes a display panel, a touch layer disposed on the display panel, and a flexible printed circuit (FPC). The flexible circuit board is electrically connected to the display panel, so that display signals are transmitted to the display panel and touch signals are transmitted to the touch layer, thereby realizing image display and touch point positioning.

SUMMARY

In an aspect, a display apparatus is provided. The display apparatus includes a display panel, a touch layer disposed on a light-exiting surface of the display panel, and a flexible printed circuit (FPC) bonded to the display panel. The touch layer includes a plurality of first touch leads and a plurality of second touch leads. The FPC includes a main FPC and a bridge FPC.

The main FPC includes a first substrate, a plurality of pads, a touch chip, a plurality of first touch connection lines, a plurality of second touch connection lines and a plurality of third touch connection lines. The first substrate has a first soldering region, a second soldering region and a bonding region. The bonding region is a region of the first substrate that is bonded to the display panel. The plurality of pads are disposed on the first soldering region and the second soldering region. The touch chip is disposed on the first substrate. A minimum distance between the touch chip and the first soldering region is less than a minimum distance between the touch chip and the second soldering region. The plurality of first touch connection lines are disposed on the first substrate. One end of each first touch connection line is electrically connected to the touch chip, and another end of each first touch connection line is electrically connected to a corresponding one of the plurality of first touch leads in the touch layer. The plurality of second touch connection lines are disposed on the first substrate. One end of each second touch connection line is electrically connected to a corresponding pad on the second soldering region, and another end of each second touch connection line is electrically connected to a corresponding one of the plurality of second touch leads in the touch layer. The plurality of third touch connection lines are disposed on the first substrate. One end of each third touch connection line is electrically connected to a corresponding pad on the first soldering region, and another end of each third touch connection line is electrically connected to the touch chip.

The bridge FPC includes a second substrate, another plurality of pads and a plurality of touch transfer lines. The second substrate has a third soldering region and a fourth soldering region. The another plurality of pads are disposed on the third soldering region and the fourth soldering region. A pad on the third soldering region is soldered to a corresponding pad on the first soldering region. A pad on the fourth soldering region is soldered to a corresponding pad on the second soldering region. The plurality of touch transfer lines are disposed on the second substrate. One end of each touch transfer line is electrically connected to a corresponding pad on the third soldering region, and another end of each touch transfer line is electrically connected to a corresponding pad on the fourth soldering region. A maximum radial dimension of any pad is less than or equal to 1.0 mm.

In some embodiments, the bridge FPC further includes at least one shielding transfer line. The at least one shielding transfer line is disposed on the second substrate. One end of each shielding transfer line is electrically connected to a corresponding pad on the third soldering region, and another end of each shielding transfer line is electrically connected to a corresponding pad on the fourth soldering region.

In some embodiments, the bridge FPC includes a plurality of shielding transfer lines. The plurality of shielding transfer lines at least includes two edge shielding transfer lines that are located on outermost sides. Of the two edge shielding transfer lines, two ends of one edge shielding transfer line and two ends of another edge shielding transfer line are connected in sequence to form a loop. The plurality of touch transfer lines are all located within the loop.

In some embodiments, both the third soldering region and the fourth soldering region are both provided with M rows of pads thereon, M being greater than or equal to two (M≥2). Of the two edge shielding transfer lines, the two ends of the one edge shielding transfer line are located on a side of a first row of pads away from a last row of pads on the third soldering region and a side of a first row of pads away from a last row of pads on the fourth soldering region, and are electrically connected to two pads that are farthest away from each other and located in the first row of pads on the third soldering region and in the first row of pads on the fourth soldering region, and the two ends of the another edge shielding transfer line are located on a side of the last row of pads away from the first row of pads on the third soldering region and a side of the last row of pads away from the first row of pads on the fourth soldering region, and are electrically connected to two pads that are farthest away from each other and located in the last row of pads on the third soldering region and in the last row of pads on the fourth soldering region. A pad, electrically connected to the one edge shielding transfer line, in the first row of pads on the third soldering region is electrically connected to a pad, electrically connected to the another edge shielding transfer line, in the last row of pads on the third soldering region. A pad, electrically connected to the one edge shielding transfer line, in the first row of pads on the fourth soldering region is electrically connected to a pad, electrically connected to the another edge shielding transfer line, in the last row of pads on the fourth soldering region.

In some embodiments, the third soldering region and the fourth soldering region are disposed at two ends of the second substrate that are opposite to each other. A shape of an orthographic projection of the second substrate on the main FPC is not centrally symmetric shape.

In some embodiments, the third soldering region and the fourth soldering region are both provided with M rows of pads thereon, M being greater than or equal to two (M≥2). Of a plurality of transfer lines on the second substrate, at least 2M pads are distributed between two transfer lines that are located on outermost sides. The plurality of transfer lines includes the plurality of touch transfer lines and the at least one shielding transfer line.

In some embodiments, the first soldering region and the second soldering region are arranged side by side in a first direction, the first direction being substantially parallel to an extending direction of a side edge of the main FPC proximate to the display panel.

In some embodiments, pads on the third soldering region and pads on fourth bonding region are all arranged in a plurality of rows. At least one of the plurality of rows of pads on the third soldering region includes a plurality of pads arranged in the first direction, and at least one of the plurality of rows of pads on the fourth soldering region includes another plurality of pads arranged in the first direction. At least one of a plurality of transfer lines on the second substrate passes through a region other than both a region between a first row of pads and a last row of pads on the third soldering region and a region between a first row of pads and a last row of pads on the forth soldering region to be electrically connected to corresponding pads. The plurality of transfer lines include the plurality of touch transfer lines and the at least one shielding transfer lin.

In some embodiments, two adjacent rows of pads are arranged in a staggered manner in a second direction, the second direction being substantially perpendicular to the first direction.

In some embodiments, the second substrate further has a transition line region and connection sector regions that are located at two opposite ends of the transition line region. The transition line region and the connection sector regions are located between the third soldering region and the fourth soldering region. Each of a plurality of transfer lines including the plurality of touch transfer lines and the at least one shielding transfer line includes a transition section and connection sections that are located at two opposite ends of the transition section. The transition section extends in the first direction, and is disposed in the transition line region. The connection sections are disposed in the connection sector regions. A minimum width of a connection sector region in the second direction is greater than or equal to a width of the transition line region in the second direction, the second direction being substantially perpendicular to the first direction.

In some embodiments, the width of the transition line region in the second direction is less than a maximum width of the third soldering region in the second direction, and/or, the width of the transition line region in the second direction is less than a maximum width of the fourth soldering region in the second direction. A maximum width of a portion of the connection sector region proximate to the third soldering region in the second direction is greater than the maximum width of the third soldering region in the second direction, and/or, a maximum width of a portion of the connection sector region proximate to the fourth soldering region in the second direction is greater than the maximum width of the fourth soldering region in the second direction.

In some embodiments, an outer contour of a pad is approximately in a shape of a circle.

In some embodiments, a diameter of the pad is in a range of 0.25 mm to 0.35 mm.

In some embodiments, the pads on the second substrate are via pads. The second substrate has a plurality of via holes, and each via hole corresponds to a single via pad. The via pad includes two soldering lugs and a conductive connection layer. The two soldering lugs are disposed on a surface of the second substrate proximate to the main FPC and a surface of the second substrate away from the main FPC. A via hole corresponding to the via pad penetrates the second substrate between the two soldering lugs of the via pad and the two soldering lugs. The conductive connection layer covers a sidewall of the via hole corresponding to the via pad. Two ends of the conductive connection layer are electrically connected to the two soldering lugs.

In some embodiments, an outer contour of an orthographic projection of the via pad on the second substrate is approximately in a shape of a circle.

In some embodiments, a diameter of the outer contour of the via pad is in a range of 0.25 mm to 0.35 mm.

In some embodiments, an inner contour of an orthographic projection of the via pad on the second substrate is approximately in a shape of a circle or approximately in a shape of an "X".

In some embodiments, in a case where the inner contour of the orthographic projection of the via pad on the second substrate is in the shape of the circle, a diameter of the inner contour is in a range of 0.05 mm to 0.15 mm. In a case where the inner contour of the orthographic projection of the via pad on the second substrate is in the shape of the "X", a diameter of a circumscribed circle corresponding to the inner contour is in a range of 0.05 mm to 0.2 mm.

In some embodiments, the main FPC further includes first metal patterns. The first metal patterns cover the pads on the first substrate, and are configured to prevent the pads on the first substrate from being oxidized. And/or, the bridge FPC further includes second metal patterns. The second metal patterns cover the pads on the second substrate, and are configured to prevent the pads on the second substrate from being oxidized.

In some embodiments, in a case where the main FPC includes the first metal patterns, a material of the first metal patterns includes one of gold, nickel or a combination thereof. In a case where the bridge FPC includes the second metal patterns, a material of the second metal patterns includes one of gold, nickel or a combination thereof.

In some embodiments, the main FPC further includes a first green oil layer and a first resin layer. The first green oil layer covers at least first regions of the first substrate, the first regions being regions in the first soldering region and the second soldering region other than regions where the pads are located. The first resin layer covers a region of the first substrate other than the first soldering region and the second soldering region. The bridge FPC further includes a second green oil layer and a second resin layer. The second green oil layer covers at least second regions of the second substrate, the second regions being regions in the third soldering region and the fourth soldering region other than regions where the pads are located. The second resin layer covers a region of the second substrate other than the third soldering region and the fourth soldering region.

In some embodiments, the first substrate has an element region. The main FPC further includes at least one element and a third green oil layer. The at least one element is disposed on a side of the first substrate proximate to the bridge FPC, and is located in the element region of the first substrate. The at least one element includes the touch chip.

The third green oil layer covers a region in the element region other than a region where the at least one element is located In some embodiments, the main FPC further includes a support piece. The support piece is disposed on a side of the first substrate away from the bridge FPC. The element region is located within an orthographic projection of the support piece on the first substrate.

In some embodiments, a board of the orthographic projection of the support piece on the first substrate and a board of the element region have a distance therebetween. The distance is greater than or equal to 0.5 mm.

In some embodiments, the main FPC further includes a plurality of first bonding pins and a plurality of second bonding pins. The plurality of first bonding pins are disposed in the bonding region. At least one first bonding pin is configured to electrically connect a first touch connection line to a corresponding first touch lead in the touch layer of the display apparatus. The plurality of second bonding pins are disposed in the bonding region. At least one second bonding pin is configured to electrically connect a second touch connection line to a corresponding second touch lead in the touch layer of the display apparatus.

In some embodiments, a maximum dimension $L_1$ of the main FPC in a first direction is greater than or equal to 55.25 mm, and less than or equal to 55.55 mm (55.25 mm≤$L_1$≤55.55 mm). The first direction is approximately parallel to an extending direction of a side edge of the main FPC proximate to the display panel. The bonding region is in a shape of a strip, and extends in the first direction. The plurality of first bonding pins and the plurality of second bonding pins are arranged side by side in the first direction. In the first direction, a distance $L_2$ between a first bonding pin and a second bonding pin of the main FPC that are farthest away from each other is greater than or equal to 53.55 mm, and less than or equal to 53.85 mm (53.55 mm≤$L_2$≤53.85 mm). A maximum dimension $L_3$ of the bonding region in a second direction is greater than or equal to 1.2 mm, and less than or equal to 1.6 mm (1.2 mm≤$L_3$≤1.6 mm). The second direction is approximately perpendicular to the first direction.

In some embodiments, a number of the first touch leads included in the touch layer is equal to a number of the first touch connection lines included in the main FPC. A number of the second touch leads included in the touch layer is equal to each of a number of the second touch connection lines included in the main FPC and a number of the third touch connection lines included in the main FPC.

In some embodiments, the main FPC further includes a plurality of data signal control lines. The plurality of data signal control lines are disposed on the first substrate. The display panel has a display region and a surrounding region located on at least one side of the display region. The display panel includes a plurality of data lines and a driving chip. The driving chip is disposed in the surrounding region, and is electrically connected to the plurality of data signal control lines and the plurality of data lines. The driving chip is configured to process signals on the plurality of data signal control lines and transmit the processed signals to the plurality of data lines.

In some embodiments, a number of the data signal control lines included in the main FPC is less than a number of the data lines included in the display panel. A width of a data signal control line is greater than a width of a data line.

In some embodiments, the main FPC further includes first bonding pins and second bonding pins. The display panel further includes a plurality of first bonding pads and a plurality of second bonding pads. A first bonding pad is electrically connected to a corresponding first bonding pin and a corresponding first touch lead. A second bonding pad is electrically connected to a corresponding second bonding pin and a corresponding second touch lead.

In some embodiments, a thickness of the first bonding pad and a thickness of the second bonding pad are both less than a distance between a surface of the touch layer proximate to the display panel and a surface of the display panel away from the touch layer.

In another aspect, a display apparatus is provided. The display apparatus includes a display panel, a touch layer disposed on a light-exiting surface of the display panel, and a FPC bonded to the display panel. The display panel has a display region and a surrounding region located on at least one side of the display region. The surrounding region is provided with a bonding portion therein. The bonding portion includes a plurality of first bonding pads and a plurality of second bonding pads. The touch layer includes a plurality of first touch leads and a plurality of second touch leads. A first touch lead is electrically connected to a corresponding one of the plurality of first bonding pads A second touch lead is electrically connected to a corresponding one of the plurality of second bonding pads.

The FPC includes a main FPC and a bridge FPC. The main FPC includes a first substrate, a plurality of pads, a touch chip, a plurality of first touch connection lines, a plurality of second touch connection lines and a plurality of third touch connection lines. The first substrate has a first soldering region, a second soldering region and a bonding region. The bonding region is provided with a plurality of first bonding pins and a plurality of second bonding pins thereon. A first bonding pin is electrically connected to a corresponding first bonding pad. A second bonding pin is electrically connected to a corresponding second bonding pad. The plurality of pads are disposed on the first soldering region and the second soldering region. The touch chip is disposed on the first substrate. A minimum distance between the touch chip and the first soldering region is less than a minimum distance between the touch chip and the second soldering region. The plurality of first touch connection lines are disposed on the first substrate. One end of each first touch connection line is electrically connected to the touch chip, and another end of each first touch connection line is electrically connected to a corresponding first touch lead through a first bonding pin and a first bonding pad. The plurality of second touch connection lines are disposed on the first substrate. One end of each second touch connection line is electrically connected to a corresponding pad on the second soldering region, and another end of each second touch connection line is electrically connected to a corresponding second touch lead through a second bonding pin and a second bonding pad. The plurality of third touch connection lines are disposed on the first substrate. One end of each third touch connection line is electrically connected to a corresponding pad on the first soldering region, and another end of each third touch connection line is electrically connected to the touch chip.

The bridge FPC includes a second substrate, another plurality of pads and a plurality of touch transfer lines. The second substrate has a third soldering region and a fourth soldering region. The another plurality of pads are disposed on the third soldering region and the fourth soldering region. A pad on the third soldering region is soldered to a corresponding pad on the first soldering region. A pad on the fourth soldering region is soldered to a corresponding pad on the second soldering region. The plurality of touch transfer lines are disposed on the second substrate. One end of each touch transfer line is electrically connected to a corresponding pad on the third soldering region, and another end of each touch transfer line is electrically connected to a corresponding pad on the fourth soldering region.

A maximum radial dimension of any pad is less than or equal to 1.0 mm.

The third soldering region and the fourth soldering region are both provided with M rows of pads thereon, M being greater than or equal to two (M≥2). Of the plurality of touch transfer lines, at least 2M pads are distributed between two touch transfer lines that are located on outermost sides.

Pads on the first soldering region, pads on the second soldering region, pads on the third soldering region and pads on the fourth soldering region are all arranged in a plurality of rows. At least one of the plurality of rows of pads on the third soldering region includes a plurality of pads, and at least one of the plurality of rows of pads on the fourth soldering region includes another plurality of pads. Two adjacent rows of pads are arranged in a staggered manner in a second direction, the second direction being approximately perpendicular to an extending direction of a side edge of the main FPC proximate to the display panel.

The pads in the bridge FPC are via pads. The second substrate has a plurality of via holes, and each via hole corresponds to a single via pad. The via pad includes two soldering lugs and a conductive connection layer. The two soldering lugs are disposed on a surface of the second substrate proximate to the main FPC and a surface of the second substrate away from the main FPC. A via hole corresponding to the via pad penetrates the second substrate between the two soldering lugs of the via pad and the two soldering lugs. The conductive connection layer covers a sidewall of the via hole corresponding to the via pad. Two ends of the conductive connection layer are electrically connected to the two soldering lugs.

In some embodiments, the FPC includes a plurality of data signal control lines. The display panel includes a plurality of data lines and a driving chip. The driving chip is disposed in the surrounding region, and is electrically connected to the plurality of data signal control lines and the plurality of data lines. The driving chip is configured to process signals on the plurality of data signal control lines and transmit the processed signals to the plurality of data lines. A number of the data signal control lines is less than a number of the data lines. A width of a data signal control line is greater than a width of a data line.

In some embodiments, a number of the first touch leads included in the touch layer is equal to a number of the first touch connection lines included in the main FPC. A number of the second touch leads included in the touch layer is equal to each of a number of the second touch connection lines included in the main FPC and a number of the third touch connection lines included in the main FPC.

In some embodiments, a maximum dimension $L_1$ of the main FPC in a first direction is greater than or equal to 55.25 mm, and less than or equal to 55.55 mm (55.25 mm≤$L_1$≤55.55 mm), the first direction being approximately parallel to the extending direction of the side edge of the main FPC proximate to the display panel. The bonding region is in a shape of a strip, and extends in the first direction. The plurality of first bonding pins and the plurality of second bonding pins are arranged side by side in the first direction. In the first direction, a distance $L_2$ between the first bonding pin and the second bonding pin of the main FPC that are farthest away from each other is greater than or equal to 53.55 mm, and less than or equal to 53.85 mm (53.55 mm≤$L_2$≤53.85 mm). A maximum dimension $L_3$ of the bonding region in the second direction is greater than or equal to 1.2 mm, and less than or equal to 1.6 mm (1.2 mm≤$L_3$≤1.6 mm).

In still another aspect, a method for manufacturing a display apparatus is provided. The method includes: forming a main FPC, the main FPC including a first substrate, a plurality of pads disposed on a first soldering region and a second soldering region of the first substrate, and a touch chip, a plurality of first touch connection lines, a plurality of second touch connection lines, a plurality of third touch connection lines, a plurality of first bonding pins and a plurality of second bonding pins that are disposed on the first substrate; one end of each first touch connection line being electrically connected to the touch chip, another end of each first touch connection line being electrically connected to a corresponding first bonding pin; one end of each second touch connection line being electrically connected to a corresponding pad on the second soldering region, another end of each second touch connection line being electrically connected to a corresponding second bonding pin; one end of each third touch connection line being electrically connected to a corresponding pad on the first soldering region, another end of each third touch connection line being electrically connected to the touch chip;

forming a bridge FPC, the bridge FPC including a second substrate, another plurality of pads disposed on a third soldering region and a fourth soldering region of the second substrate, and a plurality of touch transfer lines; one end of each touch transfer line being electrically connected to a corresponding pad on the third soldering region, and another end of each touch transfer line being electrically connected to a corresponding pad on the fourth soldering region;

soldering pads on the first soldering region to pads on the third soldering region correspondingly, and soldering pads on the second soldering region to pads on the fourth soldering region correspondingly, so as to obtain a FPC;

forming a display panel and a touch layer, the touch layer being located on a light-exiting surface of the display panel, the display panel including a plurality of first bonding pads and a plurality of second bonding pads, the touch layer including a plurality of first touch leads and a plurality of second touch leads, each first touch lead being electrically connected to a corresponding first bonding pad of the display panel, and each second touch lead being electrically connected to a corresponding second bonding pad of the display panel; and bonding the display panel provided with the touch layer thereon to the FPC, so that the plurality of first bonding pads are correspondingly electrically connected to the plurality of first bonding pins, and the plurality of second bonding pads are correspondingly electrically connected to the plurality of second bonding pins.

In some embodiments, forming the main FPC includes: forming a first conductive layer on a surface of the first substrate, and patterning the first conductive layer, so as to form the plurality of pads on the first soldering region and the second soldering region; and forming first metal patterns on surfaces of the plurality of pads, the first metal patterns being configured to prevent the plurality of pads from being oxidized.

Forming the bridge FPC includes: forming second conductive layers on two opposite surfaces of the second substrate, and patterning the second conductive layers, so as to form a plurality of soldering lugs in pairs on the third soldering region and the fourth soldering region; forming second metal patterns on surfaces of the plurality of soldering lugs that are located on the two opposite surfaces of the second substrate, the second metal patterns being configured to prevent the plurality of soldering lugs from being oxidized; forming a via hole at each position where two soldering lugs opposite to each other in a thickness direction of the second substrate are located, the via hole penetrating the two soldering lugs and the second substrate between the two soldering lugs; and forming a conductive connection layer on a sidewall of the via hole, two ends of the conductive connection layer being electrically connected to the two soldering lugs, the conductive connection layer including a conductive layer and a metal layer that are stacked in sequence, and the metal layer being configured to prevent the conductive layer from being oxidized.

In some embodiments, the method further includes: coating the first soldering region, the second soldering region, and an element region of the first substrate, and the third soldering region and the fourth soldering region of the second substrate with green oil: removing the green oil on regions where multiple pads are located in the first soldering region, the second soldering region, the third soldering region and the fourth soldering region, so as to expose the multiple pads, and removing the green oil on a region where an element is located in the element region, so as to expose each element; and coating regions of the first substrate and the second substrate other than the first soldering region, the second soldering region, the third soldering region, the fourth soldering region and the element region with a resin material.

In some embodiments, soldering the pads on the first soldering region to the pads oin the third soldering region correspondingly and soldering the pads on the second soldering region to the pads on the fourth soldering region correspondingly includes: coating the plurality of pads on the first soldering region and the second soldering region with solder paste; aligning the main FPC and the bridge FPC, and attaching the main FPC and the bridge FPC together, the pads on the first soldering region being correspondingly attached to the pads on the third soldering region, and the pads on the second soldering region being correspondingly attached to the pads on the fourth soldering region; and heating the main FPC and the bridge FPC that have been attached together, so that the solder paste is in a molten state.

In some embodiments, aligning the main FPC and the bridge FPC and attaching the main FPC and the bridge FPC together includes: acquiring a first image including a first alignment mark of the main FPC and a second image including a second alignment mark of the bridge FPC; processing the first image and the second image to obtain coordinates of the first alignment mark of the main FPC and coordinates of the second alignment mark of the bridge FPC; controlling a robot arm to move the bridge FPC and/or the main FPC according to the coordinates of the first alignment mark and the coordinates of the second alignment mark, so as to align the main FPC and the bridge FPC; acquiring a third image including the alignment mark of the main FPC after alignment and a fourth image including the alignment mark of the bridge FPC after the alignment; detecting whether a relative position of the main FPC and the bridge FPC after the alignment is within a preset error range; in a case where the relative position of the main FPC and the bridge FPC is within the preset error range, attaching the main FPC and the bridge FPC together through an adhesive layer; in a case where the relative position of the main FPC and the bridge FPC is not within the preset error range, continuing to adjust the relative position of the main FPC and the bridge FPC, until the relative position of the two is within the preset error range.

BRIEF DESCRIPTION OF THE DRAWINGS

In order to explain the technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
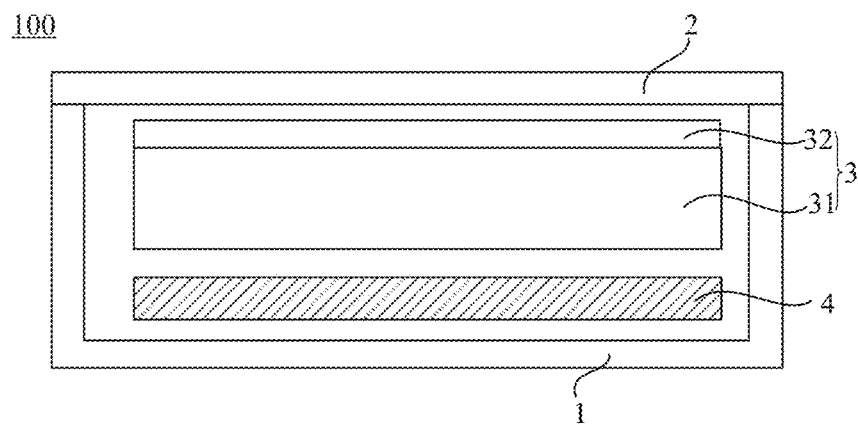
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereafter, the terms "first" and "second" are only used for descriptive purposes, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "coupled/connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

In addition, the phrase "based on" used herein has an open and inclusive meaning, since a process, step, calculation or other action that is "based on" one or more of the stated conditions or values may, in practice, be based on additional conditions or values exceeding those stated.

Terms such as "about", "roughly" or "approximately" as used herein includes a stated value and an average value within an acceptable range of deviation of a particular value. The acceptable range of deviation is determined by a person of ordinary skill in the art in view of the measurement in question and the error associated with the measurement of a particular amount (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

With Reference to FIG. 1, a display apparatus 100 is a device or apparatus for visually displaying electronic information. In some embodiments, the display apparatus 100 is a display apparatus 100 that may be operated and controlled by using a finger (or a stylus, etc.) to tap on a screen. The display apparatus 100 includes at least a touch display panel 3 (also called a touch display screen, a touch panel, a touch screen, etc.). For example, the display apparatus 100 may be any product or component having a display function, such as a smart phone, a tablet computer, a television, a monitor, a notebook computer, and other wearable electronic devices (e.g., a watch).

Herein, a type of the display apparatus 100 is not limited. The display apparatus 100 may be a liquid crystal display (LCD) apparatus or an electroluminescent display apparatus. In a case where the display apparatus 100 is the electroluminescent display apparatus, the electroluminescent display apparatus may be an organic light-emitting diode (OLED) display apparatus or a quantum dot light-emitting diode (QLED) display apparatus.

In some embodiments, as shown in FIG. 1, the display apparatus 100 includes a frame 1, a cover plate 2, a touch display panel 3, and a flexible printed circuit (FPC) 4 bonded and connected to the touch display panel 3.

Figure 2:
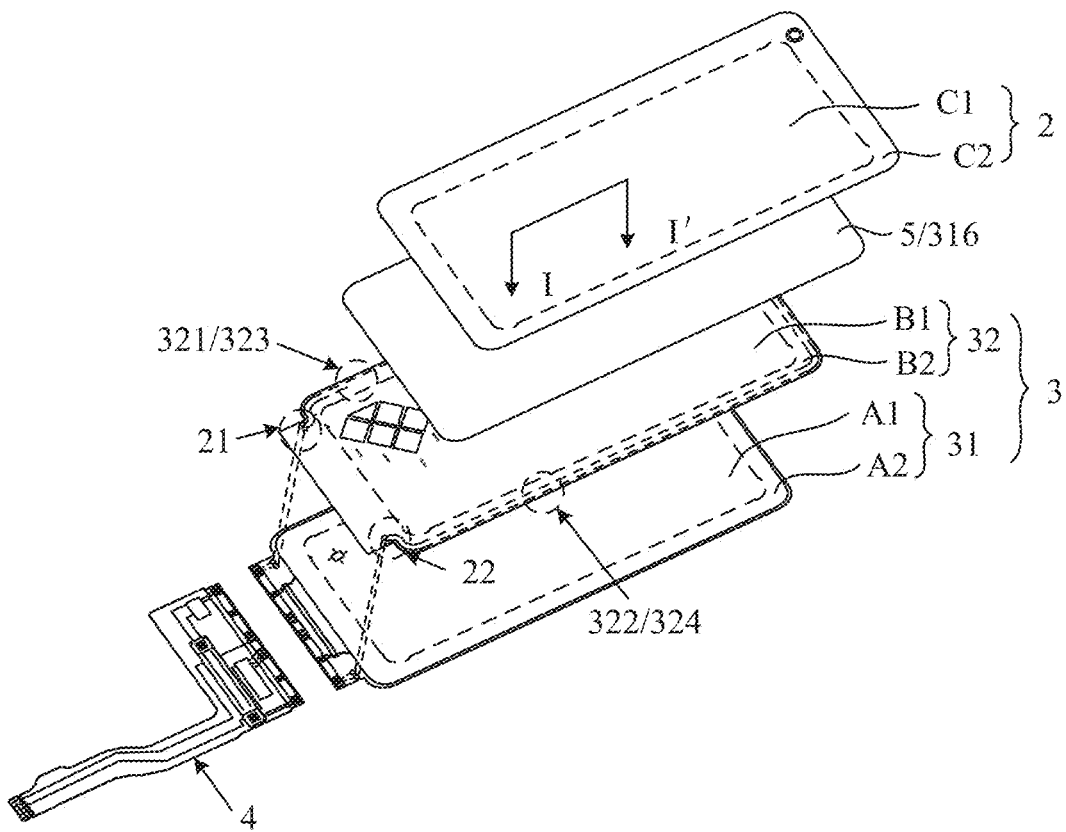
FIG. 2 is an exploded view of a touch display module of a display apparatus, in accordance with some embodiments.
Figure 4:
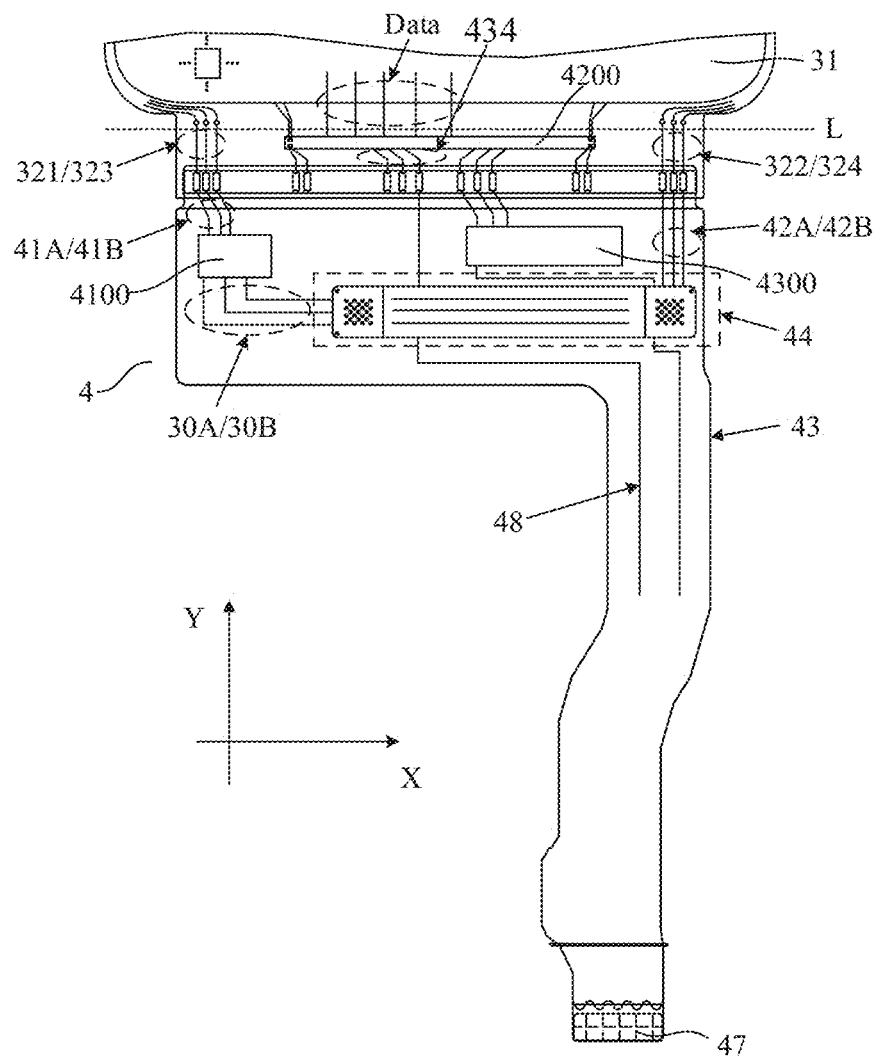
FIG. 4 is a structural diagram showing a bonding between a flexible printed circuit (FPC) and a display panel, in accordance with some embodiments.

Herein, in conjunction with FIGS. 2 and 4, the FPC 4 may be bent along a dotted line L toward a back side of the touch display panel 3 (that is, a side of the touch display panel 3 away from a display surface thereof), so that the FPC 4 is located at the back side of the display panel 3.

Herein, the touch display panel 3 may be a flexible touch display panel or a rigid touch display panel. In a case where the touch display panel 3 is a flexible touch display panel, the display apparatus 100 is a flexible display apparatus.

A longitudinal section of the frame 1 is U-shaped. The touch display panel 3, the FPC 4 and other components are all disposed inside the frame 1. The FPC 4 is disposed below the touch display panel 3 (on the side of the touch display panel 3 away from the display surface thereof). The cover plate 2 is disposed on a side of the touch display panel 3 away from the FPC 4. In the case where the display apparatus 100 is a liquid crystal display apparatus, the display apparatus 100 includes the backlight assembly. The backlight assembly is disposed between the touch display panel 3 and the FPC 4.

As shown in FIG. 2, the touch display panel 3 includes a display panel 31 and a touch layer 32. The touch layer 32 may be disposed on a light-exiting surface of the display panel 31. The touch layer 32 may acquire coordinate information from external input (for example, a user's finger touch). That is, the touch layer 32 may be a touch panel that senses the user's touch, or may be a fingerprint-sensor panel that acquires fingerprint information of the user's finger. For example, the touch layer 32 may sense external input through a capacitive method. Of course, a sensing method of the touch layer 32 includes but is not limited to the above embodiments, and other suitable sensing methods shall all be within the protection scope of the present disclosure.

Figure 3A:
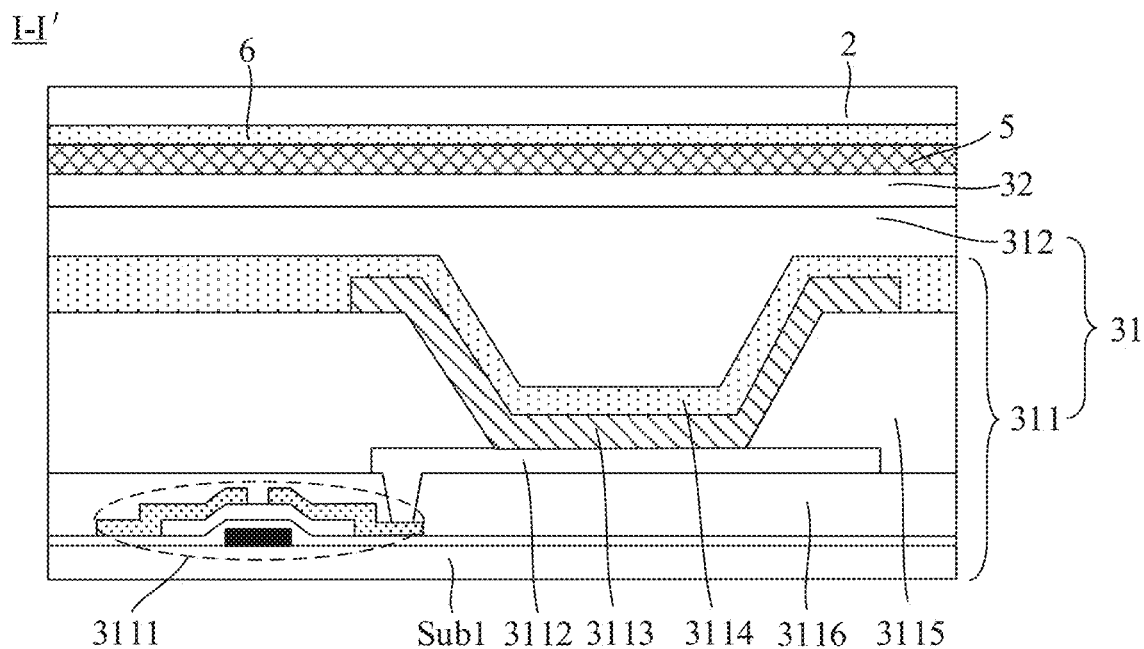
FIG. 3A is a cross-sectional view of the touch display module shown in FIG. 2 taken along the I-I' direction in a case where the display panel in the touch display module is an electroluminescent display panel.
Figure 3B:
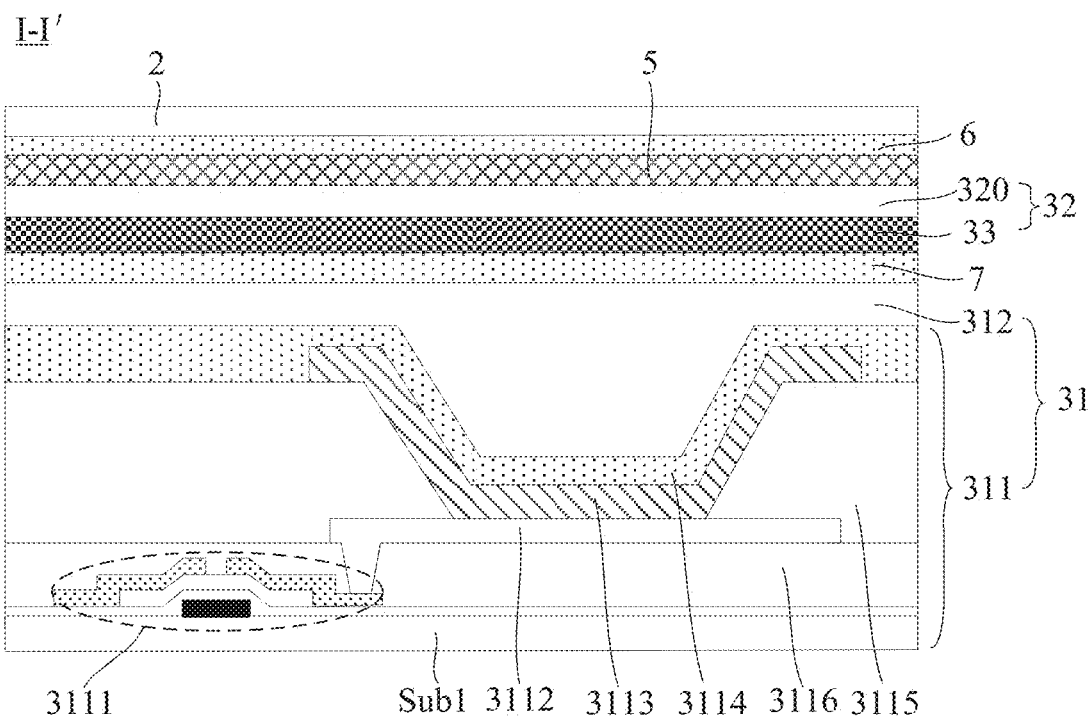
FIG. 3B is another cross-sectional view of the touch display module shown in FIG. 2 taken along the I-I' direction in the case where the display panel in the touch display module is an electroluminescent display panel.

In some embodiments, as shown in FIGS. 2, 3A and 3B, the display apparatus 100 is an organic electroluminescent display apparatus. In this case, the display apparatus 100 further includes a polarizer 5 located between the cover plate 2 and the touch layer 32. The polarizer 5 is used to reduce reflected light generated after external light is reflected by a metal structure in the display panel 3. The polarizer 5 and the cover plate 2 are attached together though an optical adhesive 6.

As shown in FIGS. 3A and 3B, the display panel 31 is an organic electroluminescent display panel. In this case, the display panel 31 includes a display substrate 311 and an encapsulation layer 312 used for encapsulating the display substrate 311.

Herein, the encapsulation layer 312 may be an encapsulation film or an encapsulation substrate.

As shown in FIGS. 3A and 3B, each sub-pixel in the display substrate 311 includes a light-emitting device and a pixel driving circuit that are provided on a first base Sub1. The pixel-driving circuit includes a plurality of thin film transistors 3111 (FIGS. 3A and 3B only show a thin film transistor electrically connected to the light-emitting device). A thin film transistor 3111 includes an active layer, a source, a drain, a gate and a gate insulating layer. The source and the drain are separately in contact with the active layer. The light-emitting device includes an anode 3112, a light-emitting functional layer 3113 and a cathode 3114. The anode 3112 is electrically connected to a source or a drain of a thin film transistor 3111 serving as a driving transistor in the plurality of thin film transistors 3111. FIGS. 3A and 3B show an example where the anode 3112 is electrically connected to the drain of the thin film transistor 3111.

The display substrate 311 further includes a pixel defining layer 3115. The pixel defining layer 3115 includes a plurality of openings. A single light-emitting device is disposed in a single opening.

In some embodiments, the light-emitting functional layer 3113 includes only a light-emitting layer. In some other embodiments, in addition to the light-emitting layer, the light-emitting functional layer 3113 further includes at least one of an electron transporting layer (ETL), an electron injection layer (EIL), a hole transporting layer (HTL) and a hole injection layer (HIL).

As shown in FIGS. 3A and 3B, the display substrate 311 further includes a planarization layer 3116 disposed between the thin film transistor 3111 and the anode 3112.

In some embodiments, as shown in FIG. 3A, the touch layer 32 may be directly disposed on the encapsulation layer 312. That is, no other film layer is provided between the touch layer 32 and the encapsulation layer 312. For example, the touch layer 32 may be formed on the encapsulation layer 312 of the display panel 31 through a continuous process. That is, after the encapsulation layer 312 of the display panel 31 is formed, the touch layer 32 may be directly formed on the encapsulation layer 312 of the display panel 31. In this way, the touch display panel 3 has a small thickness, which is conducive to making the display apparatus light and thin.

In some other embodiments, as shown in FIG. 3B, the touch layer 32 may be formed as a separate element, which is adhered to the encapsulation layer 312 of the display panel 31 through an adhesive layer 7. Herein, in a case where the touch layer 32 is formed as a separate element (e.g., a separate film layer), the touch layer 32 may further include a carrier film 33 for carrying touch electrodes 320.

A material of the carrier film 33 is not limited. For example, the carrier film 33 may be at least one of a resin film, a glass substrate and a composite film.

A material of the adhesive layer 7 is not limited. For example, the adhesive layer 7 may be made of at least one of a pressure sensitive adhesive (PSA), an optically clear adhesive (OCA) and an optically clear resin (OCR).

Figure 3C:
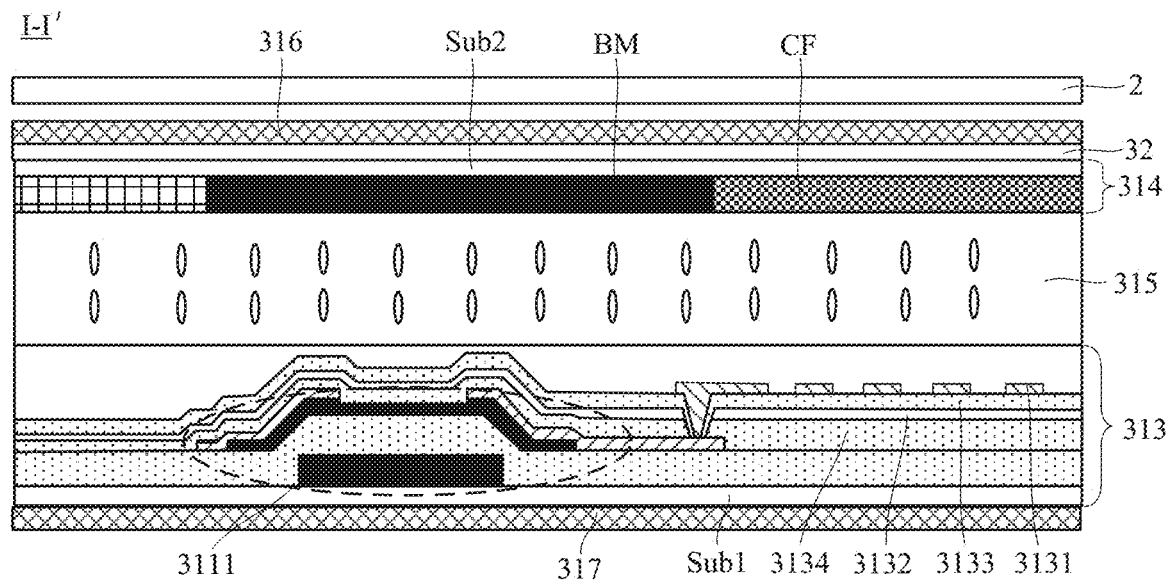
FIG. 3C is a cross-sectional view of the touch display module shown in FIG. 2 taken along the I-I' direction in a case where the display panel in the touch display module is a liquid crystal display panel.
Figure 3D:
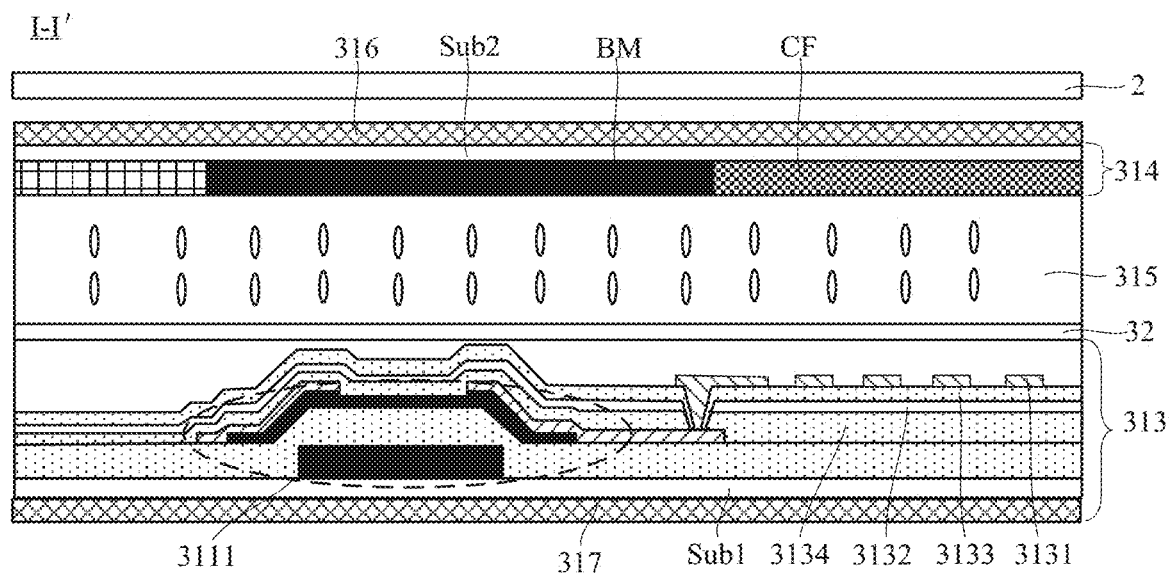
FIG. 3D is another cross-sectional view of the touch display module shown in FIG. 2 taken along the I-I' direction in a case where the display panel in the touch display module is a liquid crystal display panel.

As shown in FIGS. 3C and 3D, the display panel 31 is a liquid crystal display panel. The liquid crystal display panel includes an array substrate 313 and an opposite substrate 314 that are disposed opposite to each other, and a liquid crystal layer 315 disposed between the array substrate 313 and the opposite substrate 314.

Each sub-pixel of the array substrate 313 includes a thin film transistor 3111 and a pixel electrode 3131 that are located on a first base Sub1. The pixel electrode 3131 is electrically connected to a source or a drain of the thin film transistor 3111. FIGS. 3C and 3D illustrate an example where the pixel electrode 3131 is electrically connected to the drain of the thin film transistor 3111.

In some embodiments, the array substrate 313 further includes a common electrode 3132 disposed on the first base Sub1. The pixel electrode 3131 and the common electrode 3132 may be disposed in the same layer. In this case, both the pixel electrode 3131 and the common electrode 3132 are of a comb-tooth structure including a plurality of strip-shaped sub-electrodes. The pixel electrode 3131 and the common electrode 3132 may also be disposed in different layers. In this case, as shown in FIGS. 3C and 3D, a first insulating layer 3133 is provided between the pixel electrode 3131 and the common electrode 3132. In a case where the common electrode 3132 is disposed between the thin film transistor 3111 and the pixel electrode 3131, as shown in FIGS. 3C and 3D, a second insulating layer 3134 is provided between the common electrode 3132 and the thin film transistor 3111.

In some other embodiments, the common electrode 3132 is disposed in the opposite substrate 314.

The opposite substrate 314 includes a second base Sub2.

As shown in FIGS. 3C and 3D, the liquid crystal display panel further includes a color filter layer CF and a black matrix pattern BM. The color filter layer CF includes at least a red photoresist unit disposed in a red sub-pixel, a green photoresist unit disposed in a green sub-pixel, and a blue photoresist unit disposed in a blue sub-pixel. The black matrix pattern BM is used for separating light emitted from different sub-pixels, and has a function of reducing the reflected light generated after external ambient light enters the display panel 31.

As shown in FIGS. 3C and 3D, the color filter layer CF and the black matrix pattern BM may be disposed on the second base Sub2 of the opposite substrate 314. That is, the opposite substrate 314 includes the color filter layer CF and the black matrix pattern BM. In this case, the thin film transistor 3111 and the black matrix pattern BM are disposed on different bases. That is, the thin film transistor 3111 and the black matrix pattern BM are disposed on the first base Sub1 and the second base Sub2, respectively. Of course, the color filter layer CF and the black matrix pattern BM may also be disposed in the array substrate 313. That is, the array substrate 313 includes the color filter layer CF and the black matrix pattern BM. In this case, the liquid crystal display panel adopts a color filter on array (COA) technology.

As shown in FIGS. 3C and 3D, the liquid crystal display panel further includes an upper polarizer 316 disposed on a side of the opposite substrate 314 away from the liquid crystal layer 315, and a lower polarizer 317 disposed on a side of the array substrate 313 away from the liquid crystal layer 315.

As shown in FIG. 3C, the touch layer 32 may be disposed between the opposite substrate 314 and the upper polarizer 316 (i.e., On Cell). As shown in FIG. 3D, the touch layer 32 may also be disposed between the array substrate 313 and the liquid crystal layer 315 (i.e., In Cell). A position of the touch layer 32 is not limited thereto. For example, the touch layer 32 may also be disposed on a side of the cover plate 2 proximate to the display panel 31.

In some embodiments, as shown in FIG. 2, the display panel 31 has a display region A1 and a surrounding region A2 located on at least one side of the display region A1. FIG. 2 illustrates an example where the display region A1 is surrounded by the surrounding region A2. The display region A1 refers to a region where an image is displayed, and is configured to accommodate sub-pixels. The surrounding region A2 refers to a region where no image is displayed, and is configured to accommodate driving circuits. For example, a gate driving circuit may be located in the surrounding region A2.

On this basis, as shown in FIG. 2, the cover plate 2 may include a light-transmitting region C1 and a light-shielding region C2. The light-transmitting region C1 may at least partially overlap with the display region A1 of the display panel 31. The light emitted from the display panel 31 may pass through the light-transmitting region C1 of the cover plate 2 to shoot to the outside, so as to be seen by the human eye. The light-shielding region C2 may be disposed at a periphery of the light-transmitting region C1, and may at least partially overlap with the surrounding region A2 of the display panel 31.

In some embodiments, as shown in FIG. 2, the touch layer 32 includes a touch region B1 and a peripheral region B2 located on at least one side of the touch region B1. FIG. 2 illustrates an example where the peripheral region B2 surrounds the touch region B1. The touch region B1 is configured to accommodate a plurality of touch electrodes. The peripheral region B2 is configured to accommodate wiring.

For example, the peripheral region B2 of the touch layer 32 surrounds the touch region B1. In this case, the touch layer 32 includes the plurality of touch electrodes disposed in the touch region B, and a plurality of first touch leads 321, a plurality of second touch leads 322, a plurality of first through holes 21, and a plurality of second through holes 22 that are disposed in the peripheral region B2. The plurality of first through holes 21 and the plurality of second through holes 22 are separately concentrated at two ends of the peripheral region B2, proximate to the FPC 4, of the touch layer 32.

Figure 7:
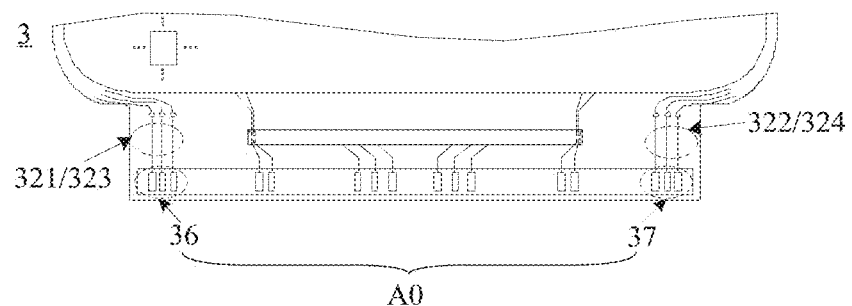
FIG. 7 is an enlarged view of a portion of a display panel that is bonded to a main FPC, in accordance with some embodiments.

Correspondingly, the surrounding region A2 of the display panel 31 surrounds the display region A1. As shown in FIG. 7, the surrounding region A2 of the display panel 31 is provided with a bonding portion A0 therein. The bonding portion A0 includes a plurality of first bonding pads 36 (refer to FIG. 7) and a plurality of second bonding pads 37 (refer to FIG. 7). The plurality of first bonding pads 36 and the plurality of second bonding pads 37 are separately concentrated at two ends of the surrounding region A2, proximate to the FPC 4, of the display panel 31.

In this case, one end of each first touch lead 321 is electrically connected to a single touch electrode, and another end of each first touch lead 321 is electrically connected to a first bonding pad 36 in the display panel 31 through a first through hole 21. One end of each second touch lead 322 is electrically connected to a single touch electrode, and another end of each second touch lead 322 is electrically connected to a second bonding pad 37 in the display panel 31 through a second through hole 22.

The touch electrodes include touch emitting electrodes Tx and touch receiving electrodes Rx. Herein, the first touch leads 321 may be lead(s) of the touch emitting electrode(s) Tx and/or lead(s) of the touch receiving electrode(s) Rx, the second touch leads 322 may be lead(s) of the touch emitting electrode(s) Tx and/or lead(s) of the touch receiving electrode(s) Rx. The embodiments of the present disclosure do not limit this.

On this basis, in order to reduce interference of external signals on signals of touch leads (including the first touch leads 321 and the second touch leads 322), with reference to FIGS. 2, 4 and 7, the touch layer 32 further includes at least one first shielding line 323 disposed on a side of the first touch lead 321 away from the second touch lead 322, and at least one second shielding line 324 disposed on a side of the second touch lead 322 away from the first touch lead 321. Each first shielding line 323 is electrically connected to a first bonding pad 36 in the display panel 31 through a first through hole 21. Each second shielding line 324 is electrically connected to a second bonding pad 37 in the display panel 31 through a second through hole 22.

In addition, in order to reduce signal interference generated between the lead of the touch emitting electrode Tx and the lead of the touch receiving electrode Rx, in a case where the first touch leads 321 include the lead of the touch emitting electrode Tx and the lead of the touch receiving electrode Rx, and the second touch leads 322 include the lead of the touch emitting electrode Tx and the lead of the touch receiving electrode Rx, with reference to FIGS. 2, 4 and 7, the touch layer 32 further includes a first shielding line 323 disposed between the lead of the touch emitting electrode Tx and the lead of the touch receiving electrode Rx that are adjacent to each other in the first touch lead 321, and a second shielding line 324 disposed between the lead of the touch emitting electrode Tx and the lead of the touch receiving electrode Rx that are adjacent to each other in the second touch lead 322. Each first shielding line 323 is electrically connected to a first bonding pad 36 in the display panel 31 through a first through hole 21. Each second shielding line 324 is electrically connected to a second bonding pad 37 in the display panel 31 through a second through hole 22.

In this case, the FPC 4 is bonded and connected to the touch display panel 3, so that the first touch leads 321, the second touch leads 322, the first shielding lines 323 and the second shielding lines 324 may all be electrically connected to a touch chip 4100. The first touch leads 321 and the second touch leads 322 are electrically connected to touch terminals of the touch chip 4100, so as to realize a touch function. The first shielding lines 323 and the second shielding lines 324 are electrically connected to ground terminals of the touch chip 4100, so as to reduce the interference of external signals on the signals of touch leads, and reduce the signal interference generated between the lead of the touch emitting electrode Tx and the lead of the touch receiving electrode Rx.

In order to reduce an area and manufacturing cost of the FPC 4 and to facilitate the design of wiring in the FPC 4, in some related arts, the FPC 4 includes a main FPC 43 and a bridge FPC 44. The main FPC 43 and the bridge FPC 44 are connected together through a connector. Due to a large structure of the connector, the connector occupies a relative large area of the main FPC 43 and the bridge FPC 44. Moreover, the connector requires manual insertion to realize connection, which is inefficient. As a result, labor costs for manufacturing the FPC 4 and costs of the connector increase.

Figure 5:
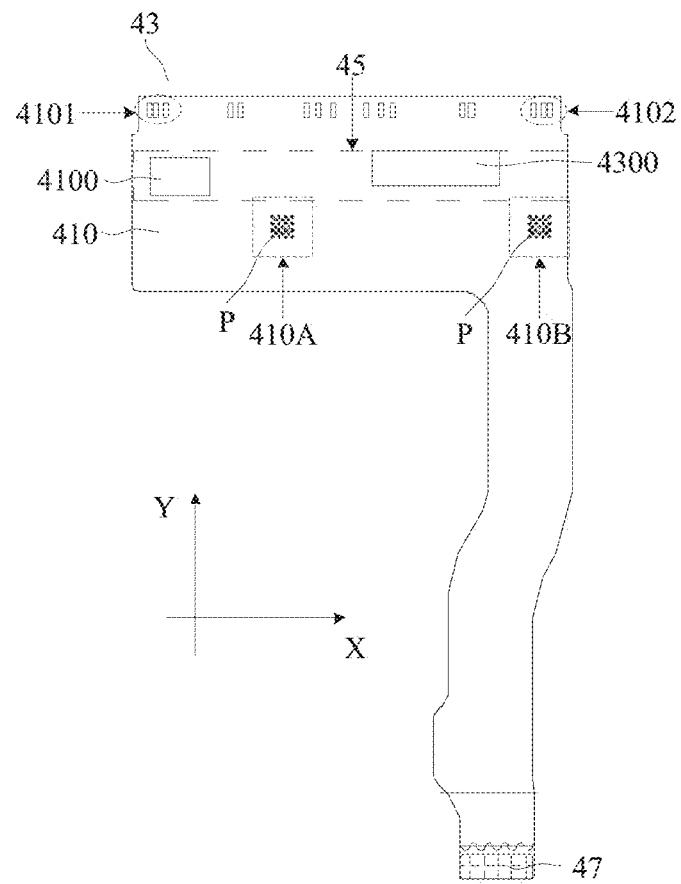
FIG. 5 is a structural diagram of a main FPC, in accordance with some embodiments.
Figure 6:
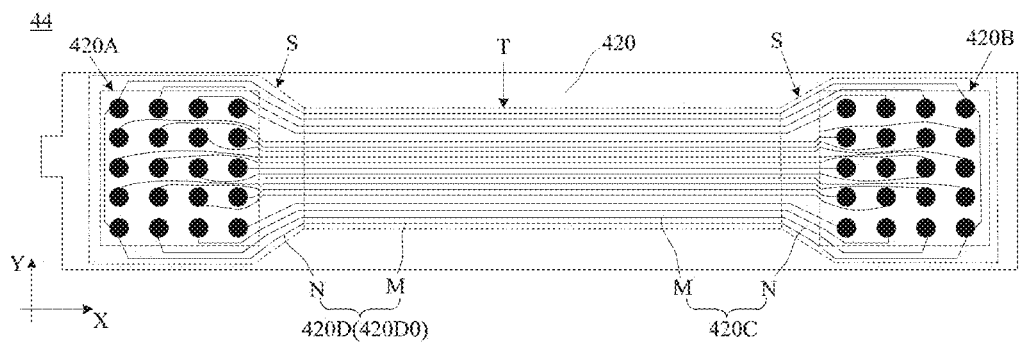
FIG. 6 is a structural diagram of a bridge FPC, in accordance with some embodiments.

As shown in FIGS. 4, 5 and 6, some embodiments of the present disclosure provide a display apparatus. The display apparatus includes a display panel 31, a touch layer 32 disposed on a light-exiting surface of the display panel 31, and a FPC 4 bonded to the display panel 31. The FPC 4 includes a main FPC 43 and a bridge FPC 44.

It will be noted that, with reference to FIG. 2, the display panel 31 may be approximately in a shape of a rectangle in a plan view. The word "rectangle" herein includes not only a substantially rectangular shape, but also a shape similar to a rectangle in consideration of process conditions. On this basis, the display panel 31 has a long side and a short side. In some embodiments, the long side and the short side of the display panel 31 form a right angle at each intersection (that is, at each corner) of the long side and the short side, so that the display panel 31 is in the shape of a rectangle in a plan view. In some other embodiments, a corner of the display panel 31 is curved. That is, the corner is smooth, so that the display panel 31 is in the shape of a rounded rectangle in a plan view.

In some embodiments, as shown in FIG. 2, an orthographic projection of the touch layer 32 on the display panel 31 may overlap with the display panel 31. For example, dimensions of the touch layer 32 are approximately the same as dimensions of the display panel 31. As shown in FIGS. 3A and 3B, sides of the touch layer 32 may be aligned with sides of the display panel 31. However, the embodiments of present disclosure are not limited thereto. For example, the orthographic projection of the touch layer 32 on the display panel 31 may only partially overlap with the display panel 31. For example, the orthographic projection of the touch layer 32 on the display panel 31 at least partially overlaps with the display region A1 of the display panel 31.

Herein, in a case where the dimensions of the touch layer 32 are approximately the same as the dimensions of the display panel 31, the touch region B1 corresponds to the display region A1, and the peripheral region B2 corresponds to the surrounding region A2.

As shown in FIGS. 4 and 5, the main FPC 43 includes a first substrate 410, a plurality of pads P, a touch chip 4100, a plurality of first touch connection lines 41A, a plurality of second touch connection lines 42A and a plurality of third touch connection lines 30A.

The first substrate 410 has a first soldering region 410A and a second soldering region 410B. The plurality of pads P are disposed on the first soldering region 410A and the second soldering region 410B. The touch chip 4100 is disposed on the first substrate 410. A minimum distance between the touch chip 4100 and the first soldering region 410A is less than a minimum distance between the touch chip 4100 and the second soldering region 410B.

The plurality of first touch connection lines 41A are disposed on the first substrate 410. One end of each first touch connection line 41A is electrically connected to the touch chip 4100, and another end of each first touch connection line 41A is electrically connected to a single first touch lead 321 in the touch layer 32 of the display apparatus 100. The plurality of second touch connection lines 42A are disposed on the first substrate 410. One end of each second touch connection line 42A is electrically connected to a single pad P on the second soldering region 410B, and another end of each second touch connection line 42A is electrically connected to a single second touch lead 322 in the touch layer 32 of the display apparatus 100. The plurality of third touch connection lines 30A are disposed on the first substrate 410. One end of each third touch connection line 30A is electrically connected to a single pad P on the first soldering region 410A, and another end of each third touch connection line 30A is electrically connected to the touch chip 4100.

As shown in FIGS. 4 and 6, the bridge FPC 44 includes a second substrate 420, a plurality of pads P and a plurality of touch transfer lines 420C.

The second substrate 420 has a third soldering region 420A and a fourth soldering region 420B. The plurality of pads P are disposed on the third soldering region 420A and the fourth soldering region 420B. A single pad P on the third soldering region 420A is soldered to a single pad P on the first soldering region 410A. A single pad P on the fourth soldering region 420B is soldered to a single pad P on second soldering region 410B.

The plurality of touch transfer lines 420C are disposed on the second substrate 420. One end of each touch transfer line 420C is electrically connected to a single pad P on the third soldering region 420A, and another end of each touch transfer line 420C is electrically connected to a single pad P on the fourth soldering region 420B.

It will be noted that, both the first substrate 410 and the second substrate 420 are flexible substrates. The flexible substrate may be made of one of polyethylene terephthalate, ethylene terephthalate, polyether ether ketone, poly styrene, polycarbonate, polyarylate, polyarylester, polyimide, polyvinyl chloride, polyethylene, and textile fiber, or any combination thereof. The embodiments of the present disclosure are not limited thereto.

As can be seen from the above, the first touch lead 321 in the touch layer 32 may be electrically connected to the touch chip 4100 through the first touch connection line 41A, and the second touch lead 322 in the touch layer 32 may be electrically connected to the touch chip 4100 through the second touch connection line 42A, the touch transfer line 420C and the third touch connection line 30A, so that a touch signal in the touch layer 32 may be transmitted to the touch chip 4100 to realize a touch function of the display apparatus.

In addition, in the embodiments of the present disclosure, since the main FPC 43 and the bridge FPC 44 of the FPC 4 are soldered together, the efficiency of fabricating the FPC 4 may be improved, and costs may be reduced.

In some embodiments, with reference to FIGS. 4, 5 and 6, the bridge FPC 44 further includes at least one shielding transfer line 420D. The at least one shielding transfer line 420D is disposed on the second substrate 420. One end of each shielding transfer line 420D is electrically connected to a single pad P on the third soldering region 420A, and another end of each shielding transfer line 420D is electrically connected to a single pad P on the fourth soldering region 420B. The at least one shielding transfer line 420D is configured to be grounded.

For example, as shown in FIGS. 4, 5 and 6, in a case where the touch layer 32 includes the first shielding line 323 and the second shielding line 324, the main FPC 4 further includes at least one first shielding connection line 41B, at least one second shielding connection line 42B and at least one third shielding connection line 30B.

The at least one first shielding connection line 41B is disposed on the first substrate 410. One end of each first shielding connection line 41B is electrically connected to the touch chip 4100, and another end of each first shielding connection line 41B is configured to be electrically connected to a single first shielding line 323 in the touch layer 32 of the display apparatus 100. The at least one second shielding connection line 42B is disposed on the first substrate 410. One end of each second shielding connection line 42B is electrically connected to a single pad P on the second soldering region 410B, and another end of each second shielding connection line 42B is configured to be electrically connected to a single second shielding line 324 in the touch layer 32 of the display apparatus 100. The at least one third shielding connection line 30B is disposed on the first substrate 410. One end of each third shielding connection line 30B is electrically connected to a single pad P on the first soldering region 410A, and another end of each third shielding connection line 30B is electrically connected to the touch chip 4100.

It will be noted that, the touch transfer line 420C is connected to pads P that correspond to the second touch connection line 42A and the third touch connection line 30A. The shielding transfer line 420D is connected to pads P that are connected to the second shielding connection line 42B and the third shielding connection line 30B.

As can be seen from the above, the first shielding line 323 in the touch layer 32 may be electrically connected to the touch chip 4100 through the first shielding connection line 41B, and the second shielding line 324 in the touch layer 32 may be electrically connected to the touch chip 4100 through the second shielding connection line 42B, the shielding transfer line 420D and the third shielding connection line 30B. In this case, the first shielding line 323 and the second shielding line 324 in the touch layer 32 may both be input with a ground signal, so as to reduce the interference on the touch signal.

In this way, in a case where the first shielding line 323 is disposed on the side of the first touch lead 321 away from the second touch lead 322, and the second shielding line 324 is disposed on the side of the second touch lead 322 away from the first touch lead 321, it may be possible to reduce the interference of external signals on the signals of the touch leads (including the first touch lead 321 and the second touch lead 322). In a case where the first shielding line 323 is disposed between the lead of the touch emitting electrode Tx and the lead of the touch receiving electrode Rx that are adjacent to each other in the first touch lead 321, and the second shielding line 324 is disposed between the lead of the touch emitting electrode Tx and the lead of touch receiving electrode Rx that are adjacent to each other in the second touch lead 322, it may be possible to reduce the signal interference generated between the lead of the touch emitting electrode Tx and the lead of the touch receiving electrode Rx.

On this basis, as shown in FIG. 6, the bridge FPC 44 includes a plurality of shielding transfer lines 420D. The plurality of shielding transfer lines 420D at least include two edge shielding transfer lines 420D0 that are located on outermost sides. Of the two edge shielding transfer lines 420D0, two ends of one edge shielding transfer line 420D0 and two ends of another edge shielding transfer line 420D0 are connected in sequence to form a loop. The plurality of touch transfer lines 420C are all located within the loop. In this way, it may be possible to reduce interference of other signals (such as a signal of a high-frequency signal line on the main FPC 43) on a signal of the touch transfer line 420C that is located within the loop.

Dimensions of the soldering regions (including the first soldering region 410A, the second soldering region 410B, the third soldering region 420A and the fourth soldering region 420B) are not limited. For example, dimensions of each soldering region are (3.84±0.05) mm by (3.84±0.05) mm. For example, the dimensions of each soldering region are 3.84 mm by 3.84 mm. In a same soldering region, a distance between a center of a pad P on the far left and a center of a pad P on the far right is in a range of 2.49 mm to 2.84 mm. For example, the distance is 2.49 mm, 2.54 mm, 2.59 mm, 2.64 mm, 2.69 mm, 2.74 mm, 2.79 mm or 2.84 mm. For example, the distance is 2.66 mm.

The number of pads P on each soldering region is not limited. For example, the number of pads P on each soldering region may be in a range of 20 to 50. For example, the number of pads P on each soldering region may be 20, 25, 30, 35, 40, 45 or 50. For example, the number of pads P on each soldering region may be 25.

On this basis, the number of pads P on the first soldering region 410A, the number of pads P on the second soldering region 410B, the number of pads P on the third soldering region 420A and the number of pads P on the fourth soldering region 420B may be equal or unequal. For example, with reference to FIGS. 4 and 25, the first soldering region 410A, the second soldering region 410B, the third soldering region 420A and the fourth soldering region 420B have a same number of pads, and the number is 25.

Figure 25:
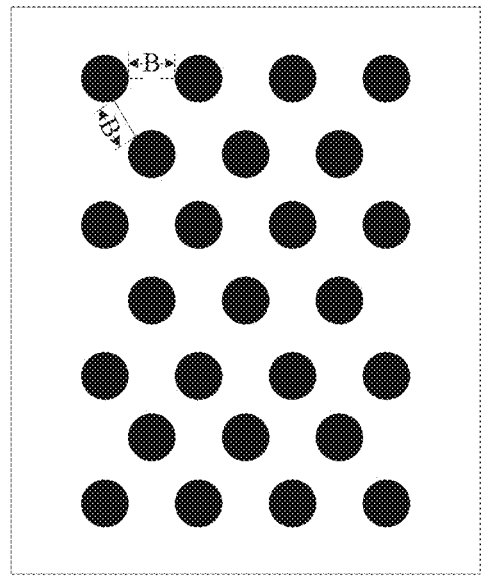
FIG. 25 is an enlarged view of a soldering region (which may be any one of a first soldering region, a second soldering region, a third soldering region, or a fourth soldering region), in accordance with some embodiments.

It will be understood that, in order to ensure that two adjacent pads P are not soldered together, the pad P on the third soldering region 420A is connected to the pad P on the fourth soldering region 420B through a transfer line (which may only include a touch transfer line 420C, or may include both a touch transfer line 420C and a shielding transfer line 420D). In this way, no short circuit will occur. As shown in FIG. 25, there is a certain distance B between two adjacent pads P, and the distance B is less than or equal to 1.0 mm. For example, the distance B between two adjacent pads P may be 0.1 mm, 0.3 mm, 0.8 mm or 1.0 mm.

Herein, the distance B between two adjacent pads P is the shortest distance between edges of the two adjacent pads P.

In some embodiments, a maximum radial dimension of the pad P is less than or equal to 1.0 mm. For example, the maximum radial dimension of the pad P may be 0.1 mm, 0.3 mm, 0.8 mm or 1.0 mm. In this case, dimensions of the pad P are relatively small, and the pad occupies a relatively small area in the main FPC 43 and the bridge FPC 44 of the FPC 4. As a result, the FPC 4 may be made light and thin with a simplified structure.

A shape of an outer contour of the pad P is not limited. For example, the shape of the outer contour of the pad P may be a circle, a square, a rectangle or an irregular shape. A person skilled in the art will understand that, the shape of the outer contour of the pad P includes but is not limited to those mentioned above. Any shape should fall within the protection scope of the embodiments of the present disclosure, and will not be listed here.

Figure 22:
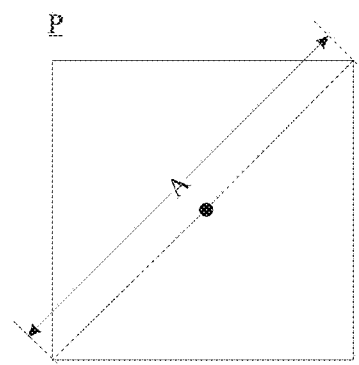
FIG. 22 is a structural diagram of a pad of a shape, in accordance with some embodiments.
Figure 23:
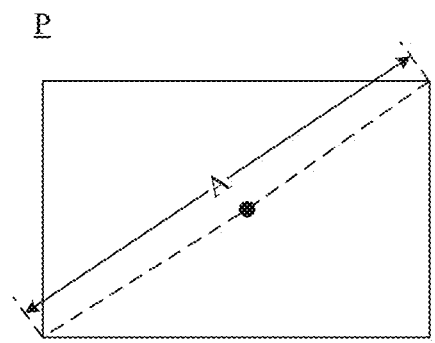
FIG. 23 is a structural diagram of a pad of another shape, in accordance with some embodiments.

In some embodiments, as shown in FIG. 22, in a case where the outer contour of the pad P is approximately in the shape of a square, a dimension A of a diagonal of the square is the maximum radial dimension of the pad P. In some other embodiments, as shown in FIG. 23, in a case where the outer contour of the pad P is approximately in the shape of a rectangle, a dimension A of a diagonal of the rectangle is the maximum radial dimension of the pad P.

Figure 24:
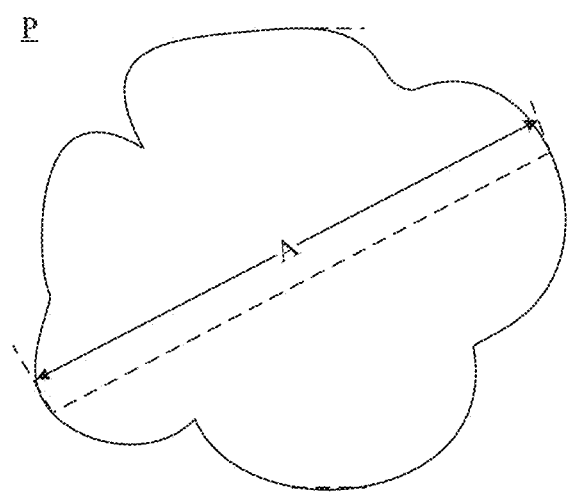
FIG. 24 is a structural diagram of a pad of still another shape, in accordance with some embodiments.

In still some other embodiments, as shown in FIG. 24, in a case where the shape of the outer contour of the pad P is an irregular shape, a maximum value A of a distance between any two points on an edge of the pad P is the maximum radial dimension of the pad P. In still some other embodiments, in a case where the outer contour of the pad P is approximately in the shape of a circle, a diameter of the circle is the maximum radial dimension of the pad P. In this case, the diameter of the pad P is in a range of 0.25 mm to 0.35 mm. For example, a diameter of a circular pad P may be 0.25 mm, 0.3 mm or 0.35 mm.

In some embodiments, the third soldering region 420A and the fourth soldering region 420B are disposed at two ends of the second substrate 420 that are opposite to each other. A shape of an orthographic projection of the second substrate 420 on the main FPC 43 may be centrally symmetric shape, or may not be centrally symmetric shape.

Figure 11:
FIG. 11 is a structural diagram of another bridge FPC, in accordance with some embodiments.

For example, as shown in FIG. 11, the third soldering region 420A and the fourth soldering region 420B are disposed at two ends of the second substrate 420 that are opposite to each other, and the shape of the orthographic projection of the second substrate 420 on the main FPC 43 is centrally symmetric shape.

Figure 12:
FIG. 12 is a structural diagram of still another bridge FPC, in accordance with some embodiments.

For example, as shown in FIG. 12, the third soldering region 420A and the fourth soldering region 420B are disposed at two ends of the second substrate 420 that are opposite to each other, and the shape of the orthographic projection of the second substrate 420 on the main FPC 43 is not centrally symmetric shape. For example, a bump is provided in the middle of a side edge at an end of the second substrate 420 where the third soldering region 420A is located, and the bump extends toward a side of the third soldering region 420A away from the fourth soldering region 420B. That is, a side edge at an end, corresponding to the third soldering region 420A, of the orthographic projection of the second substrate 420 on the main FPC 43 consists of a plurality of line segments that are connected in sequence. A side edge at an end, corresponding to the fourth soldering region 420B, of the orthographic projection of the second substrate 420 on the main FPC 43 is a line segment. In this case, since the shape of the orthographic projection of the second substrate 420 on the main FPC 43 is not centrally symmetric shape, it may be possible to prevent the positions of the third soldering region 420A and the fourth soldering region 420B and the positions of the first soldering region 410A and the second soldering region 410B from being reversed during a process of aligning the bridge FPC 44 and the main FPC 43 and attaching them together.

In some embodiments, with reference to FIG. 6, the third soldering region 420A and the fourth soldering region 420B are both provided with M rows of pads P thereon, M being greater than or equal to two (M≥2). Of a plurality of transfer lines on the second substrate 420 (which may only include the touch transfer lines 420C, or may include both the touch transfer lines 420C and the shielding transfer lines 420D), at least 2M pads P are distributed between two transfer lines that are located on the outermost sides.

For example, in a case where M is greater than or equal to two (M≥2), and each row of pads P on the third soldering region 420A or each row of pads P on the fourth soldering region 420B includes a single pad P, only 2M pads P are distributed between the two transfer lines located on the outermost sides. For example, in a case where M is equal to two (M=2), and each row of pads P on the third soldering region 420A or each row of pads P on the fourth soldering region 420B includes a single pad P, a total of four pads are distributed between the two transfer lines located on the outermost sides.

For example, in a case where M is greater than or equal to two (M≥2), and each row of pads P on the third soldering region 420A or each row of pads P on the fourth soldering region 420B includes two pads P, the number of pads P that are distributed between the two transfer lines located on the outermost sides is greater than 2M. For example, in a case where M is equal to two (M=2), and each row of pads P on the third soldering region 420A or each row of pads P on the fourth soldering region 420B includes two pads P, a total of eight pads P are distributed between the two transfer lines located on the outermost sides.

In some embodiments, with reference to FIGS. 4 and 5, the main FPC 43 is configured to be bonded to the display panel 31 of the display apparatus 100. The first soldering region 410A and the second soldering region 410B are arranged side by side in a first direction X. The first direction X is approximately parallel to an extending direction of a side edge of the main FPC 43 proximate to the display panel 31.

Figure 26A:
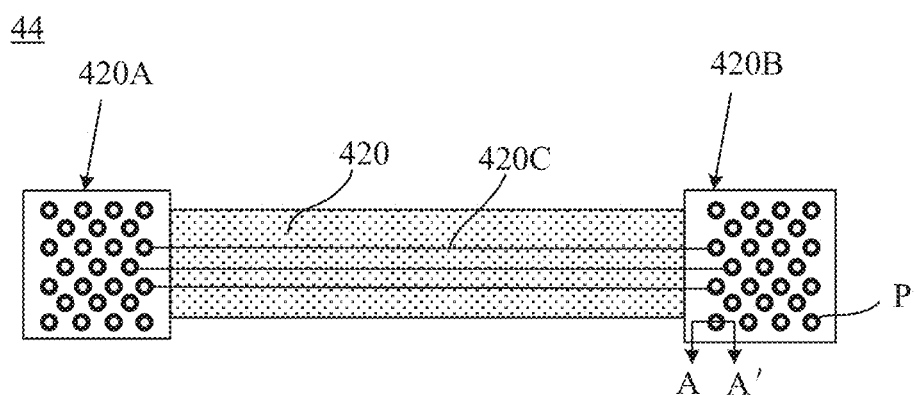
FIG. 26A is a structural diagram of a bridge FPC in a case where a via pad thereof has a circular inner contour, in accordance with some embodiments.

On this basis, with reference to FIGS. 5, 25 and 26A, the pads P on the third bonding region 420A and the pads P on the fourth bonding region 420B are all arranged in a plurality of rows. At least one of the plurality of rows of pads on the third soldering region includes a plurality of pads arranged in the first direction X, and at least one of the plurality of rows of pads on the fourth soldering region includes another plurality of pads arranged in the first direction X. Two adjacent rows of pads are arranged in a staggered manner in a second direction Y. The second direction Y is approximately perpendicular to the first direction X. In this way, in a case where an area of a soldering region is constant, a distance between two adjacent pads P is relatively large. Therefore, in a case where the pads P on the third soldering region 420A and the pads P on the fourth soldering region 420B are connected together through the transfer lines, it may be possible to avoid contact between a pad P and another pad P adjacent thereto, and thus avoid a short circuit problem.

In some embodiments, with reference to FIG. 6, the second substrate 420 has a transition line region T and connection sector regions S located at two opposite ends of the transition line region T. The transition line region T and the connection sector regions S are located between the third soldering region 420A and the fourth soldering region 420B. The transfer line includes a transition section M and connection sections N located at two opposite ends of the transition section. The transition section M extends in the first direction X, and is disposed in the transition line region T. The connection section N is disposed in the connection sector region S. A minimum width of the connection sector region S in the second direction Y is greater than or equal to a width of the transition line region T in the second direction Y.

It will be noted that, along the second direction Y, the width of the transition line region T is approximately equal to a distance between the transition sections M of two transfer lines that are located on the outermost sides among the plurality of transfer lines. Along the second direction Y, the width of the connection sector region S is approximately equal to a distance between the connection sections N of two transfer lines that are located on the outermost sides among the plurality of transfer lines.

With reference to FIG. 6, in the first direction X, in a direction pointing from the fourth soldering region 420B toward the third soldering region 420A, a width of the connection sector region proximate to the third soldering region 420A in the second direction Y gradually increases. Similarly, in the first direction X, in a direction pointing from the third soldering region 420A toward the fourth soldering region 420B, a width of the connection sector region proximate to the fourth soldering region 420B in the second direction Y gradually increases.

In some embodiments, as shown in FIG. 6, the width of the transition line region in the second direction Y is less than a maximum width of the third soldering region 420A in the second direction Y; and/or, the width of the transition line region in the second direction Y is less than a maximum width of the fourth soldering region 420B in the second direction Y.

In some embodiments, as shown in FIG. 6, a maximum width of a portion of the connection sector region proximate to the third soldering region 420A in the second direction Y is greater than the maximum width of the third soldering region 420A in the second direction Y; and/or, a maximum width of a portion of the connection sector region proximate to the fourth soldering region 420B in the second direction Y is greater than the maximum width of the fourth soldering region 420B in the second direction Y.

In this way, the transfer line may enter the soldering region from a plurality of sides of the soldering region to be electrically connected to a corresponding pad P. For example, the transfer line may enter the soldering region through a region other than a region between a first row of pads P and a last row of pads P of the soldering region, so as to be electrically connected to a corresponding pad P. In this way, it may be possible to facilitate wiring and avoid crosstalk between the touch signals.

In some embodiments, as shown in FIG. 6, the pads P on the third soldering region 420A and the pads P on the fourth soldering region 420B are all arranged in a plurality of rows, and at least one of the plurality of rows of pads P on the third soldering region 420A includes a plurality of pads arranged in the first direction X, and at least one of the plurality of rows of pads P on the fourth soldering region 420B includes another plurality of pads arranged in the first direction X. At least one of the plurality of transfer lines on the second substrate 420 passes through a region other than both a region between a first row of pads P and a last row of pads P on the third soldering region 420A and a region between a first row of pads P and a last row of pads P on the fourth soldering region 420B, so as to be electrically connected to a corresponding pad P.

For example, the third soldering region 420A and the fourth soldering region 420B on the second substrate 420 are both provided with two rows of pads P thereon. The first row of pads P on the third soldering region 420A and the first row of pads P on the fourth soldering region 420B both include one pad P, A second row of pads P on the third soldering region 420A and a second row of pads P on the fourth soldering region 420B both include two pads P. In this case, the number of transfer lines on the second substrate 420 is 3. One of the three transfer lines passes through a region on a side of the second row of pads P away from the first row of pads P. Or, the third soldering region 420A and the fourth soldering region 420B on the second substrate 420 are both provided with two rows of pads P. The first row of pads P on the third soldering region 420A and the first row of pads P on the fourth soldering region 420B both include two pads P. A second row of pads P on the third soldering region 420A and a second row of pads P on the fourth soldering region 420B both include one pad P. In this case, the number of transfer lines on the second substrate 420 is 3. One of the three transfer lines passes through a region on a side of the first row of pads P away from the second row of pads P.

For example, the third soldering region 420A and the fourth soldering region 420B on the second substrate 420 are both provided with two rows of pads P. Each row of pads P on the third soldering region 420A or each row of pads P on the fourth soldering region 420B includes two pads P. In this case, the number of transfer lines on the second substrate 420 is 4. Of two of the four transfer lines, one transfer line passes through a region on a side of the first row of pads P away from the second row of pads P, and the other transfer line passes through a region on a side of the second row of pads P away from the first row of pads P.

For example, the third soldering region 420A and the fourth soldering region 420B on the second substrate 420 are both provided with three rows of pads P. Each row of pads P on the third soldering region 420A or each row of pads P on the fourth soldering region 420B includes three pads P. In this case, the number of transfer lines on the second substrate 420 is nine. A first row of pads P on the third soldering region 420A are electrically connected to a first row of pads P on the fourth soldering region 420B through three transfer lines, and two transfer lines pass through a region on a side of the first row of pads P away from the third row of pads P. A third row of pads P on the third soldering region 420A are electrically connected to a third row of pads P on the fourth soldering region 420B through three transfer lines, and two transfer lines pass through a region on a side of the third row of pads P away from the first row of pads P.

In some embodiments, with reference to FIG. 6, of the two transfer lines located on the outermost sides among the plurality of transfer lines on the second substrate 420, two ends of one transfer line are located on a side of a first row of pads P away from a last row of pads P on the third soldering region 420A and a side of a first row of pads P away from a last row of pads P on the fourth soldering region 420B, and are electrically connected to two pads P that are farthest away from each other and located in a first row of pads P on the third soldering region 420A and in a first row of pads P on the fourth soldering region 420B; two ends of the other transfer line are located on a side of the last row of pads P away from the first row of pads P on the third soldering region 420A and a side of the last row of pads P away from the first row of pads P on the fourth soldering region 420B, and are electrically connected to two pads P that are farthest away from each other and located in a last row of pads P on the third soldering region 420A and in a last row of pads P on the fourth soldering region 420B.

For example, with reference to FIG. 6, the third soldering region 420A and the fourth soldering region 420B are both provided with M rows of pads thereon, M being larger than or equal to two (M≥2). The bridge FPC 44 includes a plurality of shielding transfer lines 420D. The plurality of shielding transfer lines 420D at least includes two edge shielding transfer lines 420D0 that are located on the outermost sides. Of the two edge shielding transfer lines 420D0, two ends of one edge shielding transfer line are located on a side of a first row of pads P away from a last row of pads P on the third soldering region 420A and a side of a first row of pads P away from a last row of pads P on the fourth soldering region 420B, and are electrically connected to two pads P that are farthest away from each other and located in the first row of pads P on the third soldering region 420A and in the first row of pads P on the fourth soldering region 420B; two ends of the other edge shielding transfer line are located on a side of the last row of pads P away from the first row of pads P on the third soldering region 420A and a side of the last row of pads P away from the first row of pads P on the fourth soldering region 420B, and are electrically connected to two pads P that are farthest away from each other in a last row of pads P on the third soldering region 420A and a last row of pads P on the fourth soldering region 420B.

For example, the third soldering region 420A and the fourth soldering region 420B on the second substrate 420 are both provided with two rows of pads P. Each row of pads P on the third soldering region 420A or each row of pads P on the fourth soldering region 420B includes two pads P. In this case, the number of transfer lines on the second substrate 420 is four. Of two of the four transfer lines, one transfer line pass through a region on a side of the first row of pads P away from the second row of pads P, and are electrically connected to two pads P that are farthest away from each other in a first row of pads P on the third soldering region 420A and a first row of pads P on the fourth soldering region 420B; two ends of the other transfer line pass through a region on a side of the second row of pads P away from the first row of pads P, and are electrically connected to two pads P that are farthest away from each other in a second row of pads P on the third soldering region 420A and a second row of pads P on the fourth soldering region 420B.

It will be understood that, the plurality of transfer lines (which may include only the touch transfer lines 420C, or may include both the touch transfer lines 420C and the shield transfer lines 420D) may be located on the same side of the second substrate 420, or may be located on two sides of the second substrate 420 that are opposite to each other.

Figure 27:
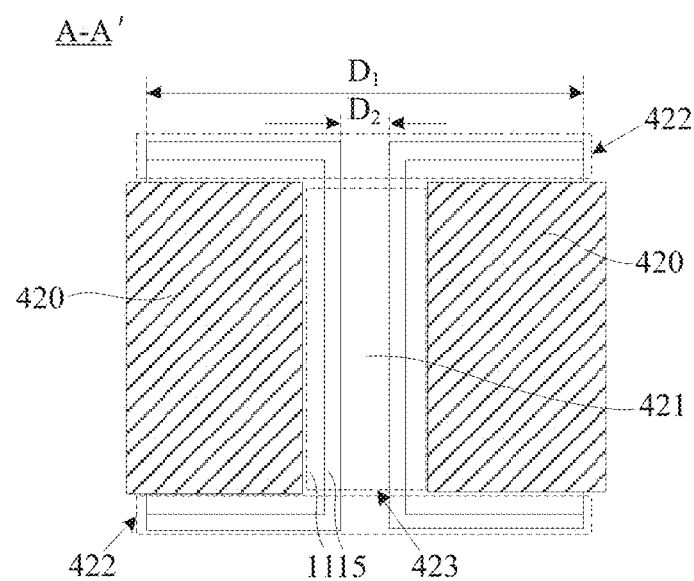
FIG. 27 is a cross-sectional view of the via pad shown in FIG. 26A taken along the A-A' direction.
Figure 30A:
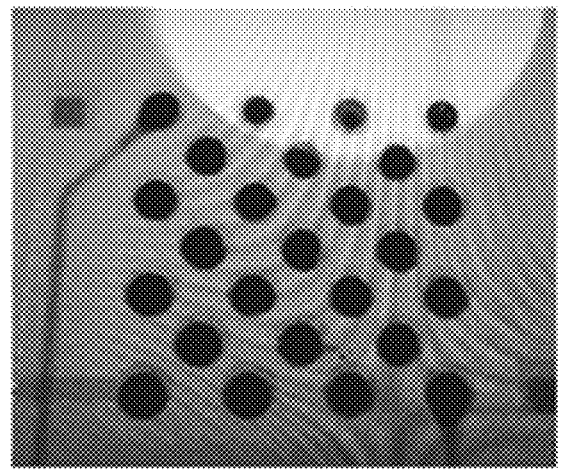
FIG. 30A is an X-ray diagram of FIG. 29A.
Figure 30B:
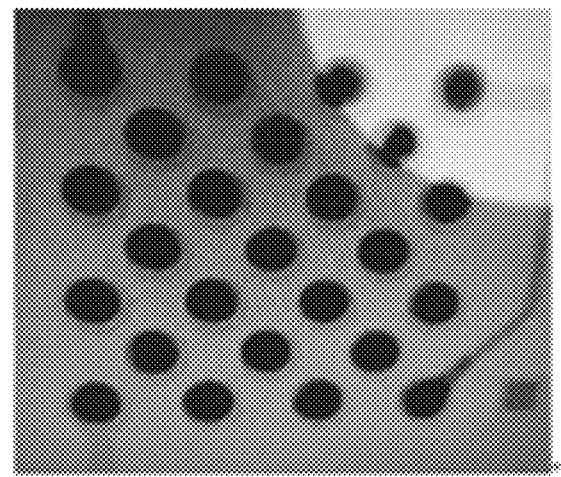
FIG. 30B is an X-ray diagram of FIG. 29B.

In some embodiments, as shown in FIGS. 27, 30A and 30B, the pads P on the second substrate 420 are via pads. The second substrate 420 has a plurality of via holes 421, and each via hole 421 corresponds to a single via pad. The via pad includes two soldering lugs 422 and a conductive connection layer 423. The two soldering lugs 422 are disposed on a surface of the second substrate 420 proximate to the main FPC 43 and a surface of the second substrate 420 away from the main FPC 43. The via hole 421 corresponding to the via pad penetrates the second substrate 420 between the two soldering lugs 422 of the via pad and the two soldering lugs 422. The conductive connection layer 423 covers a sidewall of the via hole 421. Two ends of the conductive connection layer 423 are electrically connected to the two soldering lugs 422. Herein, with reference to FIG. 27, the conductive connection layer 423 may include a conductive film 11 and an anti-oxidation metal layer (also known as a second metal pattern 15) that is disposed on a side of the conductive film 11 away from the second substrate 420.

In this way, in a case where the pads P in the main FPC 43 and the via pads in the bridge FPC 44 are soldered together, solder will overflow from the via holes 421, thereby realizing electrical connection between the pads P of the main FPC 43 and the via pads of the bridge FPC 44.

Herein, the transfer lines of the bridge FPC 44 may be disposed on a surface of the second substrate 420 proximate to the first substrate 410, and/or, a surface of the second substrate 420 away from the first substrate 410. For example, on both the surface of the second substrate 420 proximate to the first substrate 410 and the surface of the second substrate 420 away from the first substrate 410, the pads P on the third soldering region 420A may be connected to the pads P on the fourth soldering region 420B through the transfer lines. In this way, it may be possible to facilitate wiring of the bridge FPC 44 and the main FPC 43.

A shape of an outer contour of an orthographic projection of the via pad on the second substrate 420 is not limited. For example, the outer contour of the orthographic projection of the via pad on the second substrate 420 may be in the shape of a circle, a square, a rectangle, or an irregular figure. A person skilled in the art will understand that, the shape of the outer contour of the orthographic projection of the via pad on the second substrate 420 includes but is not limited to those mentioned above. Any shape shall fall within the protection scope of the embodiments of the present disclosure, which will not be listed here.

Figure 26B:
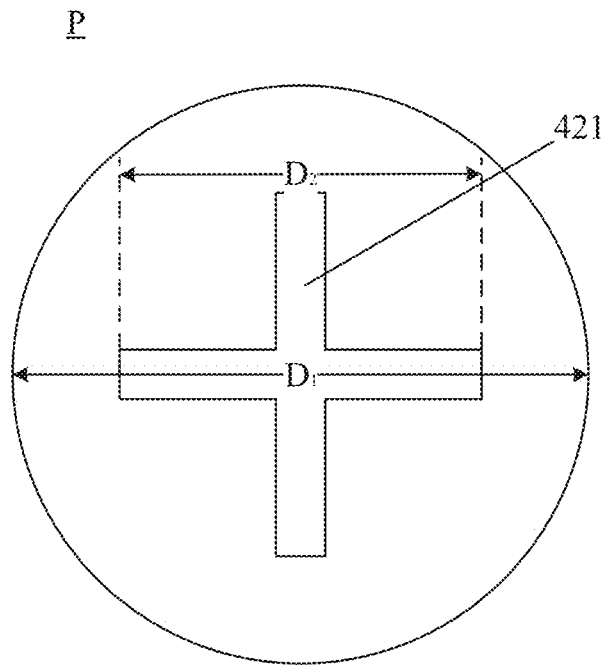
FIG. 26B is an enlarged view of a via pad having an X-shaped inner contour, in accordance with some embodiments.

In some embodiments, as shown in FIGS. 26A and 26B, the outer contour of the orthographic projection of the via pad on the second substrate 420 is approximately circular. In this case, a diameter D1 of the outer contour of the via pad is in a range of 0.25 mm to 0.35 mm. For example, the diameter D1 of the outer contour of the via pad is 0.25 mm, 0.3 mm or 0.35 mm.

Herein, a shape of an inner contour of the orthographic projection of the via pad on the second substrate 420 is not limited. For example, the inner contour of the orthographic projection of the via pad on the second substrate 420 may be in a shape of a circle or an "X". A person skilled in the art will understand that, the shape of the inner contour of the orthographic projection of the via pad on the second substrate 420 includes but is not limited to those mentioned above. Any shape shall fall within the protection scope of the embodiments of the present disclosure, which will not be listed here.

If a diameter of the via hole 421 in the via pad is too large, the via hole 421 will not be fully filled with the solder, causing a problem of poor soldering between the via pad in the bridge FPC 44 and the pad in the main FPC 43; if the diameter of the via hole 421 in the via pad is too small, the air in the via hole 421 may not be discharged and the via hole 421 may not be fully filled with solder during soldering, causing a problem of solder leakage.

In consideration of the above, in some embodiments, as shown in FIG. 26A, the inner contour of the orthographic projection of the via pad on the second substrate 420 is approximately circular, and a diameter of the inner contour of the via pad is in a range of 0.05 mm to 0.15 mm. For example, the diameter of a circular pad is 0.05 mm, 0.1 mm or 0.15 mm.

In some other embodiments, as shown in FIG. 26B, the inner contour of the orthographic projection of the via pad on the second substrate 420 is approximately in the shape of the "X". In this case, a diameter D2 of a circumscribed circle corresponding to the X-shaped inner contour is in a range of 0.05 mm to 0.2 mm. For example, the diameter D2 of the circumscribed circle corresponding to the X-shaped inner contour is 0.05 mm, 0.1 mm or 0.2 mm.

In this way, during a process of soldering the via pads of the bridge FPC 44 and the pads P of the main FPC 43 together, the air may be well discharged through the via hole 421 corresponding to the via pad, and the via hole 421 may be fully filled with the solder. This also facilitates visual inspection for preventing solder leakage.

Figure 13:
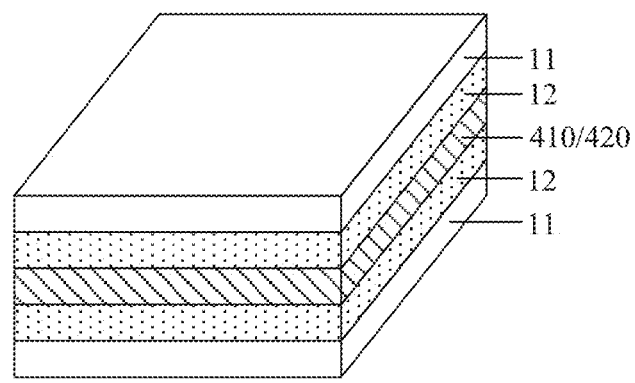
FIG. 13 is a diagram of a film structure of a main FPC or a bridge FPC, in accordance with some embodiments.
Figure 14:
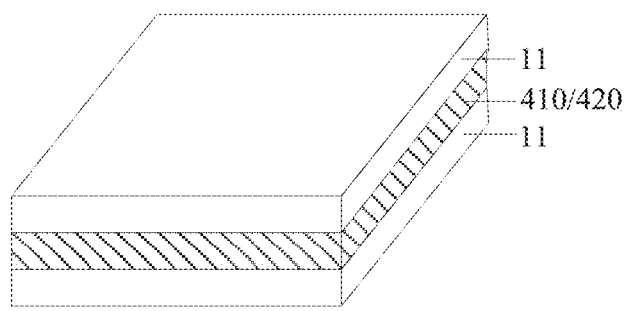
FIG. 14 is a diagram of another film layer structure of a main FPC or a bridge FPC, in accordance with some embodiments.

In some embodiments, the main FPC 43 and the bridge FPC 44 are both a double-layer board. That is, both the main FPC 43 and the bridge FPC 44 have two conductive layers. As shown in FIG. 13, a conductive film 11 is provided on a side of the first substrate 410 proximate to the second substrate 420 and on a side of the first substrate 410 away from the second substrate 420, and the conductive film 11 is connected to the first substrate 410 through an adhesive layer 12. The conductive film 11 is provided on a side of the second substrate 420 proximate to the first substrate 410 and on a side of the second substrate 420 away from the first substrate 410, and the conductive film 11 is connected to the second substrate 420 through an adhesive layer 12. In addition, as shown in FIG. 14, the conductive film 11 may also be directly formed on the first substrate 410 and directly formed on on the second substrate 420.

Figure 19:
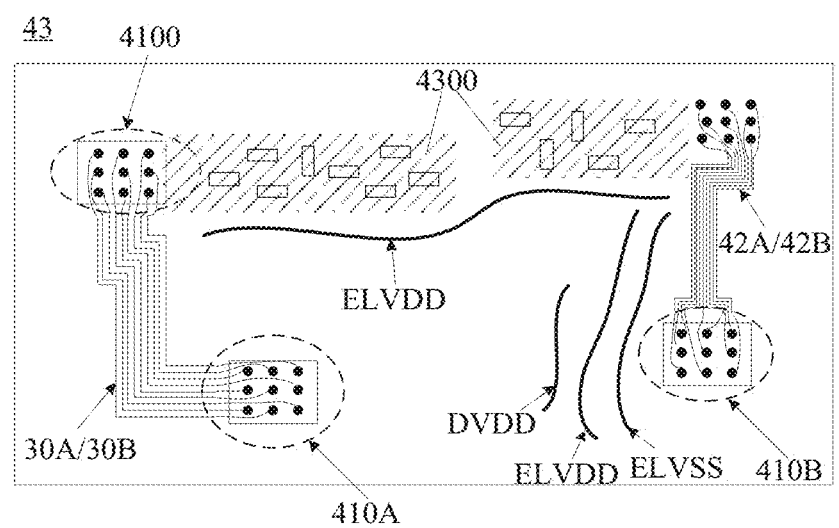
FIG. 19 is a structural diagram of a side of a main FPC proximate to a bridge FPC, in accordance with some embodiments.
Figure 20:
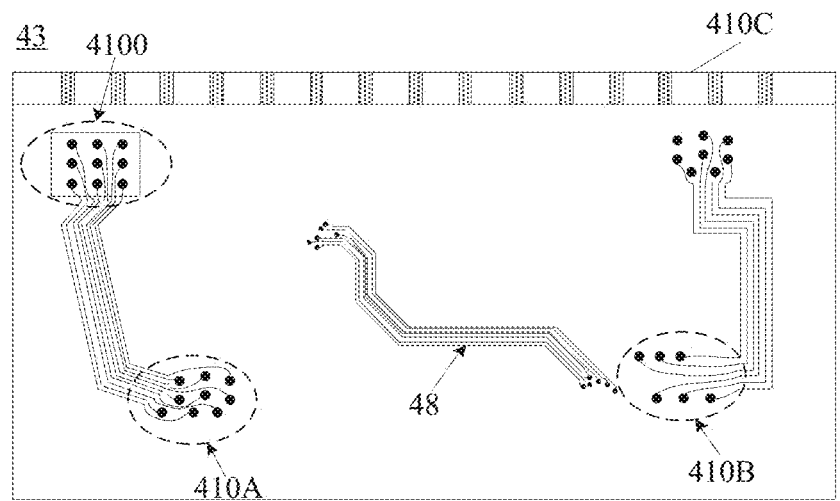
FIG. 20 is a structural diagram of a side of a main FPC away from a bridge FPC, in accordance with some embodiments.

In some embodiments, in the main FPC 43, the conductive film 11 proximate to the bridge FPC 44 may form the plurality of pads P on the first soldering region 410A and the second soldering region 410B and various lines. Herein, with reference to FIGS. 4, 19 and 20, the various lines may include at least one of the first touch connection line 41A, the second touch connection line 42A, the third touch connection line 30A, the first shielding connection line 41B, the second shielding connection line 42B, the third shielding connection line 30B, ELVDD lines, an ELVSS line, a DVDD line and high-frequency signal lines 48 (also referred to as Mobile Industry Processor Interface (MIPI) lines). In the main FPC 43, the conductive film 11 away from the bridge FPC 44 may form the bonding pins that are bonded to the display panel 31.

Figure 18:
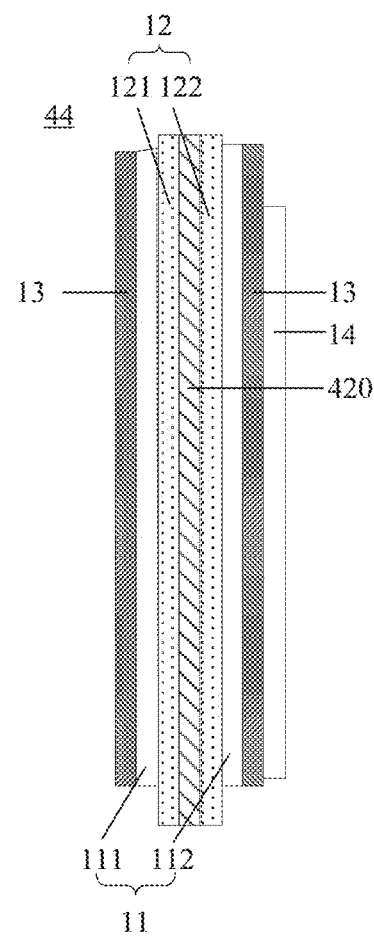
FIG. 18 is a diagram of another film layer structure of a bridge FPC, in accordance with some embodiments.

In some embodiments, with reference to FIGS. 6, 18 and 27, in the bridge FPC 44, the conductive film 11 away from the main FPC 43 may form the plurality of soldering lugs 422 on the third soldering region 420A and the fourth soldering region 420B, the touch transfer lines 420C and the shielding transfer lines 420D. With reference to FIGS. 18 and 27, in the bridge FPC 44, the conductive film 11 proximate to the main FPC 43 may form the plurality of soldering lugs 422 on the third soldering region 420A and the fourth soldering region 420B and an electromagnetic interference layer 14.

Figure 15:
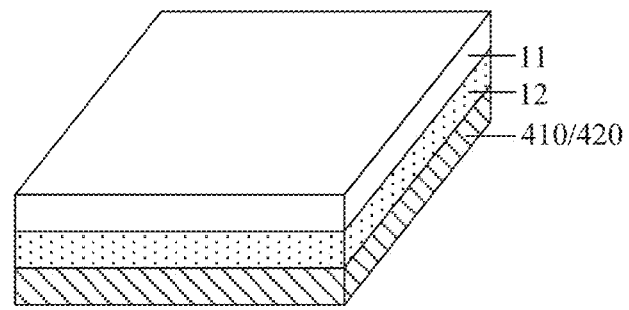
FIG. 15 is a diagram of still another film layer structure of a main FPC or a bridge FPC, in accordance with some embodiments.
Figure 16:
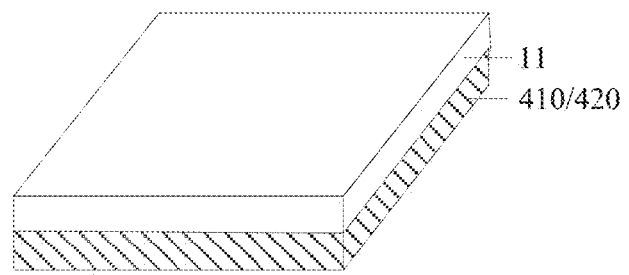
FIG. 16 is a diagram of still another film layer structure of a main FPC or a bridge FPC, in accordance with some embodiments.

In some embodiments, the main FPC 43 and the bridge FPC 44 are both a single-layer board. That is, the main FPC 43 and the bridge FPC 44 both have only one conductive layer. As shown in FIG. 15, a conductive film 11 is provided on a side of the first substrate 410 proximate to the second substrate 420 or on a side of the first substrate 410 away from the second substrate 420. The conductive film 11 is connected to the first substrate 410 through an adhesive layer 12. Similarly, the conductive film 11 is provided on a side of the second substrate 420 proximate to the first substrate 410 or on a side of the second substrate 420 away from the first substrate 410. The conductive film 11 is connected to the second substrate 420 through an adhesive layer 12. In addition, as shown in FIG. 16, the conductive film 11 may also be directly formed on the first substrate 410 and directly formed on the second substrate 420.

In some embodiments, the conductive film 11 in the main FPC 43 may form the plurality of pads P on the first soldering region 410A and the second soldering region 410B, various lines and the bonding pins that are bonded to the display panel 31. Herein, with reference to FIGS. 4, 19 and 20, the various lines may include at least one of the first touch connection line 41A, the second touch connection line 42A, the third touch connection line 30A, the first shielding connection line 41B, the second shielding connection line 42B, the third shielding connection line 30B, an ELVDD line, an ELVSS line, a DVDD line and a high-frequency signal line 48 (also referred to as a Mobile Industry Processor Interface (MIPI) line).

In some embodiments, with reference to FIGS. 6 and 15, the conductive film 11 in the bridge FPC 44 may form the plurality of pads P on the third soldering region 420A and the fourth soldering region 420B, the touch transfer lines 420C and the shielding transfer lines 420D.

A material of the conductive layer 11 is not limited. For example, the conductive layer 11 may be made of a metal. For example, the material of the conductive layer 11 may be copper.

A material of the adhesive layer 12 is not limited. For example, the material of the adhesive layer 12 may be at least one of a pressure sensitive adhesive (PSA), an epoxy adhesive and an acrylic adhesive.

In some embodiments, an orthographic projection of the adhesive layer 12 on the first substrate 410 completely overlaps with the first substrate 410, or an orthographic projection of the adhesive layer 12 on the second substrate 420 completely overlaps with the second substrate 420, so as to ensure that the adhesive layer 12 completely attaches the conductive film 11 to the first substrate 410 or the second substrate 420.

Figure 17:
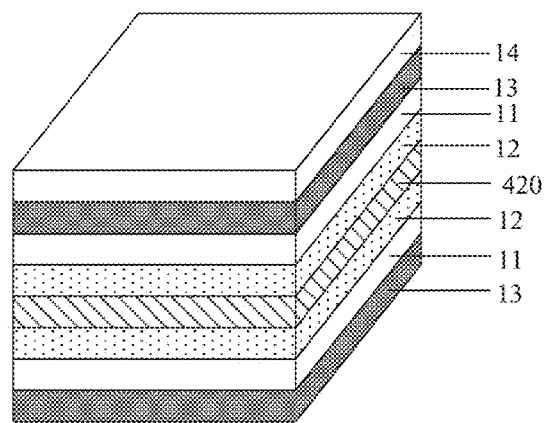
FIG. 17 is a diagram of a film layer structure of a bridge FPC, in accordance with some embodiments.

In some embodiments, as shown in FIGS. 4 and 17, the bridge FPC 44 further includes a protective layer 13 and an electromagnetic interference layer 14. The protective layer 13 and the electromagnetic interference layer 14 are disposed on a side of the second substrate 420 proximate to the main FPC 43, and are arranged in a direction moving away from the second substrate 420 in sequence. In this case, the electromagnetic interference layer 14 may shield the interference of the high-frequency signal line 48 of the main FPC 43 on the touch transfer lines 420C of the bridge FPC 44.

It will be noted that, the electromagnetic interference layer 14 is disposed in a region of the second substrate 420 other than the third soldering region 420A and the fourth soldering region 420B, so as to avoid an influence on the soldering between the main FPC 43 and the bridge FPC 44.

A material of the protective layer 13 is not limited. For example, the protective layer 13 may be made of polyimide (PI).

A material of the electromagnetic interference layer 14 is not limited. For example, the electromagnetic interference layer 14 may be made of a metal such as copper.

For example, as shown in FIG. 18, the bridge FPC 44 includes the second substrate 420, a first adhesive layer 121, a second adhesive layer 122, a first conductive film 111, a second conductive film 112, the protective layers 13 and the electromagnetic interference layer 14. The first adhesive layer 121 and the second adhesive layer 122 are respectively disposed on two sides of the second substrate 420 that are opposite to each other. The first conductive film 111 is disposed on a side of the first adhesive layer 121 away from the second substrate 420. The second conductive film 112 is disposed on a side of the second adhesive layer 122 away from the second substrate 420. One protective layer 13 is disposed on a side of the second conductive film 112 away from the second substrate 420. The electromagnetic interference layer 14 is disposed on a side of the protective layer 13 away from the second substrate 420. It will be understood that, the second adhesive layer 122, the second conductive film 112, the protective layer 13 and the electromagnetic interference layer 14 are located on a side of the second substrate 420 proximate to the first substrate 410.

Herein, a thickness of the first substrate 410 and a thickness of the second substrate 420 may be 25.4 μm. A thickness of the first conductive film 111 and a thickness of the second conductive film 112 may be 14 μm. A thickness of the first adhesive layer 121 and a thickness of the second adhesive layer 122 may be 15 μm. A thickness of the protective layer 13 may be 12.7 μm. A thickness of the electromagnetic interference layer 14 may be 12 μm.

In addition, in a case where the main FPC 43 and the bridge FPC 44 are soldered together through the plurality of pads P, other regions of the main FPC 43 and the bridge FPC 44 that overlap may be bonded together by a thermosetting adhesive, so as to improve the reliability of the connection between the main FPC 43 and the bridge FPC 44. Herein, a thickness of the thermosetting adhesive may be 5 μm.

Figure 40:
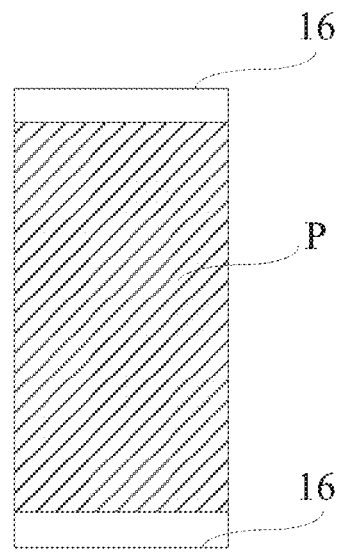
FIG. 40 is a structural diagram of pads in a main FPC, in accordance with some embodiments.

In some embodiments, as shown in FIGS. 5 and 40, the main FPC 43 further includes first metal patterns 16. The first metal patterns cover the pads P on the first substrate 410, and are configured to prevent the pads P on the first substrate 410 P from being oxidized.

In some embodiments, with reference to FIG. 27, the bridge FPC 44 further includes second metal patterns 15. The second metal patterns 15 cover the pads P on the second substrate 420, and are configured to prevent the pads P on the second substrate 420 from being oxidized.

It will be noted that, a shape of a first metal pattern 16 and a shape of a second metal pattern 15 are approximately the same as a shape of a respective corresponding pad P. In this way, the first metal pattern 16 and the second metal pattern 15 may completely cover the respective corresponding pad P, thereby achieving an effect of preventing the respective corresponding pad P from being oxidized. In addition, in a case where the pad P of the bridge FPC 44 is a via pad, the second metal pattern 15 further covers the sidewall of the via hole 421, so as to prevent the conductive layer (the conductive film 11) in the via hole 421 from being oxidized.

A material of the first metal pattern and a material of the second metal pattern 15 are not limited, as long as the respective corresponding pad may be prevented from being oxidized and corroded. For example, the material of the first metal pattern includes one of gold and nickel, or a combination thereof; the material of the second metal pattern includes one of gold and nickel, or a combination thereof.

In a case where the first metal pattern and the second metal pattern 15 are made of nickel, a thickness of the first metal pattern and a thickness of the second metal pattern are in a range of 2 μm to 4 μm. In a case where the first metal pattern and the second metal pattern 15 are made of gold, a thickness of the first metal pattern and a thickness of the second metal pattern are both 0.05 μm.

Figure 41:
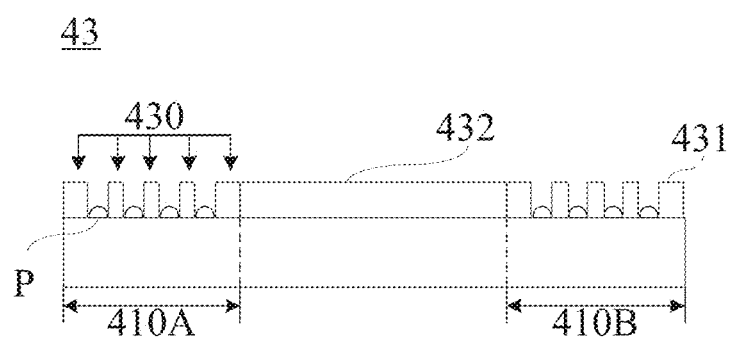
FIG. 41 is a structural diagram of another main FPC, in accordance with some embodiments.

In some embodiments, as shown in FIG. 41, the main FPC 43 further includes a first green oil layer 431 and a first resin layer 432. The first green oil layer 431 covers at least first regions 430 of the first substrate 410. The first regions 430 are regions in the first soldering region 410A and the second soldering region 410B other than regions where the pads P are located. The first resin layer 432 covers a region of the first substrate 410 other than the first soldering region 410A and the second soldering region 410B.

Figure 42:
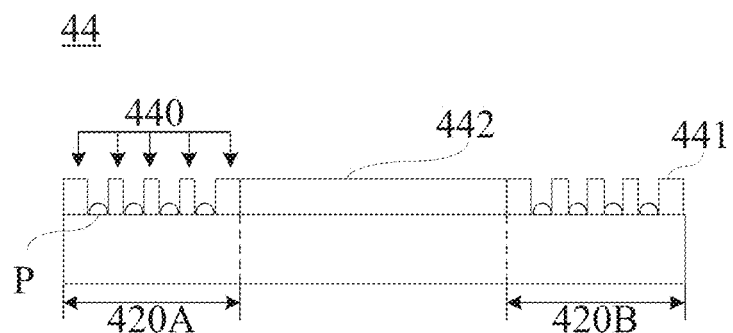
FIG. 42 is a structural diagram of still another bridge FPC, in accordance with some embodiments.

In some embodiments, as shown in FIG. 42, the bridge FPC 44 further includes a second green oil layer 441 and a second resin layer 442. As shown in FIGS. 28, 29A, 29B and 42, the second green oil layer 441 covers at least second regions 440 of the second substrate 420. The second regions 440 are regions in the third soldering region 420A and the fourth soldering region 420B other than regions where the pads P are located. The second resin layer 442 covers a region of the second substrate 420 other than the third soldering region 420A and the fourth soldering region 420B.

It will be noted that, in addition to the first regions and the second regions, boards of the pads P may also be coated with green oil, so as to prevent the solder material from overflowing from the regions where the pads P are located. It will be understood that, in a case where the board of the pad P is coated with green oil, the green oil may be partially located on the pad P, but will not completely cover the pad P.

Figure 28:
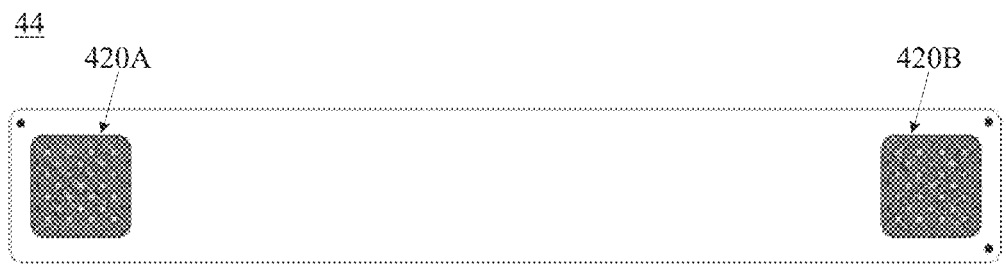
FIG. 28 is a structural diagram of a bridge FPC in a case where regions of a third soldering region and a fourth soldering region other than regions where pads are located are coated with green oil, in accordance with some embodiments.
Figure 29A:
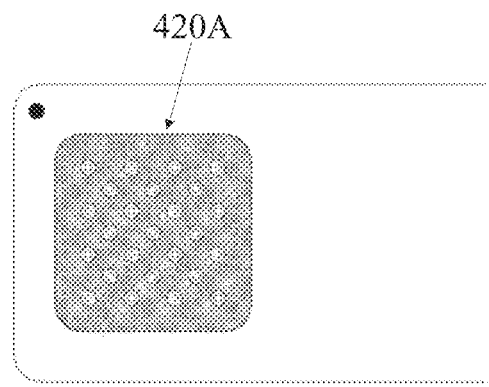
FIG. 29A is an enlarged view of the third soldering region shown in FIG. 28.
Figure 29B:
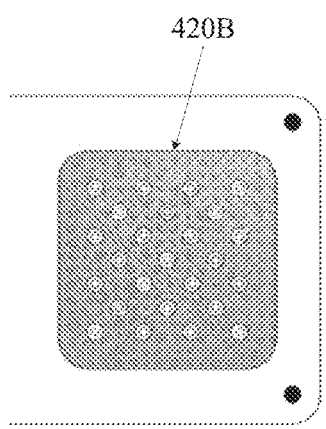
FIG. 29B is an enlarged view of the fourth soldering region shown in FIG. 28.

With reference to FIGS. 28, 29A and 29B, FIG. 28 is a schematic diagram illustrating an example where regions in a third soldering region 420A and a fourth soldering region 420B other than regions where the pads P are located (the second regions) are coated with green oil. FIG. 29A is an enlarged view of the third soldering region 420A shown in FIG. 28. FIG. 29B is an enlarged view of the fourth soldering region 420B shown in FIG. 28. It may be clearly seen from FIGS. 29A and 29B that, the green oil layer is disposed to avoid the regions where the pads P are located in the third soldering region 420A and the fourth soldering region 420B.

Figure 43:
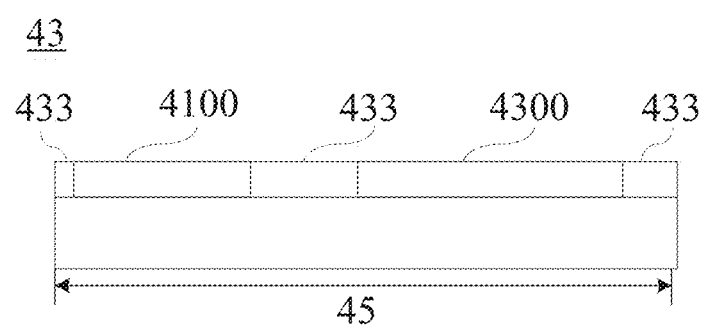
FIG. 43 is a structural diagram of still another main FPC, in accordance with some embodiments.

In some embodiments, as shown in FIGS. 4 and 5, the first substrate 410 further has an element region 45. As shown in FIG. 43, the main FPC 43 further includes at least one element and a third green oil layer 433. The at least one element is disposed on a side of the first substrate 410 proximate to the bridge FPC 44, and is located in the element region 45 of the first substrate 410. The third green oil layer 433 covers a region in the element region 45 other than a region where the at least one element is located.

The number of the at least one element is not limited. The at least one element may indicate that the main FPC 43 includes only one element, or may indicate that the main FPC 43 includes two or more element.

Herein, the element may be at least one of a resistor, a capacitor and a transistor. For example, with reference to FIGS. 4 and 5, the element may be a first element 4300 composed of a plurality of resistors, a plurality of capacitors and a plurality of transistors. The first element 4300 is electrically connected to the driving chip 4200 in the display panel 3 through the bonding pin(s) on the main FPC 43 and the bonding pad(s) on the display panel 3. For example, the element may also be a touch chip 4100 having a touch function that is composed of a plurality of resistors, a plurality of capacitors and a plurality of transistors.

Herein, "green oil" is a liquid photo solder resist, and is an acrylic oligomer. As a protective layer, the first green oil layer covers the first regions, and the second green oil layer covers the second regions, so as to prevent a short circuit between two adjacent pads P; the third green oil layer covers the region in the element region 45 other than the region where the at least element is located, so as to prevent a short circuit between two adjacent elements. The "resin" may include one of polyimide (PI), polyethylene terephthalate (PET), or a combination thereof.

The first soldering region 410A, the second soldering region 410B, the third soldering region 420A, the fourth soldering region 420B and the element region 45 are too small in size to be coated with a resin material to form a protective layer. Furthermore, the green oil is relatively expensive, if the region of the first substrate 410 other than the first soldering region 410A and the second soldering region 410B and the region of the second substrate 420 other than the third soldering region 420A and the fourth soldering region 420B are also covered with green oil, the cost of fabricating the main FPC 43 and the bridge FPC 44 will be quite high.

Based on this, it is arranged that the green oil covers the first regions of the first substrate and the region in the element region 45 of the first substrate other than the region where the element is located, the resin covers the region of the first substrate 410 other than the first soldering region 410A, the second soldering region 410B and the element region 45, the green oil covers the second regions of the second substrate 420, and the resin covers the region of the second substrate 420 other than the third soldering region 420A and the fourth soldering region 420B. In this way, it may not only be possible to ensure a good coating effect on the surfaces of the first substrate 410 and the second substrate 420, but it may also be possible to reduce the cost of fabricating the main FPC 43 and the bridge FPC 44.

Figure 8:
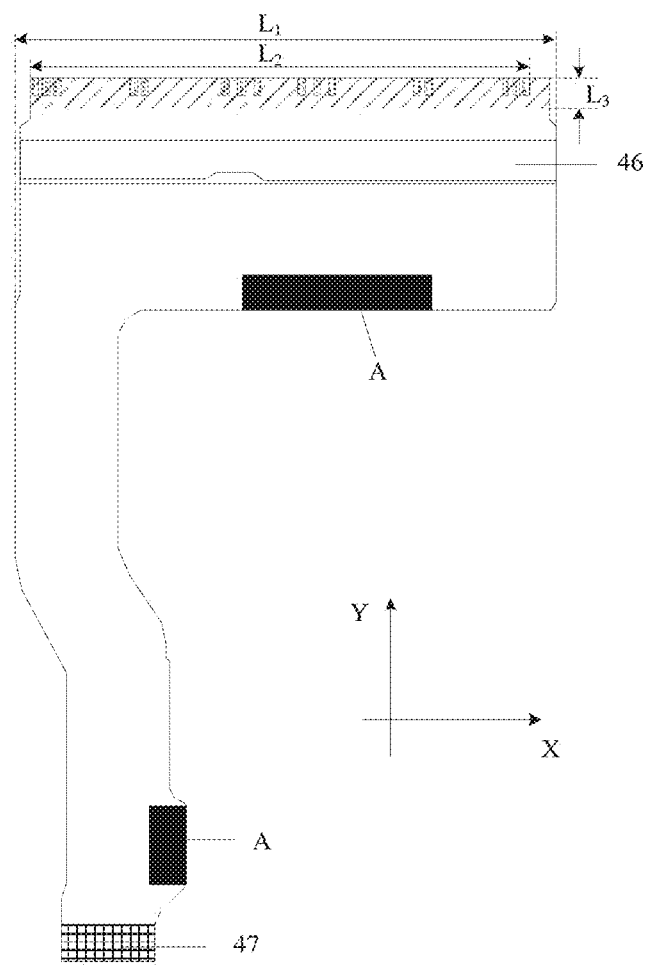
FIG. 8 is a structural diagram of a side of a main FPC away from the bridge FPC, in accordance with some embodiments.

On this basis, as shown in FIGS. 5 and 8, the main FPC 43 further includes a support piece 46. The support piece 46 is disposed on a side of the first substrate 410 away from the bridge FPC 44. The element region 45 is located within an orthographic projection of the support piece 46 on the first substrate 410.

In this case, the support piece 46 may support all of the element(s) in the element region 45 on the first substrate 410, so that a portion of the first substrate 410 in the element region 45 will not be deformed due to a weight of the elements, thereby protecting the elements in the element region 45.

In some embodiments, a distance exists between a board of the orthographic projection of the support piece 46 on the first substrate 410 and a board of the element region 45. The distance is greater than or equal to 0.5 mm. In this case, the support 46 may support all of the element(s) in the element region 45 on the first substrate 410, and occupies a small area on a side of the main FPC 43 away from the bridge FPC 44 in the FPC 4. As a result, the FPC 4 may be light and thin with a simplified structure.

Figure 9:
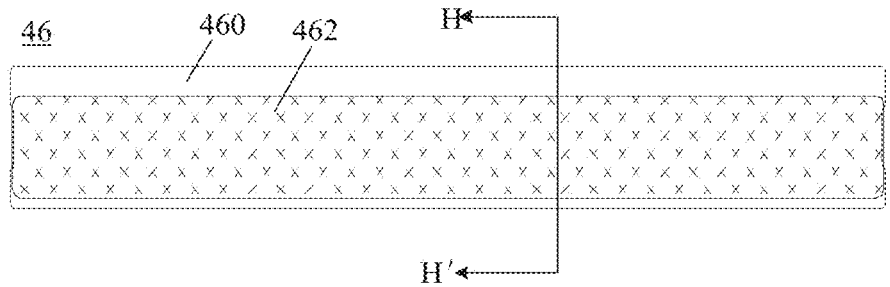
FIG. 9 is a structural diagram of a support piece, in accordance with some embodiments.
Figure 10:
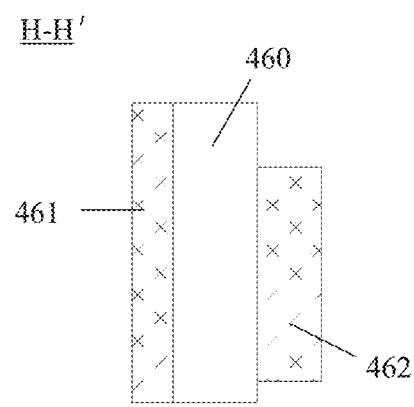
FIG. 10 is a cross-sectional view of the support piece shown in FIG. 9 taken along the H-H' direction.

In some embodiments, with reference to FIGS. 9 and 10, the support piece 46 includes a metal sheet 460, and a first adhesive layer 461 and a first film 462 that are located on two opposite sides of the metal sheet 460. The first adhesive layer 461 is located on a side of the metal sheet 460 proximate to the first substrate 410. On this basis, the first adhesive layer 461 is in contact with a surface of the first substrate 410 away from the second substrate 420. With reference to FIGS. 2 and 4, in a case where the FPC 4 can be bent along the dotted line L toward the back side of the display panel 31 so that the FPC 4 is located on the back side of the display panel 31, the first film 462 is in contact with a back surface of the display panel 31.

In some embodiments, with reference to FIG. 10, an orthographic projection of the first adhesive layer 461 on the first substrate 410 coincides with an orthographic projection of the metal sheet 460 on the first substrate 410. That is, an area of the orthographic projection of the first adhesive layer 461 on the first substrate 410 is equal to an area of the orthographic projection of the metal sheet 460 on the first substrate 410, and a board of the first adhesive layer 461 coincides with a board of the metal sheet 460. In this way, the metal sheet 460 is completely adhered to the first substrate 410 with high connection reliability.

In some embodiments, with reference to FIGS. 9 and 10, an orthographic projection of the first film 462 on the first substrate 410 is located within the orthographic projection of the metal sheet 460 on the first substrate 410. An area of the orthographic projection of the first film 462 on the first substrate 410 is less than the area of the orthographic projection of the metal sheet 460 on the first substrate 410.

A material of the metal sheet 460 is not limited. For example, the metal sheet 460 is made of at least one of steel, iron, or an alloy thereof with silicon. For example, the metal sheet 460 is made of an alloy of silicon and steel. For another example, the metal sheet 460 is made of an alloy of silicon and iron. For still another example, the metal sheet 460 is made of steel.

A material of the first adhesive layer 460 is not limited. For example, the first adhesive layer 460 may be made of a thermosetting adhesive.

A material of the first film 462 is not limited, as long as a good heat dissipation effect is ensured. For example, the first film 462 is a heat-dissipating graphite film.

In some embodiments, with reference to FIGS. 4, 5 and 8, the first substrate 410 further has a bonding region 410C. The bonding region is a region of the first substrate 410 that is configured to be bonded to the display panel 31 of the display apparatus 100. The main FPC 43 further includes a plurality of first bonding pins 4101 and a plurality of second bonding pins 4102. The plurality of first bonding pins 4101 are disposed in the bonding region 410C. At least one first bonding pin 4101 is configured to electrically connect the first touch connection line 41A to a corresponding first touch lead 321 in the touch layer 32 of the display apparatus 100. The plurality of second bonding pins 4102 are disposed in the bonding region 410C. At least one second bonding pin 4102 is configured to electrically connect the second touch connection line 42A to a corresponding second touch lead 322 in the touch layer 32.

Figure 21:
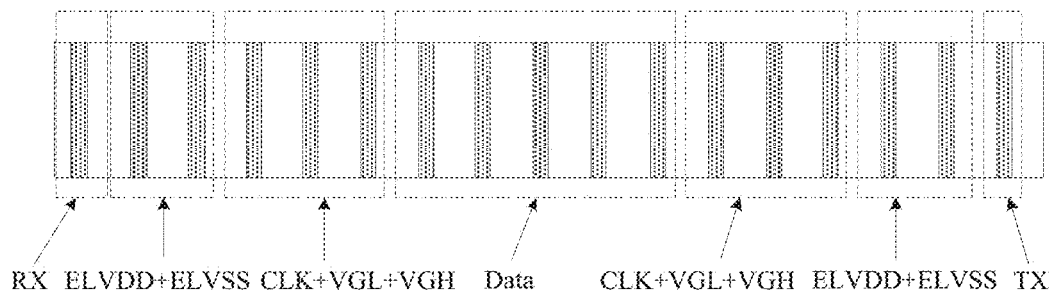
FIG. 21 is an enlarged view of the bonding region shown in FIG. 20, in accordance with some embodiments.

In some embodiments, as shown in FIG. 21, from left to right, the bonding region 410C is sequentially provided with signal terminals including a touch receiving electrode Rx signal terminal, ELVDD and ELVSS signal terminals, GOA signal terminals (a CLK signal terminal, a VGL signal terminal, a VGH signal terminal), the data signal control signal (Data signals) terminals, GOA signal terminals (a CLK signal terminal, a VGL signal terminal, a VGH signal terminal), ELVDD and ELVSS signal terminals, and a touch emitting electrode Tx signal terminal.

It will be noted that, since the currents on the ELVDD line and the ELVSS line are relatively large, the pins in the main FPC 43 corresponding to the ELVDD line or the ELVSS line will be shorted. That is, a plurality of ELVDD lines are connected together, or a plurality of ELVSS lines are connected together, and then converged into a single line to be electrically connected to the bonding pad of the display panel 3.

In a case where the main FPC 43 further includes at least one first shielding connection line 41B and at least one second shielding connection line 42B, at least one first bonding pin 4101 is configured to electrically connect the first shielding connection line 41B to a corresponding first shielding line 323 in the touch layer 32, and at least one second bonding pin 4102 is configured to electrically connect the second shielding connection line 42B to a corresponding second shielding line 324 in the touch layer 32.

In some embodiments, with reference to FIGS. 4 and 8, along a first direction X, a maximum dimension $L_1$ of the main FPC 43 is greater than or equal to 55.25 mm, and less than or equal to 55.55 mm (55.25 mm≤$L_1$≤55.55 mm). The first direction X is approximately parallel to an extending direction of a side edge of the main FPC 43 proximate to the display panel 31.

In some embodiments, with reference to FIGS. 4, 8 and 21, the bonding region is strip-shaped, and extends in the first direction X. The plurality of first bonding pins 4101 and the plurality of second bonding pins 4102 are arranged side by side in the first direction X. In the first direction, a distance $L_2$ between the first bonding pin 4101 and the second binding pin 4102 of the main FPC 43 that are farthest away from each other is greater than or equal to 53.55 mm, and less than or equal to 53.85 mm (53.55 mm≤$L_2$≤53.85 mm). In a second direction Y, a maximum dimension $L_3$ of the bonding region is greater than or equal to 1.2 mm, and less than or equal to 1.6 mm (1.2 mm≤$L_3$≤1.6 mm).

In some embodiments, with reference to FIGS. 4, 5 and 8, the main FPC 43 is further provided with a connecting portion 47. The connecting portion 47 is configured to be electrically connected to a main board of the display apparatus 100.

In some embodiments, with reference to FIG. 8, the main FPC 43 has a copper leakage portion A on a side thereof away from the bridge FPC 44. The copper leakage portion A is configured to be grounded.

The number of the first touch leads 321 included in the touch layer 32 may be equal to or different from the number of the first touch connection lines 41A included in the main FPC 43. The number of the second touch leads 322 included in the touch layer 32 may be equal to or different from each of the number of the second touch connection lines 42A included in the main FPC 43 and the number of the third touch connection lines 30A included in the main FPC 43.

In some embodiments, the number of the first touch leads 321 included in the touch layer 32 is equal to the number of the first touch connection lines 41A included in the main FPC 43, and the number of the second touch leads 322 included in the touch layer 32 is equal to each of the number of the second touch connection lines 42A included in the main FPC 43 and the number of the third touch connection lines 30A included in the main FPC 43. With this arrangement, it may be possible to ensure that the touch chip 4100 can receive a plurality of different touch signals from the first touch leads 321 and the second touch leads 322, and avoid crosstalk between touch signals on two adjacent first touch leads 321 or two adjacent second touch leads 322.

In some other embodiments, due to a limited size of the surrounding region A2 of the display panel 31, the same touch electrode is electrically connected to a plurality of touch leads (the first touch leads 321 or the second touch leads 322) disposed in different layers in the surrounding region A2 of the display panel 31, and the plurality of touch leads electrically connected to the same touch electrode may be electrically connected to a same touch connection line (the first touch connection line 41A or the second touch connection line 42A). With this arrangement, it may be possible to make the surrounding region A2 of the display panel 31 narrow. In addition, it may be possible to ensure that the touch chip 4100 can receive a plurality of different touch signals from the first touch leads 321 and the second touch leads 322, and avoid crosstalk between the touch signals on two adjacent first touch leads 321 or two adjacent second touch leads 322.

In a case where the touch layer 32 includes the first shielding line 323 and the second shielding line 324, the main FPC 43 correspondingly includes the first shielding connection line 41B, the second shielding connection line 42B and the third shielding connection line 30B. In this case, the bridge FPC 44 correspondingly includes a shielding transfer line 420D. In this case, the number of the first shield lines 323 included in the touch layer 32 may be equal to or different from the number of the first shielding connection lines 41B included in the main FPC 43, and the number of the second shielding lines 324 included in the touch layer 32 may be equal to or different from each of the number of the second shielding connection lines 42B included in the main FPC 43 and the number of the third shielding connection lines 30B included in the main FPC 43.

In some embodiments, the number of the first shield lines 323 included in the touch layer 32 is equal to the number of the first shielding connection lines 41B included in the main FPC 43, and the number of the second shielding lines 324 included in the touch layer 32 is equal to each of the number of the second shielding connection lines 42B included in the main FPC 43 and the number of the third shielding connection lines 30B included in the main FPC 43.

In some other embodiments, the number of the first shielding lines 323 included in the touch layer 32 is less than the number of the first shielding connection lines 41B included in the main FPC 43, and the number of the second shielding lines 324 included in the touch layer 32 is less than each of the number of the second shielding connection lines 42B included in the main FPC 43 and the number of the third shielding connection lines 30B included in the main FPC 43. In this way, it may be possible to reduce an area, occupied by the first shielding connection lines 41B, the second shielding connection lines 42B and the third shielding connection lines 30B, in the main FPC 43, and thus simplify a structure of the FPC and reduce costs.

In some embodiments, with reference to FIG. 4, the main FPC 43 further includes a plurality of data signal control lines 434. The plurality of data signal control lines 434 are disposed on the first substrate 410. The display panel 31 includes a plurality of data lines Data and the driving chip 4200. The driving chip 4200 is disposed in the surrounding region A2, and is electrically connected to the plurality of data signal control lines 434 and the plurality of data lines Data. The driving chip 4200 is configured to process signals on the plurality of data signal control lines and transmit the processed signals to the plurality of data lines Data.

In some embodiments, each column of sub-pixels in the display panel 31 needs to be electrically connected to one data line Data, so that various data signals can be provided to columns of sub-pixels. A line (the data signal control line), connected to the driving chip 4200, in the FPC 4 only needs to provide a driving signal to the driving chip 4200, so that the driving chip 4200 outputs the data signals that columns of sub-pixels require.

Based on this, in some embodiments, it is arranged that the number of the data signal control lines included in the main FPC 43 is less than the number of the data lines Data included in the display panel 31. In this way, by gating the plurality of data lines Data, it may be possible to use a single data signal control line to transmit data signals to the plurality of data lines Data, and thus reduce the number of channels used for transmitting data signals in the driving chip 4200, that is, reduce the number of the data signal control lines. On this basis, a width of the data signal control line may be set to be greater than a width of the data line Data, which may help improve a transmission efficiency of transmitting data signals from one data signal control line to the plurality of data lines Data.

In some embodiments, as shown in FIGS. 5 and 7, the main FPC 43 further includes the first bonding pins 4101 and the second bonding pins 4102, and the display panel 31 further includes the plurality of first bonding pads 36 and the plurality of second bonding pads 37. Each first bonding pad 36 is electrically connected to a single first bonding pin 4101 and a single first touch lead 321. Each second bonding pad 37 is electrically connected to a single second bonding pin 4102 and a single second touch lead 322.

Based on this, in conjunction with FIGS. 2 and 4, the FPC 4 may be bonded to the first bonding pads 36 and the second bonding pads 37 in the surrounding region A2 of the display panel 31 through the first bonding pins 4101 and the second bonding pins 4102 (also referred to "golden fingers") on the main FPC 43.

In some embodiments, a thickness of the first bonding pad 36 and a thickness of the second bonding pad 37 are both less than a distance between a surface of the touch layer 32 proximate to the display panel 31 and a surface of the display panel 31 away from the touch layer 32. In this case, when the data lines Data, gate lines and other lines in the display panel 31 are sequentially formed by an etching process, the first bonding pads 36 and the second bonding pads 37 may be formed simultaneously by the etching process. That is, the first bonding pad 36 and the second bonding pad 37 include a plurality of metal layers that are stacked. A thickness of the plurality of metal layers that are stacked is less than the distance between the surface of the touch layer 32 proximate to the display panel 31 and the surface of the display panel 31 away from the touch layer 32. Herein, the touch layer 32 may be directly disposed on the light-exiting side of the display panel 31. That is, the touch layer 32 and the display panel 31 may be of an integrated structure.

Some embodiments of the present disclosure further provide a display apparatus 100. As shown in FIGS. 1 and 2, the display apparatus 100 includes a display panel 31, a touch layer 32 disposed on a light-exiting surface of the display panel 31, and a FPC bonded to the display panel 31.

The display panel 31 has a display region A1 and a surrounding region A2 that is located on at least one side of the display region A1. The surrounding region A2 is provided with a bonding portion A0. The bonding portion includes a plurality of first bonding pads 36 (see FIG. 7) and a plurality of second bonding pads 37 (see FIG. 7). The touch layer 32 includes a plurality of first touch leads 321 and a plurality of second touch leads 322. A single first touch lead 321 is electrically connected to a single first bonding pad 36. A single second touch lead 322 is electrically connected to a single second bonding pad 37.

The FPC includes a main FPC and a bridge FPC. The main FPC 43 includes a first substrate 410, a plurality of pads P, a touch chip 4100, a plurality of first touch connection lines 41A, a plurality of second touch connection lines 42A and a plurality of third touch connection lines 30A. The first substrate 410 has a first soldering region 410A, a second soldering region 410B and a bonding region 410C. The bonding region 410C is provided with a plurality of first bonding pins 4101 (see FIG. 5) and a plurality of second bonding pins 4102 (see FIG. 5) thereon. A single first bonding pin 4101 is electrically connected to a single first bonding pad 36. A single second bonding pin 4102 is electrically connected to a single second bonding pad 37. The plurality of pads P are disposed in the first soldering region 410A and the second soldering region 410B. The touch chip 4100 is disposed on the first substrate 410. A minimum distance between the touch chip 4100 and the first soldering region 410A is less than a minimum distance between the touch chip 4100 and the second soldering region 410B. The plurality of first touch connection lines 41A are disposed on the first substrate 410. One end of each first touch connection line 41A is electrically connected to the touch chip 4100, and another end of each first touch connection line 41A is electrically connected to a first touch lead 321 through a first bonding pin 4101 and a first bonding pad 36. The plurality of second touch connection lines 42A are disposed on the first substrate 410. One end of each second touch connection line 42A is electrically connected to a single pad P on the second soldering region 410B, and another end of each second touch connection line 42A is electrically connected to a second touch lead 322 through a second bonding pin 4102 and a second bonding pad 37. The plurality of third touch connection lines 30A are disposed on the first substrate 410. One end of each third touch connection line 30A is electrically connected to a single pad P on the first soldering region 410A, and another end of each third touch connection line 30A is electrically connected to the touch chip 4100.

With reference to FIGS. 5 and 6, the bridge FPC 44 includes a second substrate 420, a plurality of pads P and a plurality of touch transfer lines 420C. The second substrate 420 has a third soldering region 420A and a fourth soldering region 420B. The plurality of pads P are disposed in the third soldering region 420A and the fourth soldering region 420B. A single pad P on the third soldering region 420A is soldered to a single pad P on the first soldering region 410A. A single pad P on the fourth soldering region 420B is soldered to a single pad P on second soldering region 410B. The plurality of touch transfer lines 420C are disposed on the second substrate 420. One end of each touch transfer line 420C is electrically connected to a single pad P on the third soldering region 420A, and another end of each touch transfer line 420C is electrically connected to a single pad P on the fourth soldering region 420B.

A maximum radial dimension of the pad P is less than or equal to 1.0 mm.

The third soldering region 420A or the fourth soldering region 420B is provided with M rows of pads P, M being greater than or equal to two (M≥2). Of the plurality of touch transfer lines 420C, at least 2M pads are distributed between two touch transfer lines 420C that are located on outermost sides.

The pads P on the first soldering region 410A, the pads P on the second soldering region 410B, the pads P on the third soldering region 420A and the pads P on the fourth soldering region 420B are all arranged in a plurality of rows. At least one row of pads P includes a plurality of pads P. Two adjacent rows of pads are arranged in a staggered manner in a column direction With reference FIGS. 6 and 27, the pad in the bridge FPC 44 is a via pad. The via pad includes two soldering lugs 422 and a conductive connection layer 423. The two soldering lugs 422 are disposed on a surface of the second substrate 420 proximate to the main FPC 43 and a surface of the second substrate 420 away from the main FPC 43. A via hole 421 corresponding to the via pad penetrates the second substrate 420 between the two soldering lugs 422 of the via pad and the two soldering lugs 422. The conductive connection layer 423 covers a sidewall of the via hole 421, and two ends of the conductive connection layer 423 are electrically connected to two soldering lugs 422.

The display apparatus provided by the embodiments of the present disclosure have the same technical features and beneficial effects as the display apparatus provided by the above embodiments. Reference may be made to the above embodiments, and details will not be repeated here.

In some embodiments, with reference to FIG. 4, the FPC 4 includes a plurality of data signal control lines 434. The display panel 31 includes a plurality of data lines Data and a driving chip 4200. The driving chip 4200 is disposed in the surrounding region A2, and is electrically connected to the plurality of data signal control lines 434 and the plurality of data lines Data. The driving chip 4200 is configured to process signals on the plurality of data signal control lines and output the processed signals to the plurality of data lines Data. The number of the data signal control lines is less than the number of the data lines Data. A width of the data signal control line is greater than a width of the data line Data.

In some embodiments, the number of the first touch leads 321 included in the touch layer 32 is equal to the number of the first touch connection lines 41A included in the main FPC 43. The number of the second touch leads 322 included in the touch layer 32 is equal to each of the number of the second touch connection lines 42A included in the main FPC 43 and the number of the third touch connection lines 30A included in the main FPC 43.

In some embodiments, with reference to FIGS. 4 and 8, in a first direction X, a maximum dimension $L_1$ of the main FPC 43 is greater than or equal to 55.25 mm, and less than or equal to 55.55 mm (55.25 mm≤$L_1$≤55.55 mm). The first direction X is approximately parallel to an extending direction of a side edge of the main FPC 43 proximate to the display panel 31. In conjunction with FIG. 21, the bonding region 410C is strip-shaped, and extends along the first direction X. The plurality of first bonding pins 4101 and the plurality of second bonding pins 4102 are arranged side by side in the first direction X. In the first direction X, a distance $L_2$ between the first bonding pin 4101 and the second bonding pin 4102 of the main FPC 43 that are farthest away from each other is greater than or equal to 53.55 mm, and less than or equal to 53.85 mm (53.55 mm≤$L_2$≤53.85 mm). In a second direction Y, a maximum dimension $L_3$ of the bonding region is greater than or equal to 1.2 mm, and is less than or equal to 1.6 mm (1.2 mm≤$L_3$≤1.6 mm). The second direction Y is approximately perpendicular to the first direction X.

It will be noted that, regarding features and beneficial effects of other structure of the display apparatus provided in the embodiments of the present disclosure, reference may be made to the examples in the above embodiments, and details will not be repeated here.

Figure 31:
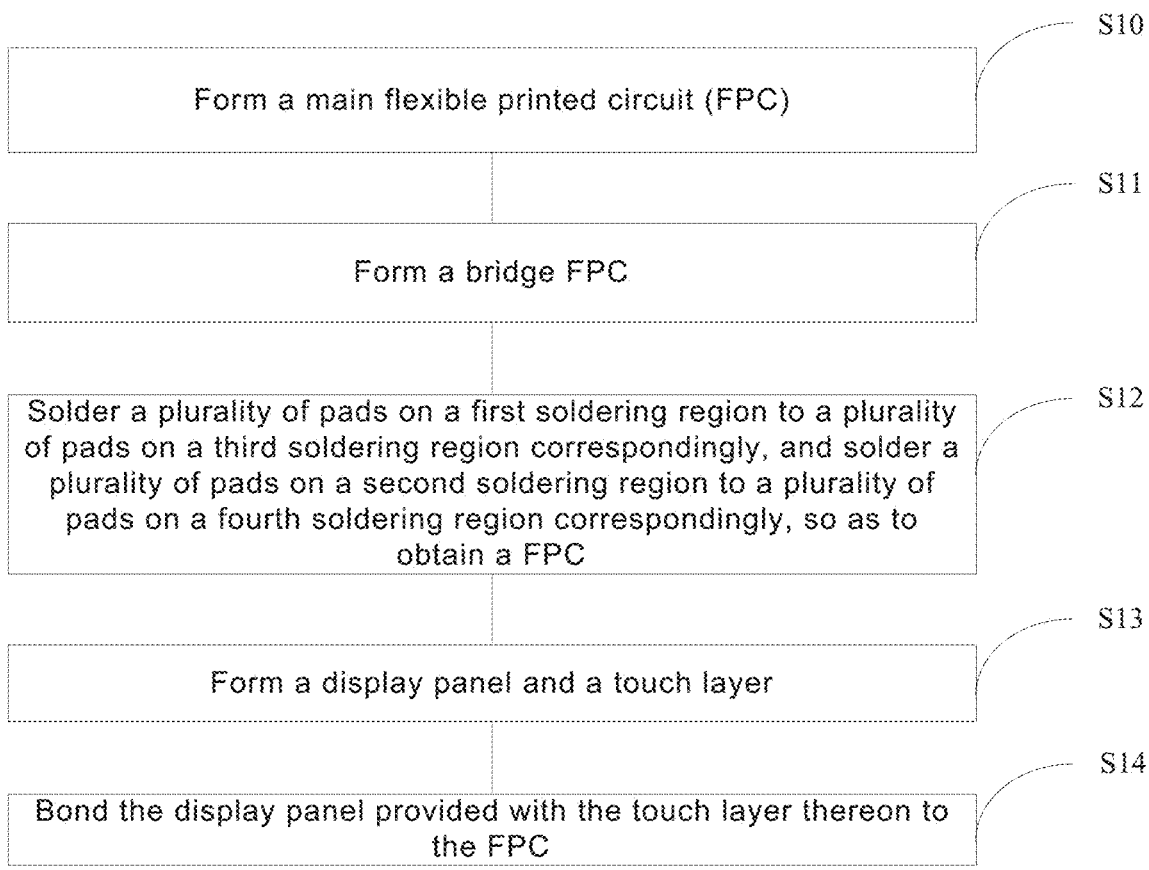
FIG. 31 is a flowchart of a method for manufacturing a display apparatus, in accordance with some embodiments.

Some embodiments of the present disclosure further provide a method for manufacturing a display apparatus 100, which is used for manufacturing the display apparatus 100 described in any of the above embodiments. As shown in FIG. 31, the method includes steps 10 to 14 (S10 to S14).

In S10, a main FPC 43 is formed.

The main FPC 43 includes a first substrate 410, a plurality of pads P disposed on a first soldering region 410A and a second soldering region 410B of the first substrate, and a touch chip 4100, a plurality of first touch connection lines 41A, a plurality of second touch connection lines 42A, a plurality of third touch connection lines 30A, a plurality of first bonding pins 4101 and a plurality of second bonding pins 4102 that are disposed on the first substrate. One end of each first touch connection line 41A is electrically connected to the touch chip 4100, and another end of each first touch connection line 41A is electrically connected to a single first bonding pin 4101. One end of each second touch connection line 42A is electrically connected to a single pad P on the second soldering region 410B, and another end of each second touch connection line 42A is electrically connected to a single second bonding pin 4102. One end of each third touch connection line 30A is electrically connected to a single pad P on the first soldering region 410A, and another end of each third touch connection line 30A is electrically connected to the touch chip 4100.

In S11, a bridge FPC 44 is formed.

The bridge FPC 44 includes a second substrate 420, a plurality of pads P disposed in a third soldering region 420A and a fourth soldering region 420B of the second substrate 420, and a plurality of touch transfer lines 420C. One end of each touch transfer line 420C is electrically connected to a single pad P on the third soldering region 420A, and another end of each touch transfer line 420C is electrically connected to a single pad P on the fourth soldering region 420B.

In S12, the plurality of pads P on the first soldering region 410A are correspondingly soldered to the plurality of pads P on the third soldering region 420A, and the plurality of pads P on the second soldering region 410B are correspondingly soldered to the plurality of pads P on the fourth soldering region 420B, so as to obtain a FPC 4.

In S13, a display panel 31 and a touch layer 32 are formed. The touch layer 32 is located on a light-exiting surface of the display panel 31. The display panel 31 includes a plurality of first bonding pads 36 and a plurality of second bonding pads 37. The touch layer 32 includes a plurality of first touch leads 321 and a plurality of second touch leads 322. Each first touch lead 321 is electrically connected to a single first bonding pad 36 of the display panel 31. Each second touch lead 322 is electrically connected to a single first bonding pad 36 of the display panel 31.

Herein, the touch layer 32 may be formed on the display panel 31 through a continuous process. That is, the touch layer 32 may be directly formed on the display panel 31 after the display panel 31 is formed. In this way, the touch display panel 3 has a small thickness, which is conducive to making the display apparatus light and thin.

In S14, the display panel 31 provided with the touch layer 32 thereon is bonded to the FPC 4, so that the plurality of first bonding pads 36 are correspondingly electrically connected to the plurality of first bonding pins 4101, and the plurality of second bonding pads 37 are correspondingly electrically connected to the plurality of second bonding pins 4102.

Since beneficial effects of the method for manufacturing the display apparatus 100 provided in some embodiments of the present disclosure are similar to the beneficial effects of the display apparatus 100 provided in the above embodiments, details will not be repeated here.

Figure 32:
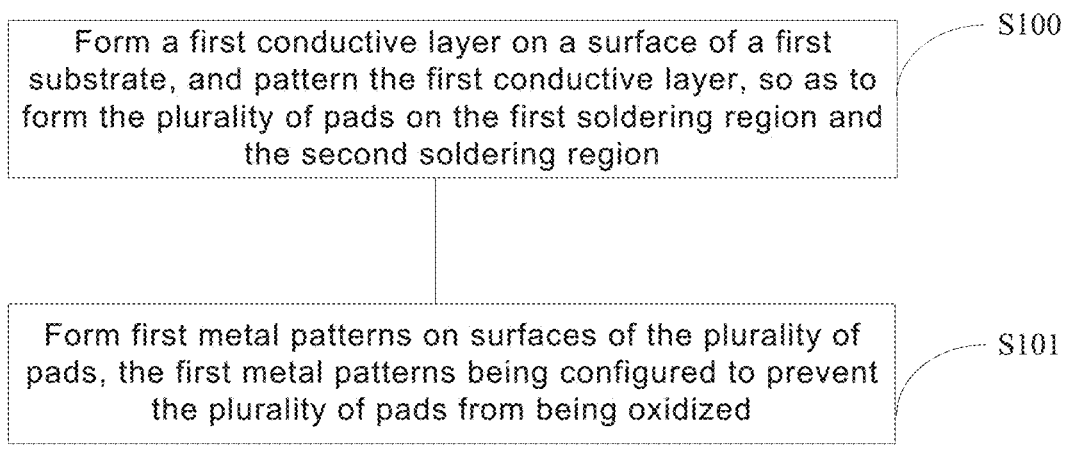
FIG. 32 is a flowchart of another method for manufacturing a display apparatus, in accordance with some embodiments.

In some embodiments, as shown in FIG. 32, S10 includes steps 100 and 101 (S100 to S101).

In S100, a first conductive layer is formed on a surface of the first substrate 410, and then the first conductive layer is patterned, so as to form the plurality of pads P on the first soldering region 410A and the second soldering region 410B.

For example, the first conductive layer is formed on the surface of the first substrate 410 by a coating process or a chemical deposition process. And then, the first conductive layer is exposed by using a mask, and developed and etched, so as to form the plurality of pads P on the first soldering region 410A and the second soldering region 410B. The first conductive layer may be made of copper foil.

Herein, a plurality of lines may also be formed by patterning the first conductive layer. The plurality of lines may include at least one of first touch connection lines 41A, second touch connection lines 42A, third touch connection lines 30A, first shielding connection lines 41B, second shielding connection lines 42B, third shielding connection lines 30B, ELVDD lines, an ELVSS line, a DVDD line and high-frequency signal lines 48.

It will be noted that, the first substrate 410 includes two surfaces. The step of forming the first conductive layer on the surface of the first substrate 410 may refer to forming the first conductive layer on only one surface of the first substrate 410, or may refer to forming the first conductive layers on two surfaces of the first substrate 410 that are opposite to each other. In a case where the main FPC 4 is a double-layer board, the first conductive layers are formed on both of the two surfaces of the first substrate 410. In a case where the main FPC 4 is a single-layer board, the first conductive layer is formed on only one surface of the first substrate 410.

In S101, first metal patterns are formed on surfaces of the plurality of pads P. The first metal patterns are configured to prevent the plurality of pads P from being oxidized.

Herein, the first metal patterns may be formed by a nickel plating method or an electroless nickel/immersion gold (ENIG) method. On this basis, the nickel plating method includes an electrolytic method and a chemical method, that is, an electroplating nickel method and a chemical nickel plating method. The electroplating nickel method refers to a process of depositing a uniform and dense nickel plating layer on the cathode (the part to be plated) by applying a direct current on an electrolyte that is composed of a nickel salt (the main salt), a conductive salt, a pH buffer and a wetting agent, where the anode is nickel and the cathode is the part to be plated. Bright nickel is obtained from an electrolyte added with a brightening agent, while dark nickel is obtained from an electrolyte that is not added with a brightening agent. Chemical plating is also called electroless plating or autocatalytic plating, and refers to a process where metal ions in an aqueous solution are reduced by a reducing agent and precipitated on a surface of a solid substrate under certain conditions.

The ENIG method refers to electroless gold plating, which does not require an external power source, and only relies on a plating solution to perform a chemical reduction reaction, so that gold ions are continuously reduced on a surface of the first substrate 410 to form a gold plating layer.

Figure 33:
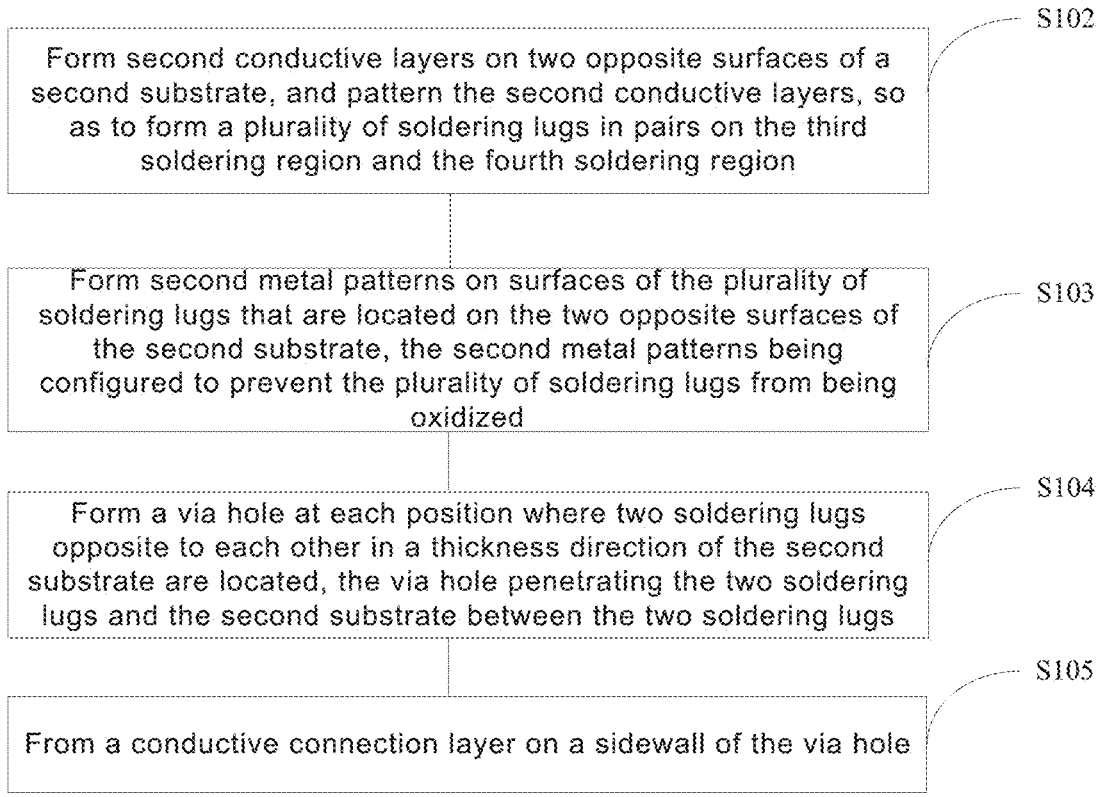
FIG. 33 is a flowchart of still another method for manufacturing a display apparatus, in accordance with some embodiments.

In some embodiments, as shown in FIG. 33, S11 includes steps 102 to 105 (S102 to S105).

In S102, second conductive layers are formed on two surfaces of the second substrate 420 that are opposite to each other, and the second conductive layers are patterned, so as to form a plurality of soldering lugs 422 in pairs on the third soldering region 420A and the fourth soldering region 420B.

For example, the second conductive layers are formed on the surface of the second substrate 420 by a coating process or by a chemical deposition process. And then, the second conductive layers are exposed by using a mask, and developed and etched to form the plurality of pads P on the third soldering region 420A and the fourth soldering region 420A. The second conductive layers may be made of copper foil.

Herein, a plurality of lines may also be formed by patterning the second conductive layers. The plurality of lines may include one of touch transfer lines 420C, shielding transfer lines 420D, or a combination thereof.

In S103, second metal patterns 15 are formed on surfaces of the plurality of soldering lugs 422 that are disposed on the two opposite surfaces of the second substrate 420. The second metal patterns 15 are configured to prevent the plurality of soldering lugs 422 from being oxidized.

The method for forming the second metal patterns 15 is the same as the method for forming the first metal patterns. Reference may be made to the method for forming the first metal patterns, and details will not be repeated here.

In S104, a via hole 421 is formed at each position where two soldering lugs 422 opposite to each other in a thickness direction of the second substrate 420 are located. The via hole 421 penetrates the two soldering lugs 422 and the second substrate 420 between the two soldering lugs 422.

Herein, the via hole 421 may be formed by a laser drilling method, a punch drilling method, etc.

In S105, a conductive connection layer 423 is formed on a sidewall of the via hole 421. Two ends of the conductive connection layer 423 are electrically connected to two soldering lugs 422. The conductive connection layer 423 includes a conductive layer and a metal layer that are stacked in sequence. The metal layer is configured to prevent the conductive layer from being oxidized.

Herein, an order of S102 to S105 is not limited. For example, the order may be as follows: via holes 421 are formed in the second substrate 420; then, a second conductive layers are formed on surfaces of the second substrate 420 that are opposite to each other, and a conductive connection layer 423 is formed on a sidewall of a via hole 421. In this case, both the third soldering region 420A and the fourth soldering region 420B are provided with a plurality of pads P, and then second metal patterns 15 are formed on surfaces of the pads P and a metal layer is formed on a sidewall of the via hole 421. The order of S102 to S105 in some embodiments of the present disclosure includes but is not limited to the embodiments described above. Any other different orders shall fall within the protection scope of some embodiments of the present disclosure, which shall not be elaborated here.

A method for forming the conductive connection layer 423 may be, for example, depositing a layer of copper foil on the wall of the via hole 421. A method for forming the metal layer may be, for example, performing a nickel plating or ENIG treatment on the conductive connection layer 423 disposed on the wall of the via hole 421.

Figure 34:
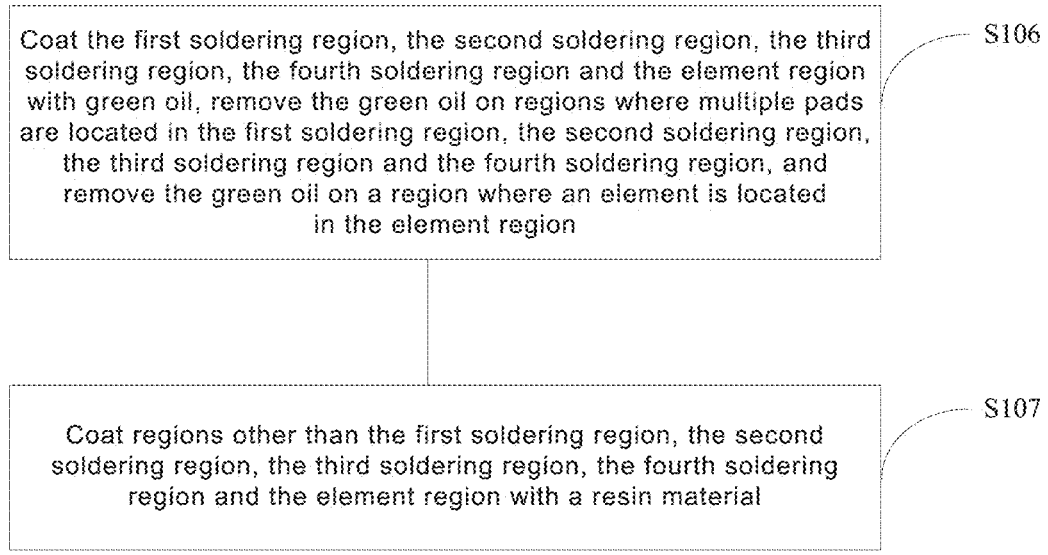
FIG. 34 is a flowchart of still another method for manufacturing a display apparatus, in accordance with some embodiments.

In some embodiments, as shown in FIG. 34, the method for manufacturing the display apparatus 100 further includes steps 106 and 107 (S106 and S107).

In S106, the first soldering region 410A, the second soldering region 410B, the third soldering region 420A, the fourth soldering region 420B, and an element region 45 are coated with green oil, the green oil on regions where multiple pads P are located in the first soldering region 410A, the second soldering region 410B, the third soldering region 420A and the fourth soldering region 420B is removed, so as to expose the multiple pads P, and the green oil on a region where an element is located in the element region 45 is removed, so as to expose the element.

In S107, regions other than the first soldering region 410A, the second soldering region 420A, the third soldering region 420A, the fourth soldering region 420B and the element region 45 are coated with a resin material.

The "resin material" may include one of polyimide (PI) and polyester resin, or a combination thereof.

An order of S106 and S107 is not limited. S106 may be performed first, and then S107 is performed. Alternatively, S107 may be performed first, and then S106 is performed.

Figure 35:
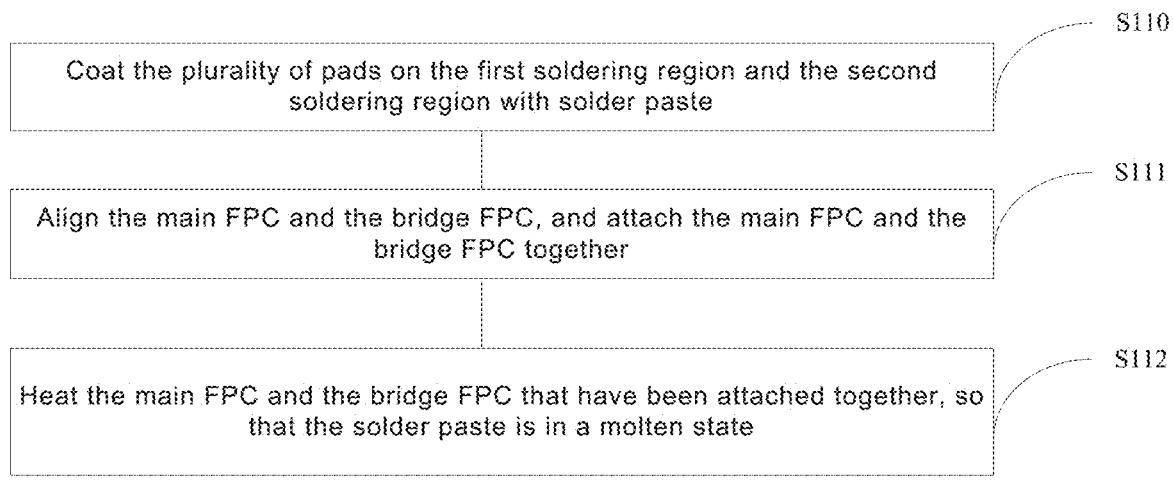
FIG. 35 is a flowchart of still another method for manufacturing a display apparatus, in accordance with some embodiments.

In some embodiments, as shown in FIG. 35, S12 includes steps 110 to 112 (S110 to~S112).

In S110, the plurality of pads P on the first soldering region 410A and the second soldering region 410B are coated with solder paste.

Figure 36:
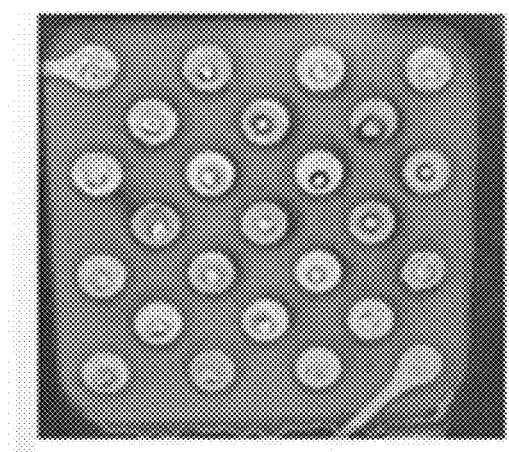
FIG. 36 is a structural diagram of a main FPC in a case where pads on a first soldering region and a second soldering region are coated with solder paste, in accordance with some embodiments.

Reference may be made to FIG. 36, which is a structural diagram in a case where the pads P on the first soldering region 410A are coated with solder paste.

In S111, the main FPC 43 and the bridge FPC 44 are aligned and attached together. The pads P on the first soldering region 410A are attached to the pads P on the third soldering region 420A correspondingly, and the pads P on the second soldering region 410B are attached to the pads P on the fourth soldering region 420B correspondingly.

In some embodiments, the word "aligned" may mean shape alignment. Shape alignment refers to aligning the pads P on the first soldering region 410A and the pads P on the third soldering region 420A in one-to-one correspondence, and aligning the pads P on the second soldering region 410B and the pads P on the fourth soldering region 420B in one-to-one correspondence.

In some other embodiments, the word "aligned" may mean mark alignment. Mark alignment refers to making marks at a corresponding position of the first soldering region 410A and at a corresponding position of the third soldering region 420A, and making marks at a corresponding position of the second soldering region 410b and at a corresponding position of the fourth soldering region 420B, such as an "X" shape, and then aligning the corresponding marks.

In S112, the main FPC 43 and the bridge FPC 44 that have been attached together are heated, so that the solder paste is in a molten state.

The main FPC 43 and the bridge FPC 44 that have been attached together may be placed in a boiler to be heated. In this case, a heating temperature may be set to a melting point of the solder paste (183° C.). In some embodiments, the heating temperature is greater than or equal to 200° C.

Figure 37:
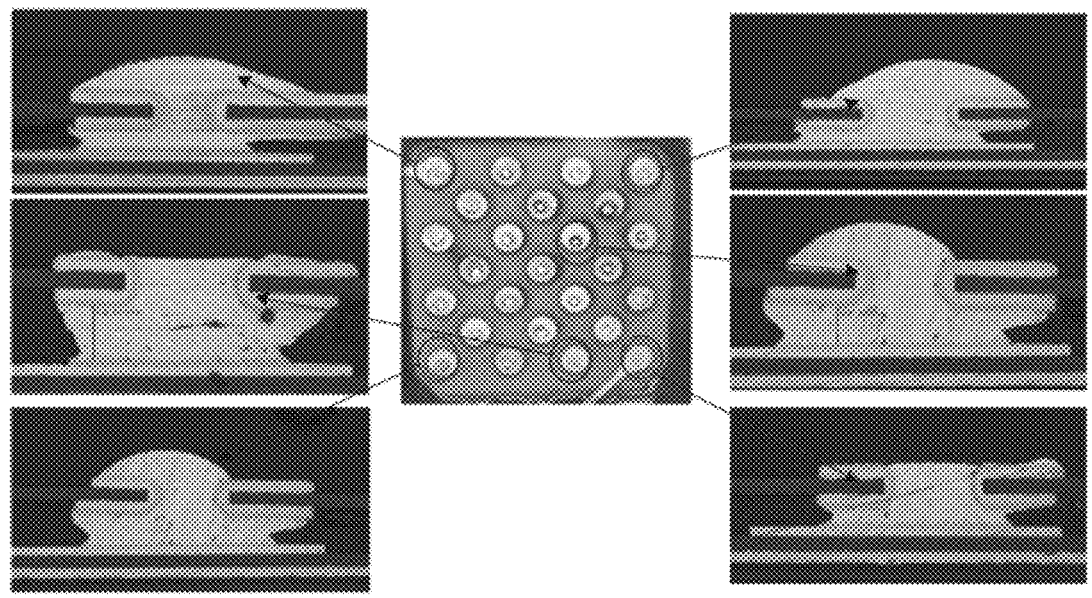
FIG. 37 is cross-sectional views of some pads, coated with solder paste, in a first soldering region and a second soldering region of a main FPC, in accordance with some embodiments.

On this basis, since the pads P on the third soldering region 420A and the fourth soldering region 420B are via pads, when the solder paste is in the molten state, as shown in FIG. 37, which is a schematic diagram of an X-section (that is, a sectional view) of FIG. 36, the solder paste may completely fill the via hole 421, so that the via pad is full of tin (that is, 100% filled with tin).

Reference may be made to FIG. 37, which shows enlarged views of six soldering points after the main FPC 43 and the bridge FPC 44 are soldered together.

As an embodiment, the six soldering points may be a first soldering point, a second soldering point, a third soldering point, a fourth soldering point, a fifth soldering point and a sixth soldering point in an order from left to right and from top to bottom.

As shown in FIG. 37, it may be seen that, solder overflows at the upper ends of the first soldering point, the second soldering point, the fourth soldering point and the fifth soldering point by a certain thickness, and the thicknesses of the solder overflow at the upper ends of the first soldering point, the second soldering point, the fourth soldering point, and the fifth soldering point are not the same. The thicknesses of solder overflow at the upper ends of the third soldering point and the sixth soldering point are very small, and are almost equal to a thickness of the conductive film (copper foil). For example, the thickness of solder overflow at the upper ends of the first soldering point, the second soldering point, the third soldering point, the fourth soldering point, the fifth soldering point, and the sixth soldering point are all less than or equal to 0.05 mm.

With continued reference to FIG. 37, it may be seen that, the shapes of solder overflow at the upper ends of the first soldering point, the second soldering point, the third soldering point, the fourth soldering point, the fifth soldering point, and the sixth soldering point are different. For example, the solder overflow at the upper ends of the first soldering point, the second soldering point, the fourth soldering point, and the fifth soldering point are arc-shaped, while the solder overflow at the upper ends of the third soldering point and the sixth soldering point is in the shape of a straight line.

With continued reference to FIG. 37, it may be seen that, after the bridge FPC 44 and the main FPC 43 are soldered together, distances between different positions of two pads P that are soldered together at a same soldering point (for example, the third soldering point, the fourth soldering point, or the fifth soldering point) are not the same. For example, a thickness of the solder on the left is greater than a thickness of the solder on the right.

In addition, it may be clearly seen from the first soldering point, the second soldering point, the third soldering point, the fourth soldering point, the fifth soldering point and the sixth soldering point that, a width of the solder at a position where two pads P are soldered together changes according to a rule of "wide-narrow-wide" from top to bottom. For example, the solder on the left side and the solder on the right side appear to have a shape similar to a ">" sign and a "<" sign, respectively.

Figure 38:
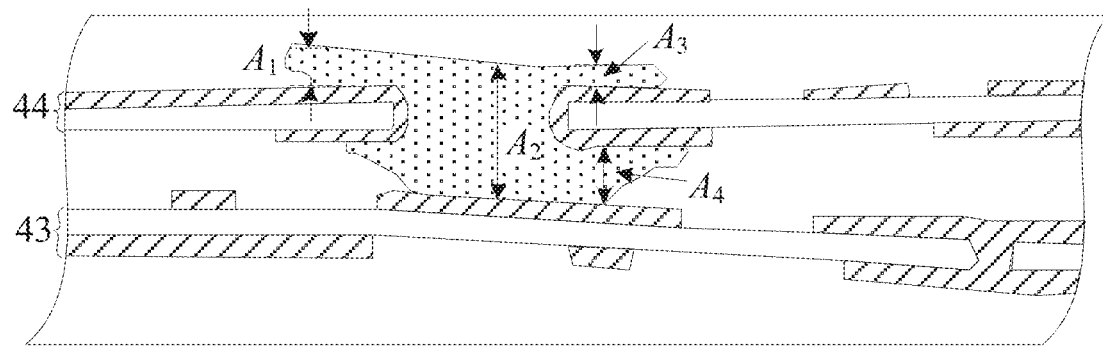
FIG. 38 is a structural diagram showing thicknesses of solder paste at various positions after a main FPC and a bridge FPC are soldered together, in accordance with some embodiments.

As an embodiment, FIG. 38 illustrates a case where there are other structures or lines around the soldering point. In addition, at the position of the soldering point shown in FIG. 38, a thickness A2 of the solder in the via pad is 123.4 µm; a distance A3 between the solder on the right side and a lower surface of the bridge FPC 44 (a surface thereof on a side away from the main FPC 43) is 19.9 µm; a distance A1 between the solder on a left side and the lower surface of the bridge FPC 44 (the surface thereof on the side away from the main FPC 43) is 34.3 µm; and a distance A4 between the solder on the right side and an upper surface of the bridge FPC 44 (a surface thereof on a side proximate to the main FPC 43) is 53.3 µm.

Figure 39:
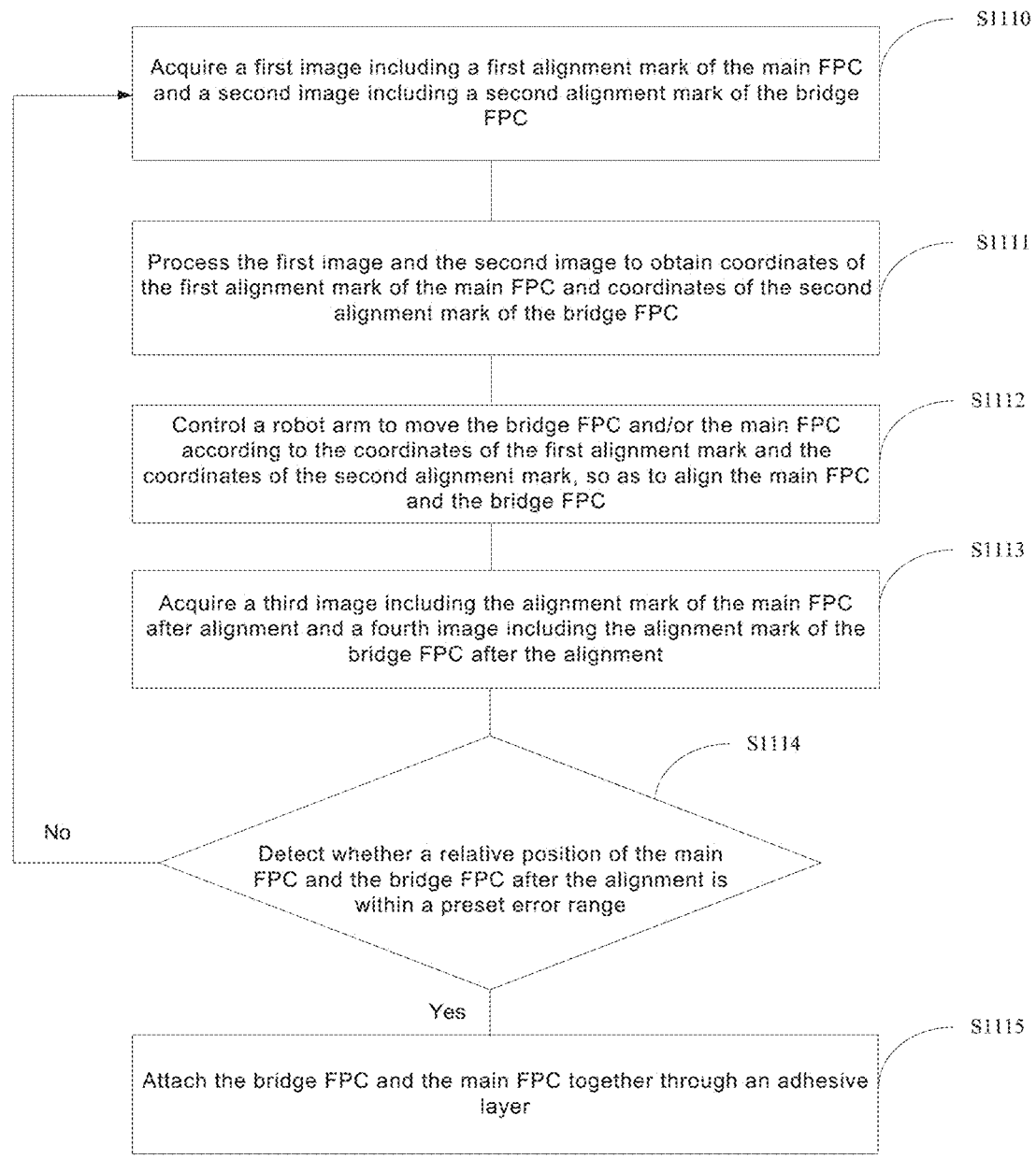
FIG. 39 is a flowchart of still another manufacturing method for a display apparatus, in accordance with some embodiments.

In some embodiments, as shown in FIG. 39, S111 includes steps 1110 to 1115 (S1110 to S1115).

In S1110, a first image including a first alignment mark of the main FPC 43 and a second image including a second alignment mark of the bridge FPC 44 are acquired.

In S1111, the first image and the second image are processed to obtain coordinates of the first alignment mark the main FPC 43 and coordinates of the second alignment mark of the bridge FPC 44.

Herein, coordinates of the first alignment mark of the main FPC 43 and coordinates of the second alignment mark of the bridge FPC 44 are three-dimensional coordinates. That is, the coordinates are expressed by (X, Y, Z).

In S1112, a robot arm is controlled to move the bridge FPC 44 and/or the main FPC 43 according to the coordinates of the first alignment mark and the coordinates of the second alignment mark, so as to align the main FPC 43 and the bridge FPC 44.

Controlling the robot arm to move the bridge FPC 44 and/or the main FPC 43 may refer to controlling the robot arm to move the bridge FPC 44 and the main FPC 43, or may refer to controlling the robot arm to only move the main FPC 43, or may refer to controlling the robot arm to only move the bridge FPC 44.

In S1113, a third image including the alignment mark of the main FPC 43 after alignment and a fourth image including the alignment mark of the bridge FPC 44 after the alignment are acquired.

In S1114, it is detected whether a relative position of the main FPC 43 and the bridging FPC 44 after the alignment is within a preset error range.

Herein, if the relative position of the main FPC 43 and the bridge FPC 44 is within the preset error range, S1115 is executed. If the relative position of the main FPC 43 and the bridge FPC 44 is not within the preset error range, S1110 to S1114 will be executed repeatedly, until finally it is detected that the relative position of the main FPC 43 and the bridge FPC 44 after the alignment is within the preset error range (that is, until the main FPC 43 and the bridge FPC 44 are completely aligned).

In S1115, the bridge FPC 44 and the main FPC 43 are attached together through an adhesive layer.

Herein, the adhesive layer may be made of a solid adhesive or a liquid adhesive. The solid adhesive may be, for example, at least one of a pressure sensitive adhesive (PSA), an epoxy adhesive and an acrylic adhesive. In a case where the adhesive layer is a liquid adhesive, the bridge FPC 44 and the main FPC 43 may be attached together by a dispensing process.

It will be noted that, in order to prevent the main FPC 43 and the bridge FPC 44 from moving when they are heated in the boiler after being aligned and attached together, the main FPC 43 and the bridge FPC 44 are bonded together through the adhesive layer before the alignment, so as to avoid displacement of the main FPC 43 and the bridge FPC 44 after they are aligned.

In S1110 to S1113, a method for acquiring and processing the first image and the second image, a method for acquiring the third image and the fourth image, and a method for detecting whether the relative position of the main FPC 43 and the bridge FPC 44 after the alignment is within the preset error range are not limited. For example, the first image, the second image, the third image and the fourth image may be acquired by a camera; the first image and the second image may be processed by a processor (for example, the first alignment-mark coordinates and the second alignment-mark coordinates may be obtained through a computer simulation); the third image and the fourth image may be processed by a processor, and the detection may be performed by using the processor to determine whether the relative position of the main FPC 43 and the bridge FPC 44 is within the preset error range.

In some embodiments of the present disclosure, since the main FPC 43 and the bridging FPC 44 are soldered together during the fabrication of the FPC 4, and the process of fabricating the FPC 4 is fully automated, the production efficiency may be greatly improved, and the formed FPC 4 may be lighter and thinner with a more simplified structure.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display apparatus, comprising:
a display panel;
a touch layer disposed on a light-exiting surface of the display panel, the touch layer including a plurality of first touch leads and a plurality of second touch leads; and
a flexible printed circuit (FPC) bonded to the display panel, the FPC including a main FPC and a bridge FPC, wherein
the main FPC includes:
  a first substrate having a first soldering region, a second soldering region and a bonding region, the bonding region being a region of the first substrate that is bonded to the display panel;
  a plurality of pads disposed on the first soldering region and the second soldering region;
  a touch chip disposed on the first substrate, a minimum distance between the touch chip and the first soldering region being less than a minimum distance between the touch chip and the second soldering region;
  a plurality of first touch connection lines disposed on the first substrate, one end of each first touch connection line being electrically connected to the touch chip, and another end of each first touch connection line being electrically connected to a corresponding one of the plurality of first touch leads in the touch layer;
  a plurality of second touch connection lines disposed on the first substrate, one end of each second touch connection line being electrically connected to a corresponding pad on the second soldering region, and another end of each second touch connection line being electrically connected to a corresponding one of the plurality of second touch leads in the touch layer; and
  a plurality of third touch connection lines disposed on the first substrate, one end of each third touch connection line being electrically connected to a corresponding pad on the first soldering region, and another end of each third touch connection line being electrically connected to the touch chip; and
the bridge FPC includes:
  a second substrate having a third soldering region and a fourth soldering region;
  another plurality of pads disposed on the third soldering region and the fourth soldering region, a pad on the third soldering region being soldered to another corresponding pad on the first soldering region, and a pad on the fourth soldering region being soldered to a corresponding pad on the second soldering region; and
  a plurality of touch transfer lines disposed on the second substrate, one end of each touch transfer line being electrically connected to a corresponding pad on the third soldering region, and another end of each touch transfer line being electrically connected to a corresponding pad on the fourth soldering region, wherein
a maximum radial dimension of any pad is less than or equal to 1.0 mm.

2. The display apparatus according to claim 1, wherein the bridge FPC further includes:
at least one shielding transfer line disposed on the second substrate, one end of each shielding transfer line being electrically connected to a corresponding pad on the third soldering region, and another end of each shielding transfer line being electrically connected to a corresponding pad on the fourth soldering region.

3. The display apparatus according to claim 2, wherein the bridge FPC includes a plurality of shielding transfer lines; the plurality of shielding transfer lines at least includes two edge shielding transfer lines that are located on outermost sides; of the two edge shielding transfer lines, two ends of one edge shielding transfer line and two ends of another edge shielding transfer line are connected in sequence to form a loop; and the plurality of touch transfer lines are all located within the loop.

4. The display apparatus according to claim 3, wherein the third soldering region and the fourth soldering region are both provided with M rows of pads thereon, M being greater than or equal to two (M≥2);
of the two edge shielding transfer lines, the two ends of the one edge shielding transfer line are located on a side of a first row of pads away from a last row of pads on the third soldering region and a side of a first row of pads away from a last row of pads on the fourth soldering region, and are electrically connected to two pads that are farthest away from each other and located in the first row of pads on the third soldering region and in the first row of pads on the fourth soldering region, and the two ends of the another edge shielding transfer line are located on a side of the last row of pads away from the first row of pads on the third soldering region and a side of the last row of pads away from the first row of pads on the fourth soldering region, and are electrically connected to two pads that are farthest away from each other and located in the last row of pads on the third soldering region and in the last row of pads on the fourth soldering region;
a pad, electrically connected to the one edge shielding transfer line, in the first row of pads on the third soldering region is electrically connected to a pad, electrically connected to the another edge shielding transfer line, in the last row of pads on the third soldering region; and
a pad, electrically connected to the one edge shielding transfer line, in the first row of pads on the fourth soldering region is electrically connected to a pad, electrically connected to the another edge shielding transfer line, in the last row of pads on the fourth soldering region.

5. The display apparatus according to claim 2, wherein the third soldering region and the fourth soldering region are both provided with M rows of pads thereon, M being greater than or equal to two (M≥2); and of a plurality of transfer lines on the second substrate, at least 2M pads are distributed between two transfer lines that are located on outermost sides; the plurality of transfer lines includes the plurality of touch transfer lines and the at least one shielding transfer line.

6. The display apparatus according to claim 2, wherein the first soldering region and the second soldering region are arranged side by side in a first direction, the first direction being substantially parallel to an extending direction of a side edge of the main FPC proximate to the display panel.

7. The display apparatus according to claim 6, wherein pads on the third soldering region and pads on the fourth soldering region are all arranged in a plurality of rows; at least one of the plurality of rows of pads on the third soldering region includes a plurality of pads arranged in the first direction, and at least one of the plurality of rows of pads on the fourth soldering region includes another plurality of pads arranged in the first direction; at least one of a plurality of transfer lines on the second substrate passes through a region other than both a region between a first row of pads and a last row of pads on the third soldering region and a region between a first row of pads and a last row of pads on the forth soldering region to be electrically connected to corresponding pads; the plurality of transfer lines include the plurality of touch transfer lines and the at least one shielding transfer line; or pads on the third soldering region and pads on the fourth soldering region are all arranged in a plurality of rows; at least one of the plurality of rows of pads on the third soldering region includes a plurality of pads arranged in the first direction, and at least one of the plurality of rows of pads on the fourth soldering region includes another plurality of pads arranged in the first direction; at least one of a plurality of transfer lines on the second substrate passes through a region other than both a region between a first row of pads and a last row of pads on the third soldering region and a region between a first row of pads and a last row of pads on the forth soldering region to be electrically connected to corresponding pads; the plurality of transfer lines include the plurality of touch transfer lines and the at least one shielding transfer line; two adjacent rows of pads are arranged in a staggered manner in a second direction, the second direction being substantially perpendicular to the first direction.

8. The display apparatus according to claim 6, wherein the second substrate further has a transition line region and connection sector regions that are located at two opposite ends of the transition line region, the transition line region and the connection sector regions are located between the third soldering region and the fourth soldering region; each of a plurality of transfer lines including the plurality of touch transfer lines and the at least one shielding transfer line includes a transition section and connection sections that are located at two opposite ends of the transition section; the transition section extends in the first direction, and is disposed in the transition line region; and the connection sections are disposed in the connection sector regions, wherein a minimum width of a connection sector region in the second direction is greater than or equal to a width of the transition line region in the second direction, the second direction being substantially perpendicular to the first direction; or the second substrate further has a transition line region and connection sector regions that are located at two opposite ends of the transition line region, the transition line region and the connection sector regions are located between the third soldering region and the fourth soldering region; each of a plurality of transfer lines including the plurality of touch transfer lines and the at least one shielding transfer line includes a transition section and connection sections that are located at two opposite ends of the transition section; the transition section extends in the first direction, and is disposed in the transition line region; and the connection sections are disposed in the connection sector regions, wherein a minimum width of a connection sector region in the second direction is greater than or equal to a width of the transition line region in the second direction, the second direction being substantially perpendicular to the first direction; the width of the transition line region in the second direction is less than a maximum width of the third soldering region in the second direction; and/or, the width of the transition line region in the second direction is less than a maximum width of the fourth soldering region in the second direction; a maximum width of a portion of the connection sector region proximate to the third soldering region in the second direction is greater than the maximum width of the third soldering region in the second direction; and/or, a maximum width of a portion of the connection sector region proximate to the fourth soldering region in the second direction is greater than the maximum width of the fourth soldering region in the second direction.

9. The display apparatus according to claim 1, wherein the third soldering region and the fourth soldering region are disposed at two ends of the second substrate that are opposite to each other; and a shape of an orthographic projection of the second substrate on the main FPC is not centrally symmetric shape; and/or a number of the first touch leads included in the touch layer is equal to a number of the first touch connection lines included in the main FPC; a number of the second touch leads included in the touch layer is equal to each of a number of the second touch connection lines included in the main FPC and a number of the third touch connection lines included in the main FPC.

10. The display apparatus according to claim 1, wherein the pads on the second substrate are via pads: the second substrate has a plurality of via holes, and each via hole corresponds to a single via pad;

the via pad includes:
two soldering lugs disposed on a surface of the second substrate proximate to the main FPC and a surface of the second substrate away from the main FPC, a via hole corresponding to the via pad penetrating the second substrate between the two soldering lugs of the via pad and the two soldering lugs; and
a conductive connection layer covering a sidewall of the via hole corresponding to the via pad, two ends of the conductive connection layer being electrically connected to the two soldering lugs.

11. The display apparatus according to claim 1, wherein the main FPC further includes:
first metal patterns covering the pads on the first substrate, the first metal patterns being configured to prevent the pads on the first substrate from being oxidized; and/or,
the bridge FPC further includes:
second metal patterns covering the pads on the second substrate, the second metal patterns being configured to prevent the pads on the second substrate from being oxidized; and/or
the main FPC further includes:
a first green oil layer covering at least first regions of the first substrate, the first regions being regions in the first soldering region and the second soldering region other than regions where the pads are located; and
a first resin layer covering a region of the first substrate other than the first soldering region and the second soldering region; and
the bridge FPC further includes:
a second green oil layer covering at least second regions of the second substrate, the second regions being regions in the third soldering region and the fourth soldering region other than regions where the pads are located; and
a second resin layer covering a region of the second substrate other than the third soldering region and the fourth soldering region.

12. The display apparatus according to claim 1, wherein the first substrate has an element region;
the main FPC further includes:
at least one element that is disposed on a side of the first substrate proximate to the bridge FPC and is located in the element region of the first substrate, the at least one element including the touch chip; and
a third green oil layer covering a region in the element region other than a region where the at least one element is located.

13. The display apparatus according to claim 12, wherein the main FPC further includes: a support piece disposed on a side of the first substrate away from the bridge FPC, the element region being located within an orthographic projection of the support piece on the first substrate; or
the main FPC further includes a support piece disposed on a side of the first substrate away from the bridge FPC, the element region being located within an orthographic projection of the support piece on the first substrate; a border of the orthographic projection of the support piece on the first substrate and a border of the element region have a distance therebetween, and the distance is greater than or equal to 0.5 mm.

14. The display apparatus according to claim 1, wherein the main FPC further includes:
a plurality of first bonding pins disposed in the bonding region, at least one first bonding pin being configured to electrically connect a first touch connection line to a corresponding first touch lead in the touch layer of the display apparatus; and
a plurality of second bonding pins disposed in the bonding region, at least one second bonding pin being configured to electrically connect a second touch connection line to a corresponding second touch lead in the touch layer of the display apparatus.

15. The display apparatus according to claim 1, wherein a maximum dimension $L_1$ of the main FPC in a first direction is greater than or equal to 55.25 mm, and less than or equal to 55.55 mm (55.25 mm≤$L_1$≤55.55 mm); the first direction is approximately parallel to an extending direction of a side edge of the main FPC proximate to the display panel;
the bonding region is in a shape of a strip, and extends in the first direction; the plurality of first bonding pins and the plurality of second bonding pins are arranged side by side in the first direction; in the first direction, a distance $L_2$ between a first bonding pin and a second bonding pin of the main FPC that are farthest away from each other is greater than or equal to 53.55 mm, and less than or equal to 53.85 mm (53.55 mm≤$L_2$≤53.85 mm);
a maximum dimension $L_3$ of the bonding region in a second direction is greater than or equal to 1.2 mm, and less than or equal to 1.6 mm (1.2 mm≤$L_3$≤1.6 mm); the second direction is approximately perpendicular to the first direction.

16. The display apparatus according to claim 1, wherein the main FPC further includes a plurality of data signal control lines disposed on the first substrate; the display panel has a display region and a surrounding region located on at least one side of the display region; and the display panel includes: a plurality of data lines; and a driving chip disposed in the surrounding region, the driving chip being electrically connected to the plurality of data signal control lines and the plurality of data lines, and the driving chip being configured to process signals on the plurality of data signal control lines and transmit the processed signals to the plurality of data lines; or the main FPC further includes a plurality of data signal control lines disposed on the first substrate; the display panel has a display region and a surrounding region located on at least one side of the display region; and the display panel includes: a plurality of data lines; and a driving chip disposed in the surrounding region, the driving chip being electrically connected to the plurality of data signal control lines and the plurality of data lines, and the driving chip being configured to process signals on the plurality of data signal control lines and transmit the processed signals to the plurality of data lines; a number of the data signal control lines included in the main FPC is less than a number of the data lines included in the display panel; and a width of a data signal control line is greater than a width of a data line.

17. The display apparatus according to claim 1, wherein the main FPC further includes first bonding pins and second bonding pins; and the display panel further includes: a plurality of first bonding pads, a first bonding pad being electrically connected to a corresponding first bonding pin and a corresponding first touch lead; and a plurality of second bonding pads, a second bonding pad being electrically connected to a corresponding second bonding pin and a corresponding second touch lead; or
the main FPC further includes first bonding pins and second bonding pins; and the display panel further includes: a plurality of first bonding pads, a first bonding pad being electrically connected to a corresponding first bonding pin and a corresponding first touch lead, and a plurality of second bonding pads, a second bonding pad being electrically connected to a corresponding second bonding pin and a corresponding second touch lead; a thickness of the first bonding pad and a thickness of the second bonding pad are both less than a distance between a surface of the touch layer proximate to the display panel and a surface of the display panel away from the touch layer.

18. A method for manufacturing a display apparatus, comprising:
forming a main flexible printed circuit (FPC), the main FPC including a first substrate, a plurality of pads disposed on a first soldering region and a second soldering region of the first substrate, and a touch chip, a plurality of first touch connection lines, a plurality of second touch connection lines, a plurality of third touch connection lines, a plurality of first bonding pins and a plurality of second bonding pins that are disposed on the first substrate, wherein one end of each first touch connection line is electrically connected to the touch chip, another end of each first touch connection line is electrically connected to a corresponding first bonding pin; one end of each second touch connection line is electrically connected to a corresponding pad on the second soldering region, another end of each second touch connection line is electrically connected to a corresponding second bonding pin; one end of each third touch connection line is electrically connected to a corresponding pad on the first soldering region, another end of each third touch connection line is electrically connected to the touch chip;
forming a bridge FPC, the bridge FPC including a second substrate, another plurality of pads disposed on a third soldering region and a fourth soldering region of the second substrate, and a plurality of touch transfer lines, wherein one end of each touch transfer line is electrically connected to a corresponding pad on the third soldering region, and another end of each touch transfer line is electrically connected to a corresponding pad on the fourth soldering region;

soldering pads on the first soldering region to pads on the third soldering region correspondingly, and soldering pads on the second soldering region to pads on the fourth soldering region correspondingly, so as to obtain a FPC;

forming a display panel and a touch layer, wherein the touch layer is located on a light-exiting surface of the display panel, the display panel includes a plurality of first bonding pads and a plurality of second bonding pads, the touch layer includes a plurality of first touch leads and a plurality of second touch leads, each first touch lead is electrically connected to a corresponding first bonding pad of the display panel, and each second touch lead is electrically connected to a corresponding second bonding pad of the display panel; and bonding the display panel provided with the touch layer thereon to the FPC, so that the plurality of first bonding pads are correspondingly electrically connected to the plurality of first bonding pins, and the plurality of second bonding pads are correspondingly electrically connected to the plurality of second bonding pins.

19. The method according to claim 18, wherein forming the main FPC includes:

forming a first conductive layer on a surface of the first substrate, and patterning the first conductive layer, so as to form the plurality of pads on the first soldering region and the second soldering region; and forming first metal patterns on surfaces of the plurality of pads, the first metal patterns being configured to prevent the plurality of pads from being oxidized; and forming the bridge FPC includes:

forming second conductive layers on two opposite surfaces of the second substrate, and patterning the second conductive layers, so as to form a plurality of soldering lugs in pairs on the third soldering region and the fourth soldering region;

forming second metal patterns on surfaces of the plurality of soldering lugs that are located on the two opposite surfaces of the second substrate, the second metal patterns being configured to prevent the plurality of soldering lugs from being oxidized;

forming a via hole at each position where two soldering lugs opposite to each other in a thickness direction of the second substrate are located, the via hole penetrating the two soldering lugs and the second substrate between the two soldering lugs; and forming a conductive connection layer on a sidewall of the via hole, wherein two ends of the conductive connection layer are electrically connected to the two soldering lugs, the conductive connection layer includes a conductive layer and a metal layer that are stacked in sequence, and the metal layer is configured to prevent the conductive layer from being oxidized.

20. The method according to claim 18, further comprising:

coating the first soldering region, the second soldering region, and an element region of the first substrate, and the third soldering region and the fourth soldering region of the second substrate with green oil;

removing the green oil on regions, where multiple pads are located, in the first soldering region, the second soldering region, the third soldering region and the fourth soldering region, so as to expose the multiple pads, removing the green oil on a region, where an element is located, in the element region, so as to expose each element; and coating regions of the first substrate and the second substrate other than the first soldering region, the second soldering region, the third soldering region, the fourth soldering region and the element region with a resin material; and/or soldering the pads on the first soldering region to the pads on the third soldering region correspondingly, and soldering the pads on the second soldering region to the pads on the fourth soldering region correspondingly includes:

coating the plurality of pads on the first soldering region and the second soldering region with solder paste;

aligning the main FPC and the bridge FPC, and attaching the main FPC and the bridge FPC together, wherein the pads on the first soldering region are correspondingly attached to the pads on the third soldering region, and the pads on the second soldering region are correspondingly attached to the pads on the fourth soldering region; and heating the main FPC and the bridge FPC that have been attached together, so that the solder paste is in a molten state; and/or soldering the pads on the first soldering region to the pads on the third soldering region correspondingly, and soldering the pads on the second soldering region to the pads on the fourth soldering region correspondingly includes:

coating the plurality of pads on the first soldering region and the second soldering region with solder paste;

aligning the main FPC and the bridge FPC, and attaching the main FPC and the bridge FPC together, wherein the pads on the first soldering region are correspondingly attached to the pads on the third soldering region, and the pads on the second soldering region are correspondingly attached to the pads on the fourth soldering region; and heating the main FPC and the bridge FPC that have been attached together, so that the solder paste is in a molten state, wherein aligning the main FPC and the bridge FPC and attaching the main FPC and the bridge FPC together includes:

acquiring a first image including a first alignment mark of the main FPC and a second image including a second alignment mark of the bridge FPC;

processing the first image and the second image to obtain coordinates of the first alignment mark of the main FPC and coordinates of the second alignment mark of the bridge FPC;

controlling a robot arm to move the bridge FPC and/or the main FPC according to the coordinates of the first alignment mark and the coordinates of the second alignment mark, so as to align the main FPC and the bridge FPC;

acquiring a third image including the alignment mark of the main FPC after alignment and a fourth image including the alignment mark of the bridge FPC after the alignment;

detecting whether a relative position of the main FPC and the bridge FPC after the alignment is within a preset error range;

in response to detecting that the relative position of the main FPC and the bridge FPC is within the preset error range, attaching the main FPC and the bridge FPC together through an adhesive layer; in response to detecting that the relative position of the main FPC and the bridge FPC is not within the preset error range, continuing to adjust the relative position of the main FPC and the bridge FPC, until the relative position of the two is within the preset error range.

\* \* \* \* \*

UNITED STATES PATENT AND TRADEMARK OFFICE
CERTIFICATE OF CORRECTION

PATENT NO. : 11,991,828 B2  
APPLICATION NO. : 17/626902  
DATED : May 21, 2024  
INVENTOR(S) : Ren Xiong et al.

Page 1 of 1

It is certified that error appears in the above-identified patent and that said Letters Patent is hereby corrected as shown below:

In the Specification

Column 11, Line 8 (FIG. 17):
The ":" at the end of the sentence should be a ";".

In the Claims

Column 49 (Claim 15), Line 36:
"The display apparatus according to claim 1" should be "The display apparatus according to claim 14".

Signed and Sealed this
Twenty-seventh Day of August, 2024

Katherine Kelly Vidal
*Director of the United States Patent and Trademark Office*